(12) United States Patent
Miyaji et al.

(10) Patent No.: US 7,202,016 B2
(45) Date of Patent: Apr. 10, 2007

(54) RADIATION-SENSITIVE RESIN COMPOSITION

(75) Inventors: Masaaki Miyaji, Mie (JP); Tomoki Nagai, Mie (JP); Yuji Yada, Mie (JP); Jun Numata, Mie (JP); Yukio Nishimura, Mie (JP); Masafumi Yamamoto, Mie (JP); Hiroyuki Ishii, Mie (JP); Toru Kajita, Mie (JP); Tsutomu Shimokawa, Mie (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 11/116,269

(22) Filed: Apr. 28, 2005

(65) Prior Publication Data

US 2005/0214680 A1 Sep. 29, 2005

Related U.S. Application Data

(63) Continuation of application No. 09/953,941, filed on Sep. 18, 2001, now Pat. No. 6,933,094.

(30) Foreign Application Priority Data

Sep. 18, 2000 (JP) ............................. 2000-282689
Dec. 28, 2000 (JP) ............................. 2000-401302

(51) Int. Cl.
*G03F 7/004* (2006.01)
(52) U.S. Cl. .................... 430/270.1; 430/905; 430/921
(58) Field of Classification Search .................... None
See application file for complete search history.

(56) References Cited

U.S. PATENT DOCUMENTS

| | | | |
|---|---|---|---|
| 5,068,257 A * | 11/1991 | Noguchi | 522/31 |
| 5,215,857 A | 6/1993 | Hosaka et al. | |
| 5,238,774 A | 8/1993 | Hosaka et al. | |
| 5,405,720 A | 4/1995 | Hosaka et al. | |
| 5,494,784 A | 2/1996 | Hosaka et al. | |
| 5,863,701 A | 1/1999 | Mertesdorf | |
| 5,925,492 A | 7/1999 | Hosaka et al. | |
| 6,013,416 A | 1/2000 | Nozaki et al. | |
| 6,020,104 A | 2/2000 | Hosaka et al. | |
| RE37,179 E | 5/2001 | Yamachika et al. | |
| 6,228,554 B1 | 5/2001 | Hosaka et al. | |
| 6,270,939 B1 | 8/2001 | Hosaka et al. | |
| 6,280,900 B1 | 8/2001 | Chiba et al. | |
| 6,337,171 B1 | 1/2002 | Kobayashi et al. | |
| 6,576,392 B1 * | 6/2003 | Sato et al. | 430/270.1 |
| 6,933,094 B2 | 8/2005 | Miyaji et al. | |

FOREIGN PATENT DOCUMENTS

| | | | |
|---|---|---|---|
| EP | 209753 | * | 1/1987 |
| EP | 0 440 374 A2 | | 8/1991 |
| EP | 0 574 939 A1 | | 12/1993 |
| EP | 0 788 031 A1 | | 8/1997 |
| EP | 1 033 624 A1 | | 9/2000 |
| EP | 1 091 248 A1 | | 4/2001 |
| JP | 2-161436 | | 6/1990 |
| JP | 4-211258 | | 8/1992 |
| JP | 5-249682 | | 9/1993 |
| JP | 7-140666 | | 6/1995 |

OTHER PUBLICATIONS

Yasunori Uetani et al., SPIE vol. 3678, 0277-786X/99, "Positive ArF resist with 2EAdMA/GbLMA resin system," pp. 510-517.

* cited by examiner

*Primary Examiner*—Rosemary Ashton
(74) *Attorney, Agent, or Firm*—Merchant & Gould, P.C.; Christopher W. Raimund

(57) ABSTRACT

A chemically amplified radiation-sensitive resin composition comprising a specific copolymer and a photoacid generator, wherein the copolymer contains the following recurring unit (1) and/or the recurring unit (2), and the recurring unit (3-1),

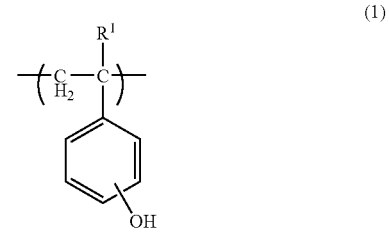

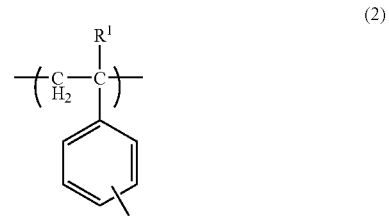

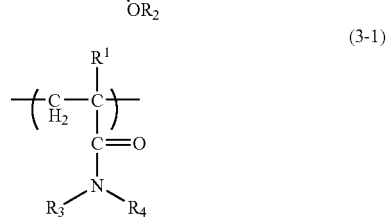

wherein $R^1$ is a hydrogen or methyl, $R^2$ is a $C_{4-10}$ tertiary alkyl, $R^3$ and $R^4$ are a hydrogen, $C_{1-12}$ alkyl, $C_{6-15}$ aromatic, $C_{1-12}$ alkoxyl, or $R^3$ and $R^4$ may form, in combination and together with the nitrogen atom with which the $R^3$ and $R^4$ groups bond, a $C_{3-15}$ cyclic structure, provided that $R^3$ and $R^4$ are not a hydrogen atom at the same time. The composition effectively responds to various radiations, exhibits excellent resolution and pattern configuration and minimal iso-dense bias, and can form fine patterns at a high precision and in a stable manner.

17 Claims, No Drawings

RADIATION-SENSITIVE RESIN COMPOSITION

This application is a Continuation of application Ser. No. 09/953,941, filed Sep. 18, 2001 now U.S. Pat. No. 6,933,094, now allowed. The entirety of this application is incorporated herein by reference.

BACKGROUND OF THE INVENTION

1. Field of the Invention

The present invention relates to a radiation-sensitive resin composition and, more particularly, to a radiation-sensitive resin composition suitable as a chemically amplified positive-tone resist and a chemically amplified negative-tone resist for ultra-microprocessing using various types of radiation such as ultraviolet radiation, deep ultraviolet radiation, X-rays, and charged particle rays.

2. Description of the Background Art

In the field of microfabrication represented by fabrication of integrated circuit devices, the design rules have become more and more minute in order to achieve higher integration. In recent years, development of a lithographic process enabling high accuracy microfabrication with a line width of 0.3 μm or less in a stable manner has been strongly demanded.

However, it is difficult to form such a fine pattern with high accuracy using a conventional method which utilizes visible rays (wavelength: 700–400 nm) or near ultraviolet rays (wavelength: 400–300 nm). To deal with this problem, a lithographic process using radiation with a shorter wavelength (wavelength: 300 nm or less) which can achieve a wider depth of focus and is effective for ensuring design rules with minimum dimensions has been proposed.

As a lithographic process using radiation with a short wavelength, processes using deep ultraviolet rays such as a KrF excimer laser (wavelength: 248 nm) or an ArF excimer laser (wavelength: 193 nm), X-rays such as synchrotron radiation, and charged particle rays such as ultra-deep ultraviolet rays or electron beams have been proposed. International Business Machines Corporation (IBM) has proposed a "chemically-amplified resist" as a resist exhibiting high resolution for such short wavelength radiation. At present, improvement of the chemically amplified resist is actively being undertaken.

The chemically-amplified resist contains a photoacid generator which generates an acid upon irradiation (hereinafter called "exposure"). Chemical changes in the resist film (changes in polarity, breakage of a chemical bond, cross-linking reaction, etc.) caused by the catalytic action of an acid changes solubility of the exposed area in a developer. A pattern is formed utilizing this phenomenon.

As such a chemically-amplified resist exhibiting comparatively good resist performance, a resist comprising a resin in which an alkali affinitive group in an alkali-soluble resin is protected by a group such as a ketal group (Japanese Patent Application Laid-open No. 140666/1995) or an acetal group (Japanese Patent Applications Laid-open No. 161436/1990, No. 249682/1993), a resist comprising a copolymer containing a t-butoxy(α-methyl) styrene unit, hydroxy(α-methyl) styrene unit, and t-butyl (meth)acrylate unit (Japanese Patent Application Laid-open No. 211258/1992), and the like are known.

However, since these chemically-amplified resists have peculiar problems, various problems in putting these resists to practical use for microfabrication with a design line width of 0.25 μm or less have been pointed out.

One serious problem is a change in the resist patterns such as a change in the line width or change into T-character configuration according to post exposure delay (PED), which is a period of time from exposure to post bake.

In recent years, the device structure has become more and more complicated. This requires a resist with excellent processing performance for narrow space (dark field) patterns of which the space width is narrower than an ordinary line width.

Another problem brought about by microprocessing and complication of lithographic processes is an iso-dense bias, which is a critical dimension (CD) difference between isolated patterns and dense patterns.

An object of the present invention is to provide a radiation-sensitive resin composition useful as a positive-tone or negative-tone chemically amplified resist, effectively responding to various radiations, exhibiting excellent resolution and pattern configuration, the pattern configuration and line width being affected by PED to a minimal extent, particularly excelling in narrow space processing performance, a minimal iso-dense bias, CD uniformity in various pattern designs, and capable of forming fine patterns at a high precision and in a stable manner.

SUMMARY OF THE INVENTION

According to the present invention, the above object can be achieved by a positive-tone radiation-sensitive resin composition comprising (A1) a copolymer which comprises a recurring unit shown by the following formula (1) and/or a recurring unit shown by the following formula (2), and a recurring unit shown by the following formula (3-1), and (B) a photoacid generator,

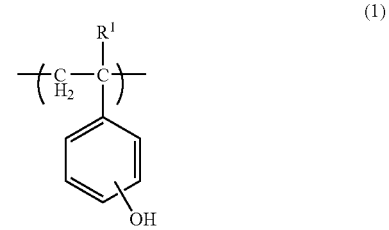

wherein $R^1$ represents a hydrogen atom or a methyl group;

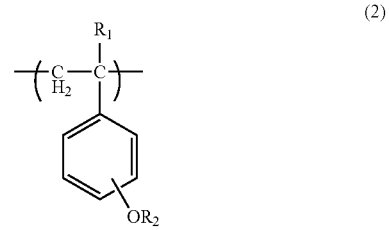

wherein $R^1$ represents a hydrogen atom or a methyl group, and $R^2$ represents a tertiary alkyl group having 4–10 carbon atoms;

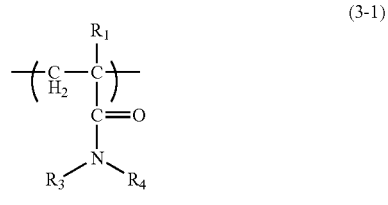

(3-1)

wherein $R^1$ represents a hydrogen atom or a methyl group, $R^3$ and $R^4$ individually represent a hydrogen atom, a substituted or unsubstituted alkyl group having 1–12 carbon atoms, a substituted or unsubstituted aromatic group having 6–15 carbon atoms, or a substituted or unsubstituted alkoxyl group having 1–12 carbon atoms, or $R^3$ and $R^4$ may form, in combination and together with the nitrogen atom with which the $R^3$ and $R^4$ groups bond, a cyclic structure having 3–15 carbon atoms, provided that $R^3$ and $R^4$ are not a hydrogen atom at the same time.

The above object can also be achieved in the present invention by a negative-tone radiation-sensitive resin composition comprising (A2) a copolymer which comprises a recurring unit shown by the above formula (1) and a recurring unit shown by the above formula (3-1), (B) a photoacid generator, and (C) a compound which can crosslink the copolymer (A1) in the presence of an acid.

The above object can further be achieved in the present invention by a radiation-sensitive resin composition comprising (A3-1) a resin comprising a recurring unit shown by the following formula (3-2), which is insoluble or scarcely soluble in alkali and becomes alkali soluble by the action of an acid, and (B) a photoacid generator,

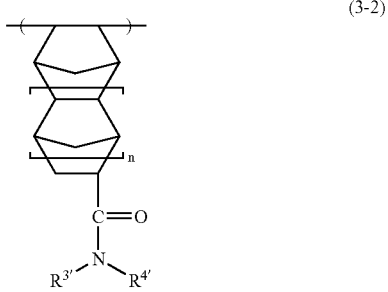

(3-2)

$R^{3'}$ and $R^{4'}$ individually represent a hydrogen atom, a substituted or unsubstituted alkyl group having 1–12 carbon atoms, a substituted or unsubstituted alkoxyl group having 1–12 carbon atoms, or a substituted or unsubstituted alkoxycarbonyl group having 2–13 carbon atoms, or $R^{3'}$ and $R^{4'}$ may form, in combination and together with the nitrogen atom with which the $R^{3'}$ and $R^{4'}$ groups bond, a cyclic structure having 3–15 carbon atoms, and n is an integer of 0–3.

The above object can still further be achieved in the present invention by a radiation-sensitive resin composition comprising (A3-2) a resin comprising a recurring unit shown by the following formula (3-1') and an alicyclic skeleton, which is insoluble or scarcely soluble in alkali and becomes alkali soluble by the action of an acid, and (B) a photoacid generator,

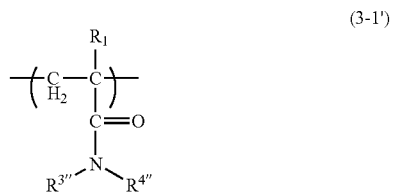

(3-1')

wherein $R^1$ represents a hydrogen atom or a methyl group, $R^{3''}$ and $R^{4''}$ individually represent a hydrogen atom, a substituted or unsubstituted alkyl group having 1–12 carbon atoms, a substituted or unsubstituted alkoxyl group having 1–12 carbon atoms, or a substituted or unsubstituted alkoxycarbonyl group having 2–13 carbon atoms, or $R^{3''}$ and $R^{4''}$ may form, in combination and together with the nitrogen atom with which the $R^{3''}$ and $R^{4''}$ groups bond, a cyclic structure having 3–10 carbon atoms.

The component (A3-1) and component (A3-2) may be hereinafter referred to as the component (A3).

Other objects, features and advantages of the invention will hereinafter become more readily apparent from the following description.

DETAILED DESCRIPTION OF THE INVENTION AND PREFERRED EMBODIMENTS

The present invention will be described in detail below.

Component (A1)

The component (A1) in the positive-tone radiation-sensitive resin composition of the present invention is a copolymer containing either one or both of a recurring unit shown by the above formula (1) (hereinafter referred to as "recurring unit (1)") and a recurring unit shown by the above formula (2) (hereinafter called "recurring unit (2)") and a recurring unit shown by the above formula (3-1) (hereinafter referred to as "recurring unit (3-1)"). Such a copolymer is hereinafter referred to as "copolymer (A1)."

In the resin (A1), each recurring unit (1), (2), and (3) may be used either individually or in combination of two or more, respectively.

When the copolymer (A1) contains only either one of the recurring unit (1) or the recurring unit (2), it is desirable to use other (co)polymers containing either the recurring unit (1) or the recurring unit (2) or both, so that the copolymer components in the positive-tone radiation sensitive composition of the present invention may, as a whole, contain all of the recurring unit (1), recurring unit (2), and recurring unit (3-1). The copolymer (A1) and the other (co)polymers may hereinafter be referred to collectively as "copolymer component (A1)".

The following combinations (1) to (3) of the copolymers can be given as particularly preferred specific examples of the present invention:

(1) a copolymer (A1) containing the recurring unit (1), recurring unit (2), and recurring unit (3-1), (2) combination of a copolymer (A1) containing the recurring unit (1) and recurring unit (3-1) and another copolymer containing the recurring unit (1) and recurring unit (2), and (3) combination of a copolymer (A1) containing the recurring unit (2) and recurring unit (3-1) and another copolymer containing the recurring unit (1) and recurring unit (2).

The content of the recurring unit (1) in all copolymers in the positive tone radiation sensitive composition is 20–90 mol %, preferably 30–85 mol %, and still more preferably 40–80 mol % of the total amount of the recurring units (1), (2), and (3-1). If the content of the recurring unit (1) is too small, sensitivity as a resist tends to decrease. If the content is too large, the resulting pattern shape may be impaired.

The amount of the recurring unit (2) is usually 5–50 mol %, preferably 5–30 mol % of the total amount of the recurring units (1), (2), and (3-1). If the content of the recurring unit (2) is too small, pattern resolution as a resist tends to decrease. If the content is too large, environmental resistance may be impaired.

The amount of the recurring unit (3-1) is usually 0.01–30 mol %, preferably 0.1–20 mol % of the total amount of the recurring units (1), (2), and (3-1). If the content of the recurring unit (3-1) is too small, iso-dense bias as a resist tends to be impaired. If the content is too large, solubility in solvents tends to decrease.

Recurring Unit (1)

As examples of preferable monomers which provide the recurring unit (1) in the copolymer (A1), o-hydroxystyrene, m-hydroxystyrene, p-hydroxystyrene, o-hydroxy-α-methylstyrene, m-hydroxy-α-methylstyrene, p-hydroxy-α-methylstyrene, and the like can be given. These monomers may be used either individually or in combination of two or more.

Recurring Unit (2)

As examples of the tertiary alkyl group having 4–10 carbon atoms represented by $R^2$ in the recurring unit (2), a t-butyl group, 1,1-dimethylpropyl group, 1,1-dimethylbutyl group, 1,1-dimethylpentyl group, 1,1-dimethylhexyl group, 1,1-dimethylheptyl group, 1,1-dimethyloctyl group, 1-methyl-1-ethylpropyl group, 1-methyl-1-ethylbutyl group, 1-methyl-1-ethylpentyl group, 1-methyl-1-ethylhexyl group, 1-methyl-1-ethylheptyl, methylcyclohexyl group, 1-ethylcyclohexyl group, 1-methylcyclopentyl group, 1-ethylcyclopentyl group, 1-benzylisobutanyl group, 2-norbornaneisobutanyl group, methyladamantyl group, and the like can be given.

As examples of preferable monomers which provide the recurring unit (2), a p-t-butoxystyrene, p-1,1-dimethylpropoxystyrene, p-1,1-dimethylbutoxystyrene, p-1,1-dimethylpentyloxystyrene, 1,1-dimethylhexyloxystyrene, p-1,1-dimethylheptyloxystyrene, p-1,1-dimethyloctyloxystyrene, p-(2-phenyl-2-propyloxy)styrene, p-t-butoxy-α-methylstyrene, p-1,1-dimethylpropoxy-α-methylstyrene, p-1,1-dimethylbutoxy-α-methylstyrene, p-1,1-dimethylpentyloxy-α-methylstyrene, p-1,1-dimethylhexyloxy-α-methylstyrene, p-1,1-dimethylheptyloxy-α-methylstyrene, p-1,1-dimethyloctyloxy-α-methylstyrene, methylcyclohexyloxystyrene, 1-ethylcyclohexyloxystyrene, 1-methylcyclopentyloxystyrene, 1-ethylcyclopentyloxystyrene, 1-benzylisobutanyloxystyrene and 2-norbornaneisobutanyloxystyrene, methyladamantyloxystyrene, and the like can be given. These monomers may be used either individually or in combination of two or more.

Recurring Unit (3-1)

Given as examples of alkyl groups having 1–12 carbon atoms represented by $R^3$ or $R^4$ in the recurring unit (3-1) are linear, branched, or cyclic alkyl groups such as a methyl group, ethyl group, n-propyl group, i-propyl group, n-butyl group, 2-methylpropyl group, 1-methylpropyl group, t-butyl group, n-pentyl group, neopentyl group, n-hexyl group, cyclopentyl group, and cyclohexyl group; linear, branched, or cyclic hydroxyalkyl groups such as a hydroxymethyl group, 2-hydroxyethyl group, 3-hydroxypropyl group, 4-hydroxybutyl group, 3-hydroxycyclopentyl group, and 4-hydroxycyclohexyl group; linear, branched, or cyclic alkoxyalkyl groups such as a methoxymethyl group, ethoxymethyl group, i-butoxymethyl group, 2-methoxyethyl group, 2-ethoxyethyl group, 3-methoxypropyl group, 3-ethoxypropyl group, 4-methoxybutyl group, 4-ethoxybutyl group, 3-methoxycyclopentyl group, 3-ethoxycyclopentyl group, 4-methoxycyclohexyl group, and 4-ethoxycyclohexyl group; linear, branched, or cyclic carboxyalkyl groups such as a carboxymethyl group, 2-carboxyethyl group, 3-carboxypropyl group, 4-carboxybutyl group, 3-carboxycyclopentyl group, and 4-carboxycyclohexyl group; and linear, branched, or cyclic cyanoalkyl groups such as a cyanomethyl group, 2-cyanoethyl group, 3-cyanopropyl group, 4-cyanobutyl group, 3-cyanocyclopentyl group, and 4-cyanocyclohexyl group.

As examples of substituted or unsubstituted aromatic groups having 6–15 carbon atoms, a phenyl group, benzyl group, tosyl group, and ansyl group can be given.

The following groups can be given as examples of substituted or unsubstituted alkoxyl groups having 1–12 carbon atoms represented by $R^3$ or $R^4$: linear, branched, or cyclic alkoxyl groups such as a methoxy group, ethoxy group, n-propoxy group, i-propoxy group, n-butoxy group, 2-methylpropoxy group, 1-methylpropoxy group, t-butoxy group, n-pentyloxy group, n-hexyloxy group, and cyclopentyloxy group, and cyclohexyloxy group; linear, branched, or cyclic hydroxyalkoxyl groups such as hydroxymethoxy group, 2-hydroxyethoxy group, 3-hydroxypropoxy group, 4-hydroxybutoxy group, 3-hydroxycyclopentyloxy group, and 4-hydroxycyclohexyloxy group; linear, branched, or cyclic alkoxyalkoxyl groups such as methoxymethoxy group, ethoxymethoxy group, 2-methoxyethoxy group, 2-ethoxyethoxy group, 3-methoxypropoxy group, 3-ethoxypropoxy group, 4-methoxybutoxy group, 4-ethoxybutoxy group, 3-methoxycyclopentyloxy group, 3-ethoxycyclopentyloxy group, 4-methoxycyclohexyloxy group, and 4-ethoxycyclohexyloxy group; linear, branched, or cyclic carboxyalkoxyl groups such as carboxymethoxy group, 2-carboxyethoxy group, 3-carboxypropoxy group, 4-carboxybutoxy group, 3-carboxycyclopentyloxy group, and 4-carboxycyclohexyloxy group; and linear, branched, or cyclic cyanoalkoxyl groups such as cyanomethoxy group, 2-cyanoethoxy group, 3-cyanopropoxy group, 4-cyanobutoxy group, 3-cyanocyclopentyloxy group, and 4-cyanocyclohexyloxy group.

The cyclic structure having 3–15 carbon atoms, formed by the groups $R^3$ and $R^4$ and the nitrogen atom with which the $R^3$ and $R^4$ groups bond, may further contain one or more types of hetero atoms such as an oxygen atom or nitrogen atom, in addition to the nitrogen atom with which the $R^3$ and $R^4$ groups bond.

Given as examples of such a cyclic structure, in terms of the cyclic structural group containing the nitrogen atom with which the $R^3$ and $R^4$ groups bond, are 1-pyrrolidinyl group, 1-pyrrolyl group, 2-pyrrolin-1-yl group and 3-pyrrolin-1-yl group, indolyl group, 2-iso-indolyl group, 1-imidazolyl group, 1-benzoimidazolyl group, 2-phenylimidazolyl group, 2-phenyl-1-benzoimidazolyl group, 2-imidazolin-1-yl group, 3-imidazolin-1-yl group, 1-pyrazolyl group, indazolyl group, 1-indolinyl group, 2-isoindolinyl group, 7-purinyl group, 9-carbazolyl group, 1-perimidinyl group, 10-phenothiazinyl group, 10-phenoxazinyl group, 1-piperidino group, and morpholino group.

The above-mentioned cyclic structure may contain one or more substituents of the types previously given as examples of substitutents for alkyl groups, such as a hydroxyl group alkoxyl group, carboxyl group, and cyano group.

Examples of monomers providing the recurring unit (3) include (meth)acrylamide, N-methyl(meth)acrylamide, N-ethyl(meth)acrylamide, N-cyclohexyl(meth)acrylamide, N-hydroxymethyl(meth)acrylamide, N-hydroxyethyl(meth) acrylamide, N-iso-butoxyethyl(meth)acrylamide, N-phenyl (meth)acrylamide, N-benzyl(meth)acrylamide, N,N-dimethyl(meth)acrylamide, N,N-diethyl(meth)acrylamide, N,N-dicyclohexyl(meth)acrylamide, N,N-dihydroxyethyl(meth) acrylamide, N,N-diphenyl(meth)acrylamide, N,N-dibutyl (meth)acrylamide, N,N'-methylene-bis(acrylamide), 1-(meth)acryloyl pyrrolidine, 1-(meth)acryloyl pyrroline, 1-(meth)acryloyl(2-pyrroline), 1-(meth)acryloyl(3-pyrroline), 1-(meth)acryloyl indole, 2-(meth)acryloyl iso-indole, 1-(meth)acryloyl imidazole, 1-(meth)acryloyl benzimidazole, 1-(meth)acryloyl-2-phenylimidazole, 1-(meth)acryloyl-2-phenylbenzimidazole, 1-(meth)acryloyl-2-imidazole, 1-(meth)acryloyl-3-imidazole, 1-(meth)acryloyl pyrazoline, 1-(meth)acryloyl indazole, 1-(meth)acryloyl indoline, 2(meth)acryloyl iso-indole, N-(meth)acryloyl carbazole, 7-(meth)acryloyl purine, 9-(meth)acryloyl carbazole, 1-(meth)acryloyl perimidine, 10-(meth)acryloyl phenothiazine, 10-(meth)acryloyl phenoxazine, 1-(meth)acryloyl piperidine, 1-(meth)acryloyl morpholine, N-(meth)acryloyl piperazine, N-(meth)acryloyl piperidine, N-(meth)acryloyl pyrazoline, N-(meth)acryloyl triazole, 7-(meth)acryloyl adenine, 7-(meth)acryloyl quanine, 1-(meth)acryloyl thymine, 1-(meth)acryloyl cytosine, and 1-(meth)acryloyl uracil. These monomers may be used either individually or in combinations of two or more.

Other Recurring Units

The copolymer (A1) and the above-mentioned other copolymers may comprise one or more recurring units other than the recurring units (1), (2), and (3-1) (hereinafter referred to as "ther recurring units ①").

The following compounds can be given as examples of monomers providing such other recurring units ①: styrenes such as styrene, α-methylstyrene, o-methoxystyrene, m-methoxystyrene, and p-methoxystyrene; unsaturated carboxylic acids and acid anhydridies thereof such as (meth) acrylic acid, maleic acid, fumaric acid, crotonic acid, mesaconic acid, citraconic acid, and itaconic acid, maleic anhydride, and methylmaleic anhydride; esters of the above unsaturated carboxylic acids, such as methyl ester, ethyl ester, n-propyl ester, i-propyl ester, n-butyl ester, t-butyl ester, i-butyl ester, sec-butyl ester, n-amyl ester, 2-hydroxyethyl ester, 2,2-dimethyl-3-hydroxypropyl ester, benzyl ester, 1-methyl-1-ethylpropylmethyl ester, 1-methyl-1-ethylbutylmethyl ester, 1-methyl-1-ethylpentylmethyl ester, 1-methyl-1-ethylhexylmethyl ester, 1-methyl-1-ethylheptyl, methylcyclohexylmethyl ester, 1-ethylcyclohexylmethyl ester, 1-methylcyclopentylmethyl ester, 1-ethylcyclopentylmethyl ester, 1-benzylisobutanylmethyl ester, 2-norbornaneisobutanylmethyl ester, and methyladamantylmethyl ester; unsaturated nitrile compounds such as (meth)acrylonitrile, maleinitrile, fumaronitrile, mesaconitrile, citraconitrile, and itaconitrile; unsaturated amide compounds such as (meth)acrylamide, crotonamide, maleinamide, fumaramide, mesaconamide, citraconamide, and itaconamide; unsaturated imides such as maleimide and N-phenylmaleimide; unsaturated alcohols such as (meth)allylalcohol; vinyl anilines; vinyl pyridines; and other vinyl compounds such as N-vinyl-ϵ-caprolactam, N-vinylpyrrolidone, N-vinylimidazole, and N-vinylcarbazole.

These monomers may be used either individually or in combinations of two or more.

The content of the other recurring units ① in the copolymer components (A1) is usually 30 wt % or less of the total amount of the recurring units (1), (2), and (3-1).

The polystyrene-reduced weight average molecular weight (hereinafter referred to as "Mw") of the copolymer (A1) determined by gel permeation chromatography (hereinafter referred to as "GPC") is 1,000–100,000, preferably 3,000–40,000, and still more preferably 3,000–30,000. If Mw of the copolymer (A1) is less than 1,000, sensitivity and heat resistance as a resist tend to decrease. If Mw exceeds 100,000, solubility in a developer tends to decrease.

In the copolymer (A1), the ratio of Mw to Mn (polystyrene-reduced number average molecular weight determined by GPC) (Mw/Mn) is 1.0–5.0, and preferably 1.0–3.0. The Mw and the ratio of Mw to Mn of the copolymer (A1) apply to the other copolymers.

The copolymer (A1) is prepared using the following methods, for example.

(a) A method of copolymerizing a hydroxy(α-methyl) styrene with a monomer corresponding to the recurring unit (2) and a monomer corresponding to the recurring unit (3-1).

(b) A method of copolymerizing an acetoxy(α-methyl) styrene with a monomer corresponding to the recurring unit (2) and a monomer corresponding to the recurring unit (3-1), followed by hydrolysis and/or solvolysis of acetoxy groups in the copolymer using a basic catalyst.

(c) A method of copolymerizing a monomer corresponding to the recurring unit (2) and a monomer corresponding to the recurring unit (3-1), followed by hydrolysis and/or solvolysis of —$OR^2$ groups in the copolymer using an acidic catalyst.

The copolymerization by the methods (a) to (c) above is carried out by block polymerization, solution polymerization, precipitation polymerization, emulsion polymerization, suspension polymerization, block-suspension polymerization, and the like using an appropriate polymerization initiator such as a radical polymerization initiator or anionic polymerization initiator.

If necessary, the copolymer (A1) can be blended with a resin or a low molecular weight compound having good mutual solubility with the copolymer (A1) and not impairing homogeneity of the coating film when the composition is applied to a substrate.

Component (A-2)

The component (A2) in the negative tone radiation sensitive composition of the present invention is a copolymer comprising the recurring unit (1) and the recurring unit (3-1) (hereinafter referred to as "copolymer (A2)").

In the copolymer (A2), each of the recurring unit (1) and (3-1) may be used either individually or in combinations of two or more, respectively.

The copolymer (A2) may be used together with other (co)polymers in the negative tone radiation sensitive composition of the present invention. In addition, the copolymer (A2) may comprise recurring units other than the recurring unit (1) and the recurring unit (3-1) (the copolymer (A2) and other (co)polymers may hereinafter be collectively referred to as "copolymer component (A2)").

The content of the recurring unit (3-1) in the copolymer component (A2) of the negative tone radiation sensitive composition is usually 0.1–30 mol %, preferably 0.1–15 mol %, and still more preferably 0.1–10 mol % of the total amount of the recurring unit (1) and the recurring unit (3-1). If the content of the recurring unit (1) is to small, improvement in the iso-dense bias may be insufficient; if the content is too large, sensitivity tends to decrease.

The monomers used for the copolymer (A1) can be preferably used as the monomers providing the recurring unit (1) and the recurring unit (3-1).

The copolymer (A2) and the above-mentioned other copolymers may optionally comprise the recurring unit (2) and the other recurring units ①. The content of the recurring unit (2) and the other recurring units ① in the copolymer component (A2) of the negative tone radiation sensitive composition is 50 wt % or less, and preferably 30 wt % or less, of the total amount of the recurring units (1) and (3-1).

Mw of the copolymer (A2) is usually 500–100,000, preferably 1,000–50,000, and still more preferably 1,000–30,000. If Mw of the copolymer (A2) is less than 500, sensitivity and heat resistance as a resist tend to decrease. If Mw exceeds 100,000, solubility in a developer tends to decrease.

Mw/Mn of the copolymer (A2) is 1.0–3.0, and preferably 1.0–2.0.

The copolymer (A2) is prepared using the following methods, for example.

(a') A method of copolymerizing a hydroxy(α-methyl)styrene with a monomer corresponding to the recurring unit (3-1).

(b') A method of copolymerizing an acetoxy(α-methyl)styrene with a monomer corresponding to the recurring unit (3-1), followed by hydrolysis and/or solvolysis of acetoxy groups in the copolymer using a basic catalyst.

(c') A method of copolymerizing a monomer corresponding to the recurring unit (2) and a monomer corresponding to the recurring unit (3-1), followed by hydrolysis and/or solvolysis of —$OR^2$ groups in the copolymer using a basic catalyst.

The copolymerization in the methods (a') to (c') is carried out by block polymerization, solution polymerization, precipitation polymerization, emulsion polymerization, suspension polymerization, block-suspension polymerization, and the like using an appropriate radical polymerization initiator.

If necessary, the copolymer (A2) can be blended with an alkali soluble resin or a low molecular weight compound having good mutual solubility with the copolymer (A2) and not impairing homogeneity of the coating film when the composition is applied to a substrate.

Component (A3)

The component (A3) of the present invention is a resin comprising a recurring unit shown by the formula (3-2) (hereinafter referred to as "recurring unit (3-2)"), insoluble or scarcely soluble in alkali and becoming alkali soluble by the action of an acid (hereinafter referred to as "resin (A3–1)") or a resin comprising a recurring unit shown by the formula (3-1') (hereinafter referred to as "recurring unit (3-1')") and an alicyclic structure, insoluble or scarcely soluble in alkali and becoming alkali soluble by the action of an acid (hereinafter referred to as "resin (A3-2)").

The resin (A3-1) or resin (A3-2) provides the radiation-sensitive resin composition of the present invention exhibiting superior transparency to radioactive rays, particularly to an ArF excimer laser, and exhibiting only a slight line width fluctuation due to an increase or decrease of a space width when the composition is used as a resist.

As groups represented by $R^{3'}$ or $R^{4'}$ in the formula (3-2), in addition to the groups previously mentioned as the groups represented by $R^3$ or $R^4$, the following substituted or unsubstituted alkoxycarbonyl groups having 2–13 carbon atoms can be given: a linear, branched, or cyclic alkoxycarbonyl groups such as a methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, t-butoxycarbonyl group, n-pentyloxycarbonyl group, n-hexyloxycarbonyl group, cyclopentyloxycarbonyl group, and cyclohexyloxy carbonyl group; linear, branched, or cyclic hydroxyalkoxycarbonyloxy groups such as a hydroxymethoxycarbonyl group, 2-hydroxyethoxycarbonyl group, 3-hydroxypropoxycarbonyl group, 4-hydroxybutoxycarbonyl group, 3-hydroxycyclopentyloxycarbonyl group, and 4-hydroxycyclohexyloxycarbonyl group; alkoxyalkoxycarbonyl groups such as a methoxymethoxycarbonyl group, ethoxyethoxycarbonyl group, 2-methoxyethoxycarbonyl group, 2-ethoxyethoxycarbonyl group, 3-methoxypropoxycarbonyl group, 3-ethoxypropoxycarbonyl group, 4-methoxybutoxycarbonyl group, 4-ethoxybutoxycarbonyl group, 3-methoxycyclopentyloxycarbonyl group, 3-ethoxycyclopentyloxycarbonyl group, 4-methoxycyclohexyloxycarbonyl group, and 4-ethoxycyclohexyloxycarbonyl group; linear, branched, or cyclic carboxyalkoxycarbonyloxy groups such as a carboxymethoxycarbonyl group, 2-carboxyethoxycarbonyl group, 3-carboxypropoxycarbonyl group, 4-carboxybutoxycarbonyl group, 3-carboxycyclopentyloxycarbonyl group, and 4-carboxycyclohexyloxycarbonyl group; and linear, branched, or cyclic cyanoalkoxycarbonyloxy groups such as a cyanomethoxycarbonyl group, 2-cyanoethoxycarbonyl group, 3-cyanopropoxycarbonyl group, 4-cyanobutoxycarbonyl group, 3-cyanocyclopentyloxycarbonyl group, and 4-cyanocyclohexyloxycarbonyl group.

As an integer n in the formula (3-2), either 0 or 1 is particularly preferable.

As examples of monomers which provide the recurring unit (3-2), norbornene derivatives shown by the following formula (I) (hereinafter called "norbornene derivatives (I)") can be given:

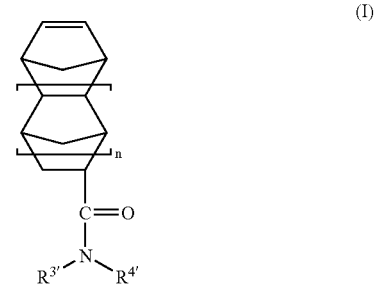

(I)

wherein $R^{3'}$, $R^{4'}$ and n have the same meanings as defined for the corresponding symbols in the formula (3-2).

Examples of preferable norbornene derivatives (I) include: bicyclo[2.2.1]hept-2-ene-5-carboxylic acid amide; bicyclo[2.2.1]hept-2-ene derivatives such as, N-methylbicyclo[2.2.1]hept-2-ene-5-carboxylic acid amide, N,N-dimethylbicyclo[2.2.1]hept-2-ene-5-carboxylic acid amide, N-ethylbicyclo[2.2.1]hept-2-ene-5-carboxylic acid amide, N,N-diethylbicyclo[2.2.1]hept-2-ene-5-carboxylic acid amide, N-methoxybicyclo[2.2.1]hept-2-ene-5-carboxylic acid amide, N,N-dimethoxybicyclo[2.2.1]hept-2-ene-5-carboxylic acid amide, N-ethoxybicyclo[2.2.1]hept-2-ene-5-carboxylic acid amide, N,N-diethoxybicyclo[2.2.1]hept-2-ene-5-carboxylic acid amide,
N-methoxycarbonylbicyclo[2.2.1]hept-2-ene-5-carboxylic acid amide,
N,N-di(methoxycarbonyl)bicyclo[2.2.1]hept-2-ene-5-carboxylic acid amide,
N-ethoxycarbonylbicyclo[2.2.1]hept-2-ene-5-carboxylic acid amide,
N,N-di(ethoxycarbonyl)bicyclo[2.2.1]hept-2-ene-5-carboxylic acid amide, and bicyclo[2.2.1]hept-2-ene-5-carboxylic acid pyrrolidinyl, compounds represented by the following formula (I-1), (I-2), or (I-3),

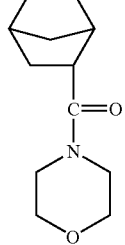

(I-1)

(I-2)

(I-3)

tetracyclo[4.4.0.1$^{2,5}$.1$^{7,10}$]dodec-3-ene derivatives such as tetracyclo[4.4.0.1$^{2,5}$.1$^{7,10}$]dodec-3-ene-8-carboxylic acid amide,
N-methyltetracyclo[4.4.0.1$^{2,5}$.1$^{7,10}$]dodec-3-ene-8-carboxylic acid amide,
N,N-dimethyltetracyclo[4.4.0.1$^{2,5}$.1$^{7,10}$]dodec-3-ene-8-carboxylic acid amide,
N-ethyltetracyclo[4.4.0.1$^{2,5}$.1$^{7,10}$]dodec-3-ene-8-carboxylic acid amide,
N,N-diethyltetracyclo[4.4.0.1$^{2,5}$.1$^{7,10}$]dodec-3-ene-8-carboxylic acid amide,
N-methoxytetracyclo[4.4.0.1$^{2,5}$.1$^{7,10}$]dodec-3-ene-8-carboxylic acid amide,
N,N-dimethoxytetracyclo[4.4.0.1$^{2,5}$.1$^{7,10}$]dodec-3-ene-8-carboxylic acid amide,
N-ethoxytetracyclo[4.4.0.1$^{2,5}$.1$^{7,10}$]dodec-3-ene-8-carboxylic acid amide, and
N,N-diethoxytetracyclo[4.4.0.1$^{2,5}$.1$^{7,10}$]dodec-3-ene-8-carboxylic acid amide, N-methoxycarbonyltetracyclo[4.4.0.1$^{2,5}$.1$^{7,10}$]dodec-3-ene-8-carboxylic acid amide,
N,N-di(methoxycarbonyl)tetracyclo[4.4.0.1$^{2,5}$.1$^{7,10}$]dodec-3-ene-8-carboxylic acid amide,
N-ethoxycarbonyltetracyclo[4.4.0.1$^{2,5}$.1$^{7,10}$]dodec-3-ene-8-carboxylic acid amide,
N,N-di(ethoxycarbonyl)tetracyclo[4.4.0.1$^{2,5}$.1$^{7,10}$]dodec-3-ene-8-carboxylic acid amide, and compounds represented by the following formula (I-4), (I-5), or (I-6),

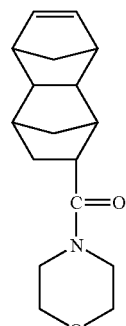

(I-4)

(I-5)

(I-6)

Of the above norbornene derivatives (I), bicyclo[2.2.1]hept-2-ene carboxylic acid amide,
N,N-dimethylbicyclo[2.2.1]hept-2-ene carboxylic acid amide,
N,N-diethylbicyclo[2.2.1]hept-2-ene carboxylic acid amide, the compound of the above formula (I-2), the compound of the above formula (I-3), tetracyclo[4.4.0.1$^{2,5}$.1$^{7,10}$]dodec-3-ene-8-carboxylic acid amide,
N,N-dimethyltetracyclo[4.4.0.1$^{2,5}$.1$^{7,10}$]dodec-3-ene-8-carboxylic acid amide, N,N-diethyltetracyclo[4.4.0.1$^{2,5}$.1$^{7,10}$]dodec-3-ene-8-carboxylic acid amide, the compound of the above formula (I-5), the compound of the above formula (I-6), and the like are preferably used.

In the present invention, the norbornene derivatives (I) can be used either individually or in combination of two or more.

The groups given for $R^{3'}$ and $R^{4'}$ in the formula (3-2) can be given as examples of the groups represented by $R^{3''}$ and $R^{4''}$ in the formula (3-1'), which include a substituted or unsubstituted alkyl group having 1–12 carbon atoms, a substituted or unsubstituted alkoxyl group having 1–12 carbon atoms, and a substituted or unsubstituted alkoxycarbonyl group having 2–13 carbon atoms, as well as a cyclic structure having 3–15 carbon atoms formed by $R^{3''}$ and $R^{4''}$ together with the nitrogen atom with which the $R^{3''}$ and $R^{4''}$ groups bond.

Particularly preferable groups for $R^{3''}$ and $R^{4''}$ in the formula (3-1') are a hydrogen atom, methyl group, ethyl group, 2-hydroxyethyl group, and the like.

As the group $R^1$ in the formula (3-1'), both the hydrogen atom and methyl group are preferable.

As examples of monomers which provide the recurring unit (3-1'), monomers previously given in connection with the recurring unit (3-1) (hereinafter referred to from time to time as "(meth)acrylic acid derivatives (II)") can be given.

Of these monomers, (meth)acrylamide, N,N-dimethyl(meth)acrylamide, (meth)acryloylmorpholine, and the like are preferable.

In the present invention, the above monomers can be used either individually or in combination of two or more.

It is essential that the resin (A3-2) contain an alicyclic skeleton in the main chain and/or side chain of the molecule.

In addition, it is desirable that the resin (A3-1) and resin (A3-2) contain acid-dissociating group-containing recurring units other than recurring units (3-2) and (3-1'), which dissociate in the presence of an acid to form an acidic functional group, such as carboxyl group or sulfonic acid group, in the resin.

As a preferable resin (A3-1) or (A3-2) of the present invention, a resin insoluble or scarcely soluble in alkali containing the recurring unit (3-2) and/or recurring unit (3-1'), and the recurring unit (i) and/or recurring unit (ii), shown by the following formulas, and becoming alkali soluble by the action of an acid can be given (such a resin is hereinafter referred to as "resin (α)"). A resin containing the recurring unit (3-2) and/or recurring unit (3-1') and the recurring unit (i) (hereinafter referred to as "resin (α1)") and a resin containing the recurring unit (3-2) and/or recurring unit (3-1') and the recurring unit recurring unit (ii) (hereinafter referred to as "resin (α2)") are particularly preferable, provided that the resin (α) and resin (α2) must have an alicyclic skeleton in the main chain and/or side chain when these resins do not have the recurring unit (3-2) or recurring unit (i).

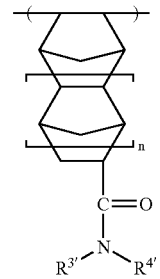

(3-2)

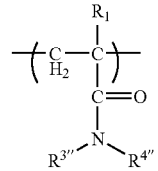

(3-1')

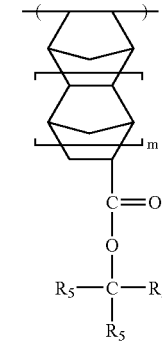

(i)

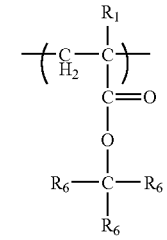

(ii)

wherein $R^1$, $R^{3'}$, $R^{4'}$, $R^{3''}$, and $R^{4''}$ are the same as defined for the above; $R^5$ individually represents a linear or branched alkyl group having 1–4 carbon atoms or a monovalent alicyclic hydrocarbon group having 4–20 carbon atoms or derivatives thereof, provided that at least one $R^5$ is a linear or branched alkyl group having 1–4 carbon atoms, or any two $R^5$ groups form, in combination and together with the carbon atoms to which the two $R^5$ groups bond, a divalent alicyclic hydrocarbon group having 4–20 carbon atoms or derivatives thereof, with the remaining $R^5$ groups being a linear or branched alkyl group having 1–4 carbon atoms; $R^6$ individually represents a linear or branched alkyl group having 1–4 carbon atoms or a monovalent alicyclic hydrocarbon group having 4–20 carbon atoms or derivatives thereof, provided that at least one $R^6$ is a linear or branched alkyl group having 1–4 carbon atoms, or any two $R^6$ groups form, in combination and together with the carbon atoms to which the two $R^6$ groups bond, a divalent alicyclic hydrocarbon group having 4–20 carbon atoms or derivatives thereof, with the remaining $R^5$ groups being a linear or branched alkyl group having 1–4 carbon atoms; and m and n are an integer of 0–3.

As examples of the linear or branched alkyl group having 1–4 carbon atoms represented by $R^5$ or $R^6$, a methyl group, ethyl group, n-propyl group, i-propyl group, n-butyl group, 2-methylpropyl group, 1-methylpropyl group, and t-butyl group can be given.

Of these alkyl groups, a methyl group and ethyl group are particularly preferable.

As examples of the monovalent alicyclic hydrocarbon group having 4–20 carbon atoms represented by $R^5$ or $R^6$, and the divalent alicyclic hydrocarbon group having 4–20 carbon atoms formed by $R^5$ or $R^6$, alicyclic groups derived from a cycloalkane such as norbornane, tricyclodecane, tetracyclododecane, adamantane, cyclobutane, cyclopentane, cyclohexane, cycloheptane, or cyclooctane, and groups obtained by replacing hydrogen atoms on these alicyclic groups with one or more linear, branched, or unbranched alkyl groups having 1–8 carbon atoms, such as methyl group, ethyl group, n-propyl group, i-propyl group, n-butyl group, 2-methyl propyl group, 1-methyl propyl group, or t-butyl group, can be given.

Of these monovalent and divalent alicyclic hydrocarbon groups, groups containing an alicyclic ring derived from norbornane, tricyclodecane, tetracyclododecane, adamantane, cyclopentane, or cyclohexane, or groups in which these alicyclic ring-containing groups are substituted with the above alkyl groups are preferable.

As examples of derivatives of the monovalent or divalent alicyclic hydrocarbon groups, groups having one or more substitutes, such as a hydroxyl group; a carboxyl group; a linear or branched hydroxyalkyl group having 1–4 carbon atoms such as a hydroxymethyl group, 2-hydroxyethyl group, 3-hydroxypropyl group, and 4-hydroxypropyl group; a linear or branched alkoxyl group having 1–4 carbon atoms such as a methoxy group, ethoxy group, n-propoxy group, i-propoxy group, n-butoxy group, 2-methylpropoxy group, 1-methylpropoxy group, and t-butoxy group; a cyano group; a linear or branched cyanoalkyl group having 2–5 carbon atoms such as a cyanomethyl group, 2-cyanoethyl group, 3-cyanopropyl group, and 4-cyanobutyl group; and the like, can be given.

Of these substituents, a hydroxyl group, carboxyl group, hydroxymethyl group, cyano group, and the like are preferable.

In the resin (α), both the group —COO($R^5$)$_3$ possessed by the recurring unit (i) and the group —COO($R^6$)$_3$ possessed by the recurring unit (ii) dissociate in the presence of an acid and produce a carboxyl group. These groups —COO($R^5$)$_3$ and —COO($R^6$)$_3$ are hereinafter collectively referred to as "acid-dissociating groups (i)."

As specific preferable examples of the acid-dissociating groups (i), t-butoxycarbonyl group and groups shown by the following formulas (i-1) to (i-47) can be given.

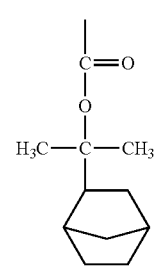

(i-1)

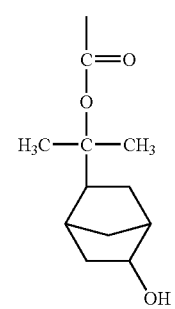

(i-2)

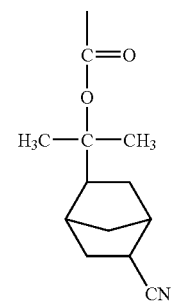

(i-3)

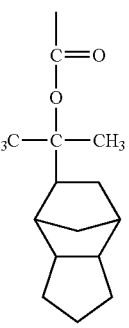

(i-4)

-continued
(i-5)
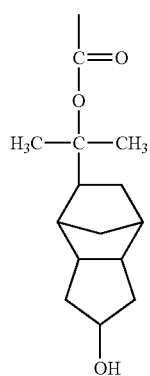
(i-6)
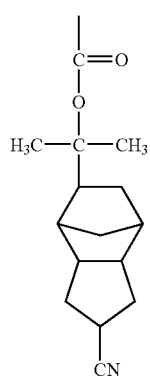
(i-7)
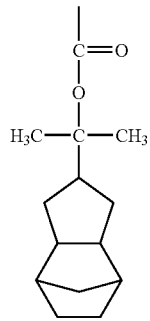
(i-8)
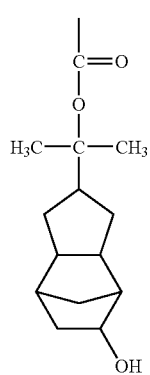
-continued
(i-9)
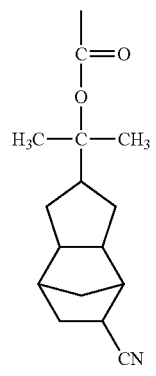
(i-10)
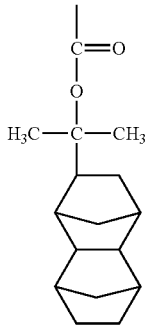
(i-11)
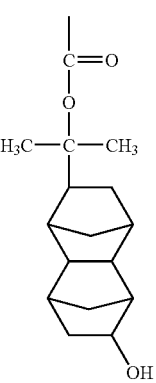
(i-12)
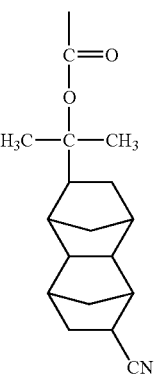

-continued
(i-13)
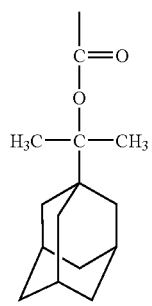
(i-14)
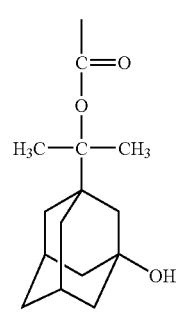
(i-15)
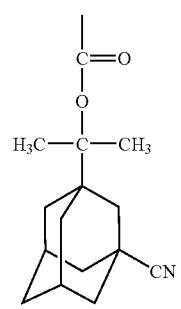
(i-16)
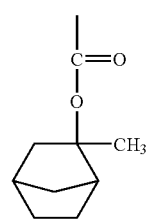
(i-17)
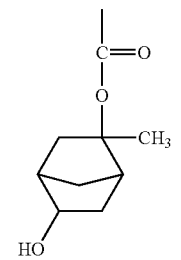
-continued
(i-18)
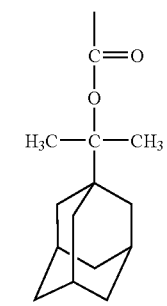
(i-19)
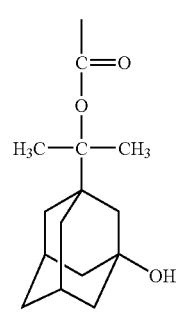
(i-20)
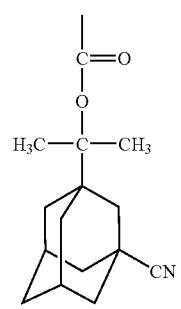
(i-21)
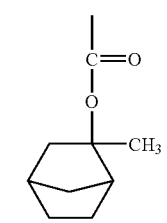
(i-22)
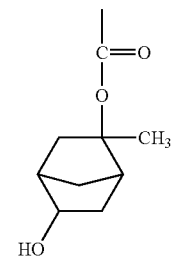
(i-23)
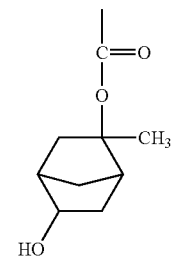

-continued
(i-24)
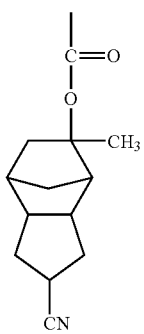
(i-25)
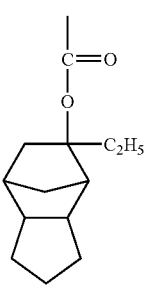
(i-26)
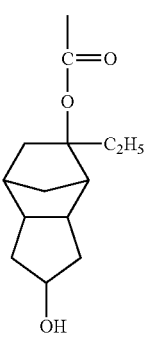
(i-27)
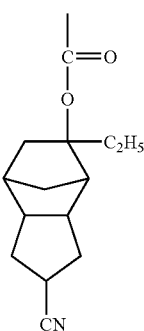
(i-28)
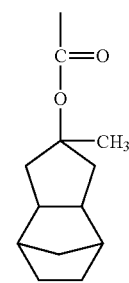
-continued
(i-29)
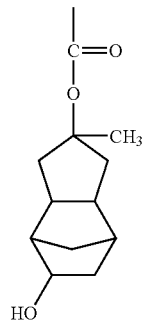
(i-30)
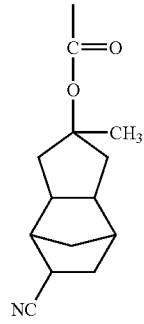
(i-31)
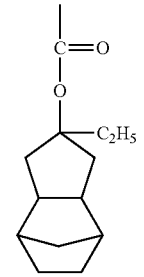
(i-32)
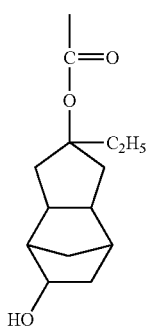
(i-33)
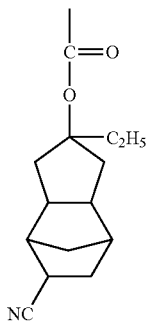

-continued
(i-34)
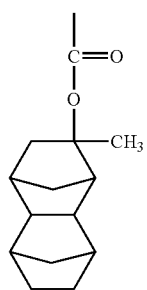
(i-35)
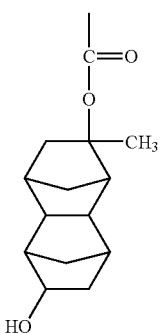
(i-36)
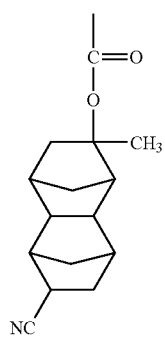
(i-37)
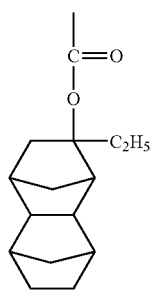
(i-38)
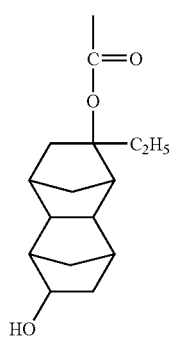
-continued
(i-39)
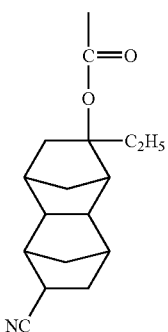
(i-40)
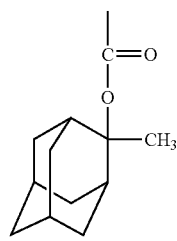
(i-41)
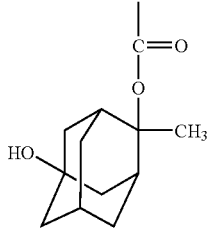
(i-42)
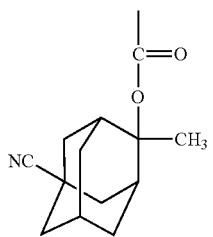
(i-43)
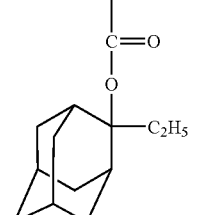
(i-44)
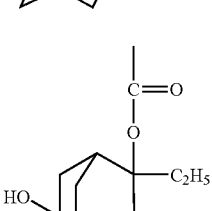

-continued

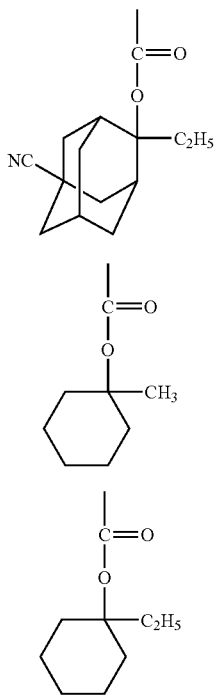

(i-45)

(i-46)

(i-47)

Of these acid-dissociating organic groups (i), t-butoxycarbonyl group and the groups shown by the formulas (i-1), (i-2), (i-10), (i-11), (i-13), (i-14), (i-16), (i-17), (i-34), (i-35), (i-40), (i-41), (i-46), or (i-47) are particularly preferable.

A particularly preferable integer for m in the recurring units (i) is 0 or 1. As the group $R^1$ in the recurring unit (ii), both the hydrogen atom and methyl group are preferable.

As examples of monomers which provide the recurring unit (i), compounds shown by the following formula (i') (hereinafter referred to as "norbornene derivatives (i')") can be given:

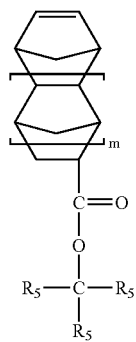

(i')

wherein $R^5$ and m are the same as defined for the above formula (i).

Examples of preferable norbornene derivatives (i') include: compounds having an acid-dissociating organic group (i) selected from the group consisting of t-butoxycarbonyl group and the groups shown by the formulas (i-1), (i-2), (i-10), (i-11), (i-13), (i-14), (i-16), (i-17), (i-34), (i-35), (i-40), (i-41), (i-46), or (i-47), and having m−0 in the formula (i'); and compounds having an acid-dissociating organic group (i) selected from the group consisting of t-butoxycarbonyl group and the groups shown by the formulas (i-1), (i-2), (i-10), (i-11), (i-13), (i-14), (i-16), (i-17), (i-34), (i-35), (i-40), (i-41), (i-46), or (i-47), and having m−1 in the formula (i').

The monomer providing the recurring unit (ii) is a compound derived from (meth)acrylic acid by converting the carboxyl group into the acid-dissociating group (i) (such a compound is hereinafter referred to as "(meth)acrylic acid derivatives (ii')").

Compounds having an acid-dissociating group (i) selected from the group consisting of t-butoxycarbonyl group and the groups shown by the formulas (i-1), (i-2), (i-10), (i-11), (i-13), (i-14), (i-16), (i-17), (i-34), (i-35), (i-40), (i-41), (i-46), or (i-47) can be given as preferable (meth)acrylic acid derivatives (ii') in the present invention.

The resin (A3) may comprise at least one recurring unit other than the recurring units (3-2), (3-1'), (i), and (ii) (hereinafter referred to as "other recurring unit ③").

The following compounds can be given as examples of monomers providing such other recurring units ③: monofunctional monomers, which include: bicyclo[2.2.1]hept-2-ene derivatives having an acid-dissociating group which dissociates in the presence of an acid and forms a carboxyl group in the resin such as
5-methoxycarbonylbicyclo[2.2.1]hept-2-ene,
5-ethoxycarbonylbicyclo[2.2.1]hept-2-ene,
5-n-propoxycarbonylbicyclo[2.2.1]hept-2-ene,
5-i-propoxycarbonylbicyclo[2.2.1]hept-2-ene,
5-n-butoxycarbonylbicyclo[2.2.1]hept-2-ene,
5-(2-methylpropoxy)carbonylbicyclo[2.2.1]hept-2-ene,
5-(1-methylpropoxy)carbonylbicyclo[2.2.1]hept-2-ene,
5-cyclohexyloxycarbonylbicyclo[2.2.1]hept-2-ene,
5-(4-t-butylcyclohexyloxy)carbonylbicyclo[2.2.1]hept-2-ene,
5-phenoxycarbonylbicyclo[2.2.1]hept-2-ene,
5-(1-ethoxyethoxy)carbonylbicyclo[2.2.1]hept-2-ene,
5-(1-cyclohexyloxyethoxy)carbonylbicyclo[2.2.1]hept-2-ene,
5-t-butoxycarbonylmethoxycarbonylbicyclo[2.2.1]hept-2-ene,
5-tetrahydrofuranyloxycarbonylbicyclo[2.2.1]hept-2-ene,
5-tetrahydropyranyloxycarbonylbicyclo[2.2.1]hept-2-ene,
5-methyl-5-methoxycarbonylbicyclo[2.2.1]hept-2-ene,
5-methyl-5-ethoxycarbonylbicyclo[2.2.1]hept-2-ene,
5-methyl-5-n-propoxycarbonylbicyclo[2.2.1]hept-2-ene,
5-methyl-5-i-propoxycarbonylbicyclo[2.2.1]hept-2-ene,
5-methyl-5-n-butoxycarbonylbicyclo[2.2.1]hept-2-ene,
5-methyl-5-(2-methylpropoxy)carbonylbicyclo[2.2.1]hept-2-ene,
5-methyl-5-(1-methylpropoxy)carbonylbicyclo[2.2.1]hept-2-ene,
5-methyl-5-t-butoxycarbonylbicyclo[2.2.1]hept-2-ene,
5-methyl-5-cyclohexyloxycarbonylbicyclo[2.2.1]hept-2-ene,
5-methyl-5-(4-t-butylcyclohexyloxy)carbonylbicyclo[2.2.1]hept-2-ene,
5-methyl-5-phenoxycarbonylbicyclo[2.2.1]hept-2-ene,
5-methyl-5-(1-ethoxyethoxy)carbonylbicyclo[2.2.1]hept-2-ene,
5-methyl-5-(1-cyclohexyloxyethoxy)carbonylbicyclo[2.2.1]hept-2-ene,
5-methyl-5-t-butoxycarbonylmethoxycarbonylbicyclo[2.2.1]hept-2-ene,
5-methyl-5-tetrahydrofuranyloxycarbonylbicyclo[2.2.1]hept-2-ene, 5-methyl-5-tetrahydropyranyloxycarbonylbicyclo[2.2.1]
hept-2-ene,
5,6-di(methoxycarbonyl)bicyclo[2.2.1]hept-2-ene,
5,6-di(ethoxycarbonyl)bicyclo[2.2.1]hept-2-ene,
5,6-di(n-propoxycarbonyl)bicyclo[2.2.1]hept-2-ene,
5,6-di(i-propoxycarbonyl)bicyclo[2.2.1]hept-2-ene,
5,6-di(n-butoxycarbonyl)bicyclo[2.2.1]hept-2-ene,
5,6-di(2-methylpropoxycarbonyl)bicyclo[2.2.1]hept-2-ene,
5,6-di(1-methylpropoxycarbonyl)bicyclo[2.2.1]hept-2-ene,
5,6-di(t-butoxycarbonyl)bicyclo[2.2.1]hept-2-ene,
5,6-di(cyclohexyloxycarbonyl)bicyclo[2.2.1]hept-2-ene,
5,6-di(4-t-butylcyclohexyloxycarbonyl)bicyclo[2.2.1]hept-2-ene, 5,6-di(phenoxycarbonyl)bicyclo[2.2.1]hept-2-ene,
5,6-di(1-ethoxyethoxycarbonyl)bicyclo[2.2.1]hept-2-ene,
5,6-di(1-cyclohexyloxyethoxycarbonyl)bicyclo[2.2.1]hept-2-ene,
5,6-di(t-butoxycarbonylmethoxycarbonyl)bicyclo[2.2.1]
hept-2-ene,
5,6-di(tetrahydrofuranyloxycarbonyl)bicyclo[2.2.1]hept-2-ene,
5,6-di(tetrahydropyranyloxycarbonyl)bicyclo[2.2.1]hept-2-ene and the like;
bicyclo[2.2.1]hept-2-ene and bicyclo[2.2.1]hept-2-ene derivatives such as norbornene (specifically, bicyclo[2.2.1]hept-2-ene), 5-methylbicyclo[2.2.1]hept-2-ene,
5-ethylbicyclo[2.2.1]hept-2-ene,
5-n-propylbicyclo[2.2.1]hept-2-ene,
5-n-butylbicyclo[2.2.1]hept-2-ene,
5-n-pentylbicyclo[2.2.1]hept-2-ene,
5-n-hexylbicyclo[2.2.1]hept-2-ene,
5-hydroxybicyclo[2.2.1]hept-2-ene,
5-carboxybicyclo[2.2.1]hept-2-ene,
5-hydroxymethylbicyclo[2.2.1]hept-2-ene,
5-(2-hydroxyethyl)bicyclo[2.2.1]hept-2-ene,
5-methoxybicyclo[2.2.1]hept-2-ene,
5-ethoxybicyclo[2.2.1]hept-2-ene,
5-(1-methoxyethoxy)bicyclo[2.2.1]hept-2-ene,
5-(1-ethoxyethoxy)bicyclo[2.2.1]hept-2-ene,
5-(1-n-propoxyethoxy)bicyclo[2.2.1]hept-2-ene,
5-(1-n-butoxyethoxy)bicyclo[2.2.1]hept-2-ene,
5-(1-cyclohexyloxyethoxy)bicyclo[2.2.1]hept-2-ene,
5-methoxycarbonyloxybicyclo[2.2.1]hept-2-ene,
5-ethoxycarbonyloxybicyclo[2.2.1]hept-2-ene,
5-n-propoxycarbonyloxybicyclo[2.2.1]hept-2-ene,
5-n-butoxycarbonyloxybicyclo[2.2.1]hept-2-ene,
5-(1-methoxyethoxy)methylbicyclo[2.2.1]hept-2-ene,
5-(1-ethoxyethoxy)methylbicyclo[2.2.1]hept-2-ene,
5-(1-n-propoxyethoxy)methylbicyclo[2.2.1]hept-2-ene,
5-(1-n-butoxyethoxy)methylbicyclo[2.2.1]hept-2-ene,
5-(1-cyclohexyloxyethoxy)methylbicyclo[2.2.1]hept-2-ene,
5-methoxycarbonyloxymethylbicyclo[2.2.1]hept-2-ene,
5-ethoxycarbonyloxymethylbicyclo[2.2.1]hept-2-ene,
5-n-propoxycarbonyloxymethylbicyclo[2.2.1]hept-2-ene,
5-n-butoxycarbonyloxymethylbicyclo[2.2.1]hept-2-ene,
5-tetrahydrofuranyloxybicyclo[2.2.1]hept-2-ene,
5-tetrahydropyranyloxybicyclo[2.2.1]hept-2-ene,
5-tetrahydrofuranyloxymethylbicyclo[2.2.1]hept-2-ene,
5-tetrahydropyranyloxymethylbicyclo[2.2.1]hept-2-ene,
5,6-dihydroxybicyclo[2.2.1]hept-2-ene,
5,6-dicarboxybicyclo[2.2.1]hept-2-ene,
5,6-di(hydroxymethyl)bicyclo[2.2.1]hept-2-ene,
5,6-di(2-hydroxyethyl)bicyclo[2.2.1]hept-2-ene,
5,6-dimethoxybicyclo[2.2.1]hept-2-ene,
5,6-diethoxybicyclo[2.2.1]hept-2-ene,
5,6-di(1-methoxyethoxy)bicyclo[2.2.1]hept-2-ene,
5,6-di(1-ethoxyethoxy)bicyclo[2.2.1]hept-2-ene,
5,6-di(1-n-propoxyethoxy)bicyclo[2.2.1]hept-2-ene,
5,6-di(1-n-butoxyethoxy)bicyclo[2.2.1]hept-2-ene,
5,6-di(1-cyclohexyloxyethoxy)bicyclo[2.2.1]hept-2-ene,
5,6-dimethoxycarbonyloxybicyclo[2.2.1]hept-2-ene,
5,6-diethoxycarbonyloxybicyclo[2.2.1]hept-2-ene,
5,6-di-n-propoxycarbonyloxybicyclo[2.2.1]hept-2-ene,
5,6-di-n-butoxycarbonyloxybicyclo[2.2.1]hept-2-ene,
5,6-di[(1-methoxyethoxy)methyl]bicyclo[2.2.1]hept-2-ene,
5,6-di[(1-ethoxyethoxy)methyl]bicyclo[2.2.1]hept-2-ene,
5,6-di[(1-n-propoxyethoxy)methyl]bicyclo[2.2.1]hept-2-ene,
5,6-di[(1-n-butoxyethoxy)methyl]bicyclo[2.2.1]hept-2-ene,
5,6-di[(1-cyclohexyloxyethoxy)methyl]bicyclo[2.2.1]hept-2-ene,
5,6-di(methoxycarbonyloxymethyl)bicyclo[2.2.1]hept-2-ene,
5,6-di(ethoxycarbonyloxymethyl)bicyclo[2.2.1]hept-2-ene,
5,6-di(n-propoxycarbonyloxymethyl)bicyclo[2.2.1]hept-2-ene,
5,6-di(n-butoxycarbonyloxymethyl)bicyclo[2.2.1]hept-2-ene,
5,6-di(tetrahydrofuranyloxy)bicyclo[2.2.1]hept-2-ene,
5,6-di(tetrahydropyranyloxy)bicyclo[2.2.1]hept-2-ene,
5,6-di(tetrahydrofuranyloxymethyl)bicyclo[2.2.1]hept-2-ene,
5,6-di(tetrahydropyranyloxymethyl)bicyclo[2.2.1]hept-2-ene,
5-hydroxy-5-methylbicyclo[2.2.1]hept-2-ene,
5-hydroxy-5-ethylbicyclo[2.2.1]hept-2-ene,
5-carboxy-5-methylbicyclo[2.2.1]hept-2-ene,
5-carboxy-5-ethylbicyclo[2.2.1]hept-2-ene,
5-Hydroxymethyl-5-methylbicyclo[2.2.1]hept-2-ene,
5-Hydroxymethyl-5-ethylbicyclo[2.2.1]hept-2-ene,
5-(2-hydroxyethyl)-5-methylbicyclo[2.2.1]hept-2-ene,
5-(2-hydroxyethyl)-5-ethylbicyclo[2.2.1]hept-2-ene,
5-methoxy-5-methylbicyclo[2.2.1]hept-2-ene,
5-methoxy-5-ethylbicyclo[2.2.1]hept-2-ene,
5-ethoxy-5-methylbicyclo[2.2.1]hept-2-ene,
5-ethoxy-5-ethylbicyclo[2.2.1]hept-2-ene,
5-(1-methoxyethoxy)-5-methylbicyclo[2.2.1]hept-2-ene,
5-(1-ethoxyethoxy)-5-methylbicyclo[2.2.1]hept-2-ene,
5-(1-n-propoxyethoxy)-5-methylbicyclo[2.2.1]hept-2-ene,
5-(1-n-butoxyethoxy)-5-methylbicyclo[2.2.1]hept-2-ene,
5-(1-cyclohexyloxyethoxy)-5-methylbicyclo[2.2.1]hept-2-ene,
5-methoxycarbonyloxy-5-methylbicyclo[2.2.1]hept-2-ene,
5-ethoxycarbonyloxy-5-methylbicyclo[2.2.1]hept-2-ene,
5-n-propoxycarbonyloxy-5-methylbicyclo[2.2.1]hept-2-ene,
5-n-butoxycarbonyloxy-5-methylbicyclo[2.2.1]hept-2-ene,
5-(1-methoxyethoxy)methyl-5-methylbicyclo[2.2.1]hept-2-ene,
5-(1-ethoxyethoxy)methyl-5-methylbicyclo[2.2.1]hept-2-ene,
5-(1-n-propoxyethoxy)methyl-5-methylbicyclo[2.2.1]hept-2-ene,
5-(1-n-butoxyethoxy)methyl-5-methylbicyclo[2.2.1]hept-2-ene,
5-(1-cyclohexyloxyethoxy)methyl-5-methylbicyclo[2.2.1]
hept-2-ene,
5-methoxycarbonyloxymethyl-5-methylbicyclo[2.2.1]hept-2-ene,
5-ethoxycarbonyloxymethyl-5-methylbicyclo[2.2.1]hept-2-ene,
5-n-propoxycarbonyloxymethyl-5-methylbicyclo[2.2.1]
hept-2-ene, 5-n-butoxycarbonyloxymethyl-5-methylbicyclo[2.2.1]hept-2-ene,
5-tetrahydrofuranyloxy-5-methylbicyclo[2.2.1]hept-2-ene,
5-tetrahydropyranyloxy-5-methylbicyclo[2.2.1]hept-2-ene,
5-tetrahydrofuranyloxymethyl-5-methylbicyclo[2.2.1]hept-2-ene,
5-tetrahydropyranyloxymethyl-5-methylbicyclo[2.2.1]hept-2-ene,
5-hydroxy-6-methylbicyclo[2.2.1]hept-2-ene,
5-hydroxy-6-ethylbicyclo[2.2.1]hept-2-ene,
5-carboxy-6-methylbicyclo[2.2.1]hept-2-ene,
5-carboxy-6-ethylbicyclo[2.2.1]hept-2-ene,
5-hydroxymethyl-6-methylbicyclo[2.2.1]hept-2-ene,
5-hydroxymethyl-6-ethylbicyclo[2.2.1]hept-2-ene,
5-(2-hydroxyethyl)-6-methylbicyclo[2.2.1]hept-2-ene,
5-(2-hydroxyethyl)-6-ethylbicyclo[2.2.1]hept-2-ene,
5-methoxy-6-methylbicyclo[2.2.1]hept-2-ene,
5-methoxy-6-ethylbicyclo[2.2.1]hept-2-ene,
5-ethoxy-6-methylbicyclo[2.2.1]hept-2-ene,
5-ethoxy-6-ethylbicyclo[2.2.1]hept-2-ene,
5-cyanobicyclo[2.2.1]hept-2-ene,
5-cyanomethylbicyclo[2.2.1]hept-2-ene,
5-(2-cyanoethyl)bicyclo[2.2.1]hept-2-ene,
5,6-dicyanobicyclo[2.2.1]hept-2-ene,
5,6-di(cyanomethyl)bicyclo[2.2.1]hept-2-ene,
5,6-di(2-cyanoethyl)bicyclo[2.2.1]hept-2-ene,
5-cyano-5-methylbicyclo[2.2.1]hept-2-ene,
5-cyano-5-ethylbicyclo[2.2.1]hept-2-ene,
5-cyanomethyl-5-methylbicyclo[2.2.1]hept-2-ene,
5-cyanomethyl-5-ethylbicyclo[2.2.1]hept-2-ene,
5-(2-cyanoethyl)-5-methylbicyclo[2.2.1]hept-2-ene,
5-(2-cyanoethyl)-5-ethylbicyclo[2.2.1]hept-2-ene,
5-cyano-6-methylbicyclo[2.2.1]hept-2-ene,
5-cyano-6-ethylbicyclo[2.2.1]hept-2-ene,
5-cyanomethyl-6-methylbicyclo[2.2.1]hept-2-ene,
5-cyanomethyl-6-ethylbicyclo[2.2.1]hept-2-ene,
5-(2-cyanoethyl)-6-methylbicyclo[2.2.1]hept-2-ene,
5-(2-cyanoethyl)-6-ethylbicyclo[2.2.1]hept-2-ene,
5,6-dicarboxybicyclo[2.2.1]hept-2-ene anhydride(hymic acid anhydride),
5-(2,2,2-trifluoro-1-hydroxyethyl)bicyclo[2.2.1]hept-2-ene,
5-(2,2,2-trifluoro-1-methyl-1-hydroxyethyl)bicyclo[2.2.1]hept-2-ene,
5-(2,2,2-trifluoro-1-trifluoromethyl-1-hydroxyethyl)-bicyclo[2.2.1]hept-2-ene,
5-(2,2,2-trifluoro-1-methoxyethyl)bicyclo[2.2.1]hept-2-ene,
5-(2,2,2-trifluoro-1-methyl-1-methoxyethyl)bicyclo[2.2.1]hept-2-ene,
5-(2,2,2-trifluoro-1-trifluoromethyl-1-methoxyethyl)bicyclo[2.2.1]hept-2-ene,
5-(2,2,2-trifluoro-1-methylcarbonyloxyethyl)bicyclo[2.2.1]hept-2-ene,
5-(2,2,2-trifluoro-1-methyl-1-methylcarbonyloxyethyl)bicyclo[2.2.1]hept-2-ene,
5-(2,2,2-trifluoro-1-trifluoromethyl-1-methylcarbonyloxyethyl)bicyclo[2.2.1]hept-2-ene,
5-(2,2,2-trifluoro-1-t-butoxycarbonyloxyethyl)bicyclo[2.2.1]hept-2-ene,
5-(2,2,2-trifluoro-1-methyl-1-t-butoxycarbonyloxyethyl)bicyclo[2.2.1]hept-2-ene,
5-(2,2,2-trifluoro-1-trifluoromethyl-1-t-butoxycarbonyloxyethyl)bicyclo[2.2.1]hept-2-ene,
5-(2-trifluoromethyl-2-hydroxyethyl)bicyclo[2.2.1]hept-2-ene,
5-(2-trifluoromethyl-2-methyl-2-hydroxyethyl)bicyclo[2.2.1]hept-2-ene,
5-[2,2-bis(trifluoromethyl)-2-hydroxyethyl]bicyclo[2.2.1]-hept-2-ene,
5-(2-trifluoromethyl-2-methoxyethyl)bicyclo[2.2.1]hept2-ene,
5-(2-trifluoromethyl-2-methyl-2-methoxyethyl)bicyclo[2.2.1]hept-2-ene,
5-[2,2-bis(trifluoromethyl)-2-methoxyethyl]bicyclo[2.2.1]hept-2-ene,
5-[2-trifluoromethyl-2-methylcarbonyloxyethyl]bicyclo[2.2.1]hept-2-ene,
5-(2-trifluoromethyl-2-methyl-2-methylcarbonyloxyethyl)-bicyclo[2.2.1]hept2-ene,
5-[2,2-bis(trifluoromethyl)-2-methylcarbonyloxyethyl]bicyclo[2.2.1]hept2-ene,
5-[2-trifluoromethyl-2-t-butoxycarbonyloxyethyl]bicyclo[2.2.1]hept2-ene,
5-(2-trifluoromethyl-2-methyl-2-t-butoxycarbonyloxyethyl)bicyclo[2.2.1]hept2-ene,
5-[2,2-bis(trifluoromethyl)-2-t-butoxycarbonyloxyethyl]bicyclo[2.2.1]hept-2-ene and the like;
tetracyclo[4.4.0.1$^{2,5}$.1$^{7,10}$]dodec-3-ene derivatives having an acid-dissociating group which dissociates in the presence of an acid and forms a carboxyl group in the resin such as
8-methoxycarbonyltetracyclo[4.4.0.1$^{2,5}$.1$^{7,10}$]dodec-3-ene,
8-ethoxycarbonyltetracyclo[4.4.0.1$^{2,5}$.1$^{7,10}$]dodec-3-ene,
8-n-propoxycarbonyltetracyclo[4.4.0.1$^{2,5}$.1$^{7,10}$]dodec-3-ene,
8-i-propoxycarbonyltetracyclo[4.4.0.1$^{2,5}$.1$^{7,10}$]dodec-3-ene,
8-n-butoxycarbonyltetracyclo[4.4.0.1$^{2,5}$.1$^{7,10}$]dodec-3-ene,
8-(2-methylpropoxy)carbonyltetracyclo[4.4.0.1$^{2,5}$.1$^{7,10}$]dodec-3-ene,
8-(1-methylpropoxy)carbonyltetracyclo[4.4.0.1$^{2,5}$.1$^{7,10}$]dodec-3-ene,
8-cyclohexyloxycarbonyltetracyclo[4.4.0.1$^{2,5}$.1$^{7,10}$]dodec-3-ene, 8-(4-t-butylcyclohexyloxy)carbonyltetracyclo[4.4.0.1$^{2,5}$.1$^{7,10}$]dodec-3-ene,
8-phenoxycarbonyltetracyclo[4.4.0.1$^{2,5}$.1$^{7,10}$]dodec-3-ene,
8-(1-ethoxyethoxy)carbonyltetracyclo[4.4.0.1$^{2,5}$.1$^{7,10}$]dodec-3-ene,
8-(1-cyclohexyloxyethoxy)carbonyltetracyclo[4.4.0.1$^{2,5}$.1$^{7,10}$]dodec-3-ene,
8-t-butoxycarbonylmethoxycarbonyltetracyclo[4.4.0.1$^{2,5}$.1$^{7,10}$]dodec-3-ene,
8-tetrahydrofuranyloxycarbonyltetracyclo[4.4.0.1$^{2,5}$.1$^{7,10}$]dodec-3-ene,
8-tetrahydropyranyloxycarbonyltetracyclo[4.4.0.1$^{2,5}$.1$^{7,10}$]dodec-3-ene,
8-methyl-8-methoxycarbonyltetracyclo[4.4.0.1$^{2,5}$.1$^{7,10}$]dodec-3-ene,
8-methyl-8-ethoxycarbonyltetracyclo[4.4.0.1$^{2,5}$.1$^{7,10}$]dodec-3-ene,
8-methyl-8-n-propoxycarbonyltetracyclo[4.4.0.1$^{2,5}$.1$^{7,10}$]dodec-3-ene,
8-methyl-8-i-propoxycarbonyltetracyclo[4.4.0.1$^{2,5}$.1$^{7,10}$]dodec-3-ene,
8-methyl-8-n-butoxycarbonyltetracyclo[4.4.0.1$^{2,5}$.1$^{7,10}$]dodec-3-ene,
8-methyl-8-(2-methylpropoxy)carbonyltetracyclo[4.4.0.1$^{2,5}$.1$^{7,10}$]dodec-3-ene,
8-methyl-8-(1-methylpropoxy)carbonyltetracyclo[4.4.0.1$^{2,5}$.1$^{7,10}$]dodec-3-ene,
8-methyl-8-t-butoxycarbonyltetracyclo[4.4.0.1$^{2,5}$.1$^{7,10}$]dodec-3-ene,
8-methyl-8-cyclohexyloxycarbonyltetracyclo[4.4.0.1$^{2,5}$.1$^{7,10}$]dodec-3-ene, 8-methyl-8-(4-t-butylcyclohexyloxy)carbonyltetracyclo[4.4.0.1$^{2,5}$.1$^{7,10}$]dodec-3-ene,
8-methyl-8-phenoxycarbonyltetracyclo[4.4.0.1$^{2,5}$.1$^{7,10}$]dodec-3-ene,
8-methyl-8-(1-ethoxyethoxy)carbonyltetracyclo[4.4.0.1$^{2,5}$.1$^{7,10}$]dodec-3-ene,
8-methyl-8-(1-cyclohexyloxyethoxy)carbonyltetracyclo[4.4.0.1$^{2,5}$.1$^{7,10}$]dodec-3-ene,
8-methyl-8-t-butoxycarbonylmethoxycarbonyltetracyclo[4.4.0.1$^{2,5}$.1$^{7,10}$]dodec-3-ene,
8-methyl-8-tetrahydrofuranyloxycarbonyltetracyclo[4.4.0.1$^{2,5}$.1$^{7,10}$]dodec-3-ene,
8-methyl-8-tetrahydropyranyloxycarbonyltetracyclo[4.4.0.1$^{2,5}$.1$^{7,10}$]dodec-3-ene.
8,9-di(methoxycarbonyl)tetracyclo[4.4.0.1$^{2,5}$.1$^{7,10}$]dodec-3-ene,
8,9-di(ethoxycarbonyl)tetracyclo[4.4.0.1$^{2,5}$.1$^{7,10}$]dodec-3-ene,
8,9-di(n-propoxycarbonyl)tetracyclo[4.4.0.1$^{2,5}$.1$^{7,10}$]dodec-3-ene,
8,9-di(i-propoxycarbonyl)tetracyclo[4.4.0.1$^{2,5}$.1$^{7,10}$]dodec-3-ene,
8,9-di(n-butoxycarbonyl)tetracyclo[4.4.0.1$^{2,5}$.1$^{7,10}$]dodec-3-ene,
8,9-di(2-methylpropoxycarbonyl)tetracyclo[4.4.0.1$^{2,5}$.1$^{7,10}$]dodec-3-ene,
8,9-di(1-methylpropoxycarbonyl)tetracyclo[4.4.0.1$^{2,5}$.1$^{7,10}$]dodec-3-ene,
8,9-di(t-butoxycarbonyl)tetracyclo[4.4.0.1$^{2,5}$.1$^{7,10}$]dodec-3-ene,
8,9-di(cyclohexyloxycarbonyl)tetracyclo[4.4.0.1$^{2,5}$.1$^{7,10}$]dodec-3-ene,
8,9-di(4-t-butylcyclohexyloxycarbonyl)tetracyclo[4.4.0.1$^{2,5}$.1$^{7,10}$]dodec-3-ene,
8,9-di(phenoxycarbonyl)tetracyclo[4.4.0.1$^{2,5}$.1$^{7,10}$]dodec-3-ene,
8,9-di(1-ethoxyethoxycarbonyl)tetracyclo[4.4.0.1$^{2,5}$.1$^{7,10}$]dodec-3-ene,
8,9-di(1-cyclohexyloxyethoxycarbonyl)tetracyclo[4.4.0.1$^{2,5}$.1$^{7,10}$]dodec-3-ene,
8,9-di(t-butoxycarbonylmethoxycarbonyl)tetracyclo[4.4.0.1$^{2,5}$.1$^{7,10}$]dodec-3-ene,
8,9-di(tetrahydrofuranyloxycarbonyl)tetracyclo[4.4.0.1$^{2,5}$.1$^{7,10}$]dodec-3-ene,
8,9-di(tetrahydropyranyloxycarbonyl)tetracyclo[4.4.0.1$^{2,5}$.1$^{7,10}$]dodec-3-ene;
tetracyclo[4.4.0.1$^{2,5}$.1$^{7,10}$]dodec-3-ene and other tetracyclo[4.4.0.1$^{2,5}$.1$^{7,10}$]dodec-3-ene derivatives such as:
tetracyclo[4.4.0.1$^{2,5}$.1$^{7,10}$]dodec-3-ene,
8-methyltetracyclo[4.4.0.1$^{2,5}$.1$^{7,10}$]dodec-3-ene,
8-ethyltetracyclo[4.4.0.1$^{2,5}$.1$^{7,10}$]dodec-3-ene,
8-n-propyltetracyclo[4.4.0.1$^{2,5}$.1$^{7,10}$]dodec-3-ene,
8-n-butyltetracyclo[4.4.0.1$^{2,5}$.1$^{7,10}$]dodec-3-ene,
8-n-pentyltetracyclo[4.4.0.1$^{2,5}$.1$^{7,10}$]dodec-3-ene,
8-n-hexyltetracyclo[4.4.0.1$^{2,5}$.1$^{7,10}$]dodec-3-ene,
8-fluorotetracyclo[4.4.0.1$^{2,5}$.1$^{7,10}$]dodec-3-ene,
8-fluoromethyltetracyclo[4.4.0.1$^{2,5}$.1$^{7,10}$]dodec-3-ene,
8-difluoromethyltetracyclo[4.4.0.1$^{2,5}$.1$^{7,10}$]dodec-3-ene,
8-trifluoromethyltetracyclo[4.4.0.1$^{2,5}$.1$^{7,10}$]dodec-3-ene,
8-pentafluoroethyltetracyclo[4.4.0.1$^{2,5}$.1$^{7,10}$]dodec-3-ene,
8,8-difluorotetracyclo[4.4.0.1$^{2,5}$.1$^{7,10}$]dodec-3-ene,
8,9-difluorotetracyclo[4.4.0.1$^{2,5}$.1$^{7,10}$]dodec-3-ene,
8,8-bis(trifluoromethyl)tetracyclo[4.4.0.1$^{2,5}$.1$^{7,10}$]dodec-3-ene,
8,9-bis(trifluoromethyl)tetracyclo[4.4.0.1$^{2,5}$.1$^{7,10}$]dodec-3-ene,
8-methyl-8-trifluoromethyltetracyclo[4.4.0.1$^{2,5}$.1$^{7,10}$]dodec-3-ene,
8,8,9-trifluorotetracyclo[4.4.0.1$^{2,5}$.1$^{7,10}$]dodec-3-ene,
8,8,9-tris(trifluoromethyl)tetracyclo[4.4.0.1$^{2,5}$.1$^{7,10}$]dodec-3-ene,
8,8,9,9-tetrafluorotetracyclo[4.4.0.1$^{2,5}$.1$^{7,10}$]dodec-3-ene,
8,8,9,9-tetrakis(trifluoromethyl)tetracyclo[4.4.0.1$^{2,5}$.1$^{7,10}$]dodec-3-ene,
8,8-difluoro-9,9-bis(trifluoromethyl)tetracyclo[4.4.0.1$^{2,5}$.1$^{7,10}$]dodec-3-ene,
8,9-difluoro-8,9-bis(trifluoromethyl)tetracyclo[4.4.0.1$^{2,5}$.1$^{7,10}$]dodec-3-ene,
8,8,9-trifluoro-9-trifluoromethyltetracyclo[4.4.0.1$^{2,5}$.1$^{7,10}$]dodec-3-ene,
8,8,9-trifluoro-9-trifluoromethoxytetracyclo[4.4.0.1$^{2,5}$.1$^{7,10}$]dodec-3-ene,
8,8,9-trifluoro-9-pentafluoro-n-propoxytetracyclo[4.4.0.1$^{2,5}$.1$^{7,10}$]dodec-3-ene,
8-fluoro-8-pentafluoroethyl-9,9-bis(trifluoromethyl)tetracyclo[4.4.0.1$^{2,5}$.1$^{7,10}$]dodec-3-ene,
8,9-difluoro-8-heptafluoro-i-propyl-9-trifluoromethyltetracyclo[4.4.0.1$^{2,5}$.1$^{7,10}$]dodec-3-ene,
8-chloro-8,9,9-trifluorotetracyclo[4.4.0.1$^{2,5}$.1$^{7,10}$]dodec-3-ene,
8,9-dichloro-8,9-bis(trifluoromethyl)tetracyclo[4.4.0.1$^{2,5}$.1$^{7,10}$]dodec-3-ene,
8-(2,2,2-trifluorocarboethoxy)tetracyclo[4.4.0.1$^{2,5}$.1$^{7,10}$]dodec-3-ene,
8-methyl-8-(2,2,2-Trifluorocarboethoxy)tetracyclo[4.4.0.1$^{2,5}$.1$^{7,10}$]dodec-3-ene,
8-hydroxytetracyclo[4.4.0.1$^{2,5}$.1$^{7,10}$]dodec-3-ene,
8-carboxytetracyclo[4.4.0.1$^{2,5}$.1$^{7,10}$]dodec-3-ene,
8-hydroxymethyltetracyclo[4.4.0.1$^{2,5}$.1$^{7,10}$]dodec-3-ene,
8-(2-hydroxyethyl)tetracyclo[4.4.0.1$^{2,5}$.1$^{7,10}$]dodec-3-ene,
8-methoxytetracyclo[4.4.0.1$^{2,5}$.1$^{7,10}$]dodec-3-ene,
8-ethoxytetracyclo[4.4.0.1$^{2,5}$.1$^{7,10}$]dodec-3-ene,
8-(1-methoxyethoxy)tetracyclo[4.4.0.1$^{2,5}$.1$^{7,10}$]dodec-3-ene,
8-(1-ethoxyethoxy)tetracyclo[4.4.0.1$^{2,5}$.1$^{7,10}$]dodec-3-ene,
8-(1-n-propoxyethoxy)tetracyclo[4.4.0.1$^{2,5}$.1$^{7,10}$]dodec-3-ene,
8-(1-n-butoxyethoxy)tetracyclo[4.4.0.1$^{2,5}$.1$^{7,10}$]dodec-3-ene,
8-(cyclohexyloxyethoxy)tetracyclo[4.4.0.1$^{2,5}$.1$^{7,10}$]dodec-3-ene,
8-methoxycarbonyloxytetracyclo[4.4.0.1$^{2,5}$.1$^{7,10}$]dodec-3-ene,
8-ethoxycarbonyloxytetracyclo[4.4.0.1$^{2,5}$.1$^{7,10}$]dodec-3-ene,
8-n-propoxycarbonyloxytetracyclo[4.4.0.1$^{2,5}$.1$^{7,10}$]dodec-3-ene,
8-n-butoxycarbonyloxytetracyclo[4.4.0.1$^{2,5}$.1$^{7,10}$]dodec-3-ene,
8-(1-methoxyethoxy)methyltetracyclo[4.4.0.1$^{2,5}$.1$^{7,10}$]dodec-3-ene,
8-(1-ethoxyethoxy)methyltetracyclo[4.4.0.1$^{2,5}$.1$^{7,10}$]dodec-3-ene,
8-(1-n-propoxyethoxy)methyltetracyclo[4.4.0.1$^{2,5}$.1$^{7,10}$]dodec-3-ene,
8-(1-n-butoxyethoxy)methyltetracyclo[4.4.0.1$^{2,5}$.1$^{7,10}$]dodec-3-ene,
8-(1-cyclohexyloxyethoxy)methyltetracyclo[4.4.0.1$^{2,5}$.1$^{7,10}$]dodec-3-ene,
8-methoxycarbonyloxymethyltetracyclo[4.4.0.1$^{2,5}$.1$^{7,10}$]dodec-3-ene,
8-ethoxycarbonyloxymethyltetracyclo[4.4.0.1$^{2,5}$.1$^{7,10}$]dodec-3-ene, 8-n-propoxycarbonyloxymethyltetracyclo[4.4.0.1$^{2,5}$.1$^{7,10}$]dodec-3-ene,
8-n-butoxycarbonyloxymethyltetracyclo[4.4.0.1$^{2,5}$.1$^{7,10}$]dodec-3-ene,
8-tetrahydrofuranyloxytetracyclo[4.4.0.1$^{2,5}$.1$^{7,10}$]dodec-3-ene,
8-tetrahydropyranyloxytetracyclo[4.4.0.1$^{2,5}$.1$^{7,10}$]dodec-3-ene,
8-tetrahydrofuranyloxymethyltetracyclo[4.4.0.1$^{2,5}$.1$^{7,10}$]dodec-3-ene,
8-tetrahydropyranyloxymethyltetracyclo[4.4.0.1$^{2,5}$.1$^{7,10}$]dodec-3-ene.
8,9-dihydroxytetracyclo[4.4.0.1$^{2,5}$.1$^{7,10}$]dodec-3-ene,
8,9-dicarboxytetracyclo[4.4.0.1$^{2,5}$.1$^{7,10}$]dodec-3-ene,
8,9-di(hydroxymethyl)tetracyclo[4.4.0.1$^{2,5}$.1$^{7,10}$]dodec-3-ene,
8,9-di(2-hydroxyethyl)tetracyclo[4.4.0.1$^{2,5}$.1$^{7,10}$]dodec-3-ene,
8,9-dimethoxytetracyclo[4.4.0.1$^{2,5}$.1$^{7,10}$]dodec-3-ene,
8,9-diethoxytetracyclo[4.4.0.1$^{2,5}$.1$^{7,10}$]dodec-3-ene,
8,9-di(1-methoxyethoxy)tetracyclo[4.4.0.1$^{2,5}$.1$^{7,10}$]dodec-3-ene,
8,9-di(1-ethoxyethoxy)tetracyclo[4.4.0.1$^{2,5}$.1$^{7,10}$]dodec-3-ene,
8,9-di(1-n-propoxyethoxy)tetracyclo[4.4.0.1$^{2,5}$.1$^{7,10}$]dodec-3-ene,
8,9-di(1-n-butoxyethoxy)tetracyclo[4.4.0.1$^{2,5}$.1$^{7,10}$]dodec-3-ene,
8,9-di(1-cyclohexyloxyethoxy)tetracyclo[4.4.0.1$^{2,5}$.1$^{7,10}$]dodec-3-ene,
8,9-dimethoxycarbonyloxytetracyclo[4.4.0.1$^{2,5}$.1$^{7,10}$]dodec-3-ene,
8,9-diethoxycarbonyloxytetracyclo[4.4.0.1$^{2,5}$.1$^{7,10}$]dodec-3-ene,
8,9-di-n-propoxycarbonyloxytetracyclo[4.4.0.1$^{2,5}$.1$^{7,10}$]dodec-3-ene,
8,9-di-n-butoxycarbonyloxytetracyclo[4.4.0.1$^{2,5}$.1$^{7,10}$]dodec-3-ene,
8,9-di[(1-methoxyethoxy)methyl]tetracyclo[4.4.0.1$^{2,5}$.1$^{7,10}$]dodec-3-ene,
8,9-di[(1-ethoxyethoxy)methyl]tetracyclo[4.4.0.1$^{2,5}$.1$^{7,10}$]dodec-3-ene,
8,9-di[(1-n-propoxyethoxy)methyl]tetracyclo[4.4.0.1$^{2,5}$.1$^{7,10}$]dodec-3-ene,
8,9-di[(1-n-butoxyethoxy)methyl]tetracyclo[4.4.0.1$^{2,5}$.1$^{7,10}$]dodec-3-ene,
8,9-di[(1-cyclohexyloxyethoxy)methyl]tetracyclo[4.4.0.1$^{2,5}$.1$^{7,10}$]dodec-3-ene,
8,9-di(methoxycarbonyloxymethyl)tetracyclo[4.4.0.1$^{2,5}$.1$^{7,10}$]dodec-3-ene,
8,9-di(ethoxycarbonyloxymethyl)tetracyclo[4.4.0.1$^{2,5}$.1$^{7,10}$]dodec-3-ene, 8,9-di(n-propoxycarbonyloxymethyl)tetracyclo[4.4.0.1$^{2,5}$.1$^{7,10}$]dodec-3-ene,
8,9-di(n-butoxycarbonyloxymethyl)tetracyclo[4.4.0.1$^{2,5}$.1$^{7,10}$]dodec-3-ene,
8,9-di(tetrahydrofuranyloxy)tetracyclo[4.4.0.1$^{2,5}$.1$^{7,10}$]dodec-3-ene,
8,9-di(tetrahydropyranyloxy)tetracyclo[4.4.0.1$^{2,5}$.1$^{7,10}$]dodec-3-ene,
8,9-di(tetrahydrofuranyloxymethyl)tetracyclo[4.4.0.1$^{2,5}$.1$^{7,10}$]dodec-3-ene,
8,9-di(tetrahydropyranyloxymethyl)tetracyclo[4.4.0.1$^{2,5}$.1$^{7,10}$]dodec-3-ene,
8-hydroxy-8-methyltetracyclo[4.4.0.1$^{2,5}$.1$^{7,10}$]dodec-3-ene,
8-hydroxy-8-ethyltetracyclo[4.4.0.1$^{2,5}$.1$^{7,10}$]dodec-3-ene,
8-carboxy-8-methyltetracyclo[4.4.0.1$^{2,5}$.1$^{7,10}$]dodec-3-ene,
8-carboxy-8-ethyltetracyclo[4.4.0.1$^{2,5}$.1$^{7,10}$]dodec-3-ene,
8-hydroxymethyl-8-methyltetracyclo[4.4.0.1$^{2,5}$.1$^{7,10}$]dodec-3-ene,
8-hydroxymethyl-8-ethyltetracyclo[4.4.0.1$^{2,5}$.1$^{7,10}$]dodec-3-ene,
8-(2-hydroxyethyl)-8-methyltetracyclo[4.4.0.1$^{2,5}$.1$^{7,10}$]dodec-3-ene,
8-(2-hydroxyethyl)-8-ethyltetracyclo[4.4.0.1$^{2,5}$.1$^{7,10}$]dodec-3-ene,
8-methoxy-8-methyltetracyclo[4.4.0.1$^{2,5}$.1$^{7,10}$]dodec-3-ene,
8-methoxy-8-ethyltetracyclo[4.4.0.1$^{2,5}$.1$^{7,10}$]dodec-3-ene,
8-ethoxy-8-methyltetracyclo[4.4.0.1$^{2,5}$.1$^{7,10}$]dodec-3-ene,
8-ethoxy-8-ethyltetracyclo[4.4.0.1$^{2,5}$.1$^{7,10}$]dodec-3-ene,
8-(1-methoxyethoxy)-8-methyltetracyclo[4.4.0.1$^{2,5}$.1$^{7,10}$]dodec-3-ene,
8-(1-ethoxyethoxy)-8-methyltetracyclo[4.4.0.1$^{2,5}$.1$^{7,10}$]dodec-3-ene,
8-(1-n-propoxyethoxy)-8-methyltetracyclo[4.4.0.1$^{2,5}$.1$^{7,10}$]dodec-3-ene,
8-(1-n-butoxyethoxy)-8-methyltetracyclo[4.4.0.1$^{2,5}$.1$^{7,10}$]dodec-3-ene, 8-(1-cyclohexyloxyethoxy)-8-methyltetracyclo[4.4.0.1$^{2,5}$.1$^{7,10}$]dodec-3-ene,
8-methoxycarbonyloxy-8-methyltetracyclo[4.4.0.1$^{2,5}$.1$^{7,10}$]dodec-3-ene,
8-ethoxycarbonyloxy-8-methyltetracyclo[4.4.0.1$^{2,5}$.1$^{7,10}$]dodec-3-ene,
8-n-propoxycarbonyloxy-8-methyltetracyclo[4.4.0.1$^{2,5}$.1$^{7,10}$]dodec-3-ene,
8-n-butoxycarbonyloxy-8-methyltetracyclo[4.4.0.1$^{2,5}$.1$^{7,10}$]dodec-3-ene.
8-(1-methoxyethoxy)methyl-8-methyltetracyclo[4.4.0.1$^{2,5}$.1$^{7,10}$]dodec-3-ene,
8-(1-ethoxyethoxy)methyl-8-methyltetracyclo[4.4.0.1$^{2,5}$.1$^{7,10}$]dodec-3-ene,
8-(1-n-propoxyethoxy)methyl-8-methyltetracyclo[4.4.0.1$^{2,5}$.1$^{7,10}$]dodec-3-ene,
8-(1-n-butoxyethoxy)methyl-8-methyltetracyclo[4.4.0.1$^{2,5}$.1$^{7,10}$]dodec-3-ene,
8-(1-cyclohexyloxyethoxy)methyl-8-methyltetracyclo[4.4.0.1$^{2,5}$.1$^{7,10}$]dodec-3-ene,
8-methoxycarbonyloxymethyl-8-methyltetracyclo[4.4.0.1$^{2,5}$.1$^{7,10}$]dodec-3-ene,
8-ethoxycarbonyloxymethyl-8-methyltetracyclo[4.4.0.1$^{2,5}$.1$^{7,10}$]dodec-3-ene,
8-n-propoxycarbonyloxymethyl-8-methyltetracyclo[4.4.0.1$^{2,5}$.1$^{7,10}$]dodec-3-ene,
8-n-butoxycarbonyloxymethyl-8-methyltetracyclo[4.4.0.1$^{2,5}$.1$^{7,10}$]dodec-3-ene,
8-tetrahydrofuranyloxy-8-methyltetracyclo[4.4.0.1$^{2,5}$.1$^{7,10}$]dodec-3-ene,
8-tetrahydropyranyloxy-8-methyltetracyclo[4.4.0.1$^{2,5}$.1$^{7,10}$]dodec-3-ene,
8-tetrahydrofuranyloxymethyl-8-methyltetracyclo[4.4.0.1$^{2,5}$.1$^{7,10}$]dodec-3-ene,
8-tetrahydropyranyloxymethyl-8-methyltetracyclo[4.4.0.1$^{2,5}$.1$^{7,10}$]dodec-3-ene,
8-hydroxy-9-methyltetracyclo[4.4.0.1$^{2,5}$.1$^{7,10}$]dodec-3-ene,
8-hydroxy-9-ethyltetracyclo[4.4.0.1$^{2,5}$.1$^{7,10}$]dodec-3-ene,
8-carboxyl-9-methyltetracyclo[4.4.0.1$^{2,5}$.1$^{7,10}$]dodec-3-ene,
8-carboxyl-9-ethyltetracyclo[4.4.0.1$^{2,5}$.1$^{7,10}$]dodec-3-ene,
8-hydroxymethyl-9-methyltetracyclo[4.4.0.1$^{2,5}$.1$^{7,10}$]dodec-3-ene,
8-hydroxymethyl-9-ethyltetracyclo[4.4.0.1$^{2,5}$.1$^{7,10}$]dodec-3-ene,
8-(2-hydroxyethyl)-9-methyltetracyclo[4.4.0.1$^{2,5}$.1$^{7,10}$]dodec-3-ene,
8-(2-hydroxyethyl)-9-ethyltetracyclo[4.4.0.1$^{2,5}$.1$^{7,10}$]dodec-3-ene, 8-methoxy-9-methyltetracyclo[4.4.0.1$^{2,5}$.1$^{7,10}$]dodec-3-ene,
8-methoxy-9-ethyltetracyclo[4.4.0.1$^{2,5}$.1$^{7,10}$]dodec-3-ene,
8-ethoxy-9-methyltetracyclo[4.4.0.1$^{2,5}$.1$^{7,10}$]dodec-3-ene,
8-ethoxy-9-ethyltetracyclo[4.4.0.1$^{2,5}$.1$^{7,10}$]dodec-3-ene,
8-cyanotetracyclo[4.4.0.1$^{2,5}$.1$^{7,10}$]dodec-3-ene,
8-cyanomethyltetracyclo[4.4.0.1$^{2,5}$.1$^{7,10}$]dodec-3-ene,
8-(2-cyanoethyl)tetracyclo[4.4.0.1$^{2,5}$.1$^{7,10}$]dodec-3-ene,
8,9-dicyanotetracyclo[4.4.0.1$^{2,5}$.1$^{7,10}$]dodec-3-ene,
8,9-di(cyanomethyl)tetracyclo[4.4.0.1$^{2,5}$.1$^{7,10}$]dodec-3-ene,
8,9-di(2-cyanoethyl)tetracyclo[4.4.0.1$^{2,5}$.1$^{7,10}$]dodec-3-ene,
8-cyano-8-methyltetracyclo[4.4.0.1$^{2,5}$.1$^{7,10}$]dodec-3-ene,
8-cyano-8-ethyltetracyclo[4.4.0.1$^{2,5}$.1$^{7,10}$]dodec-3-ene,
8-cyanomethyl-8-methyltetracyclo[4.4.0.1$^{2,5}$.1$^{7,10}$]dodec-3-ene,
8-cyanomethyl-8-ethyltetracyclo[4.4.0.1$^{2,5}$.1$^{7,10}$]dodec-3-ene,
8-(2-cyanoethyl)-8-methyltetracyclo[4.4.0.1$^{2,5}$.1$^{7,10}$]dodec-3-ene,
8-(2-cyanoethyl)-8-ethyltetracyclo[4.4.0.1$^{2,5}$.1$^{7,10}$]dodec-3-ene,
8-cyano-9-methyltetracyclo[4.4.0.1$^{2,5}$.1$^{7,10}$]dodec-3-ene,
8-cyano-9-ethyltetracyclo[4.4.0.1$^{2,5}$.1$^{7,10}$]dodec-3-ene,
8-cyanomethyl-9-methyltetracyclo[4.4.0.1$^{2,5}$.1$^{7,10}$]dodec-3-ene,
8-cyanomethyl-9-ethyltetracyclo[4.4.0.1$^{2,5}$.1$^{7,10}$]dodec-3-ene,
8-(2-cyanoethyl)-9-methyltetracyclo[4.4.0.1$^{2,5}$.1$^{7,10}$]dodec-3-ene,
8-(2-cyanoethyl)-9-ethyltetracyclo[4.4.0.1$^{2,5}$.1$^{7,10}$]dodec-3-ene,
8,9-dicarboxytetracyclo[4.4.0.1$^{2,5}$.1$^{7,10}$]dodec-3-ene anhydride,
8-(2,2,2-trifluoro-1-hydroxyethyl)tetracyclo[4.4.0.1$^{2,5}$.1$^{7,10}$]dodec-3-ene,
8-(2,2,2-trifluoro-1-methyl-1-hydroxyethyl)tetracyclo[4.4.0.1$^{2,5}$.1$^{7,10}$]dodec-3-ene,
8-(2,2,2-trifluoro-1-trifluoromethyl-1-hydroxyethyl)tetracyclo[4.4.0.1$^{2,5}$.1$^{7,10}$]dodec-3-ene,
8-(2,2,2-trifluoro-1-methoxyethyl)tetracyclo[4.4.0.1$^{2,5}$.1$^{7,10}$]dodec-3-ene,
8-(2,2,2-trifluoro-1-methyl-1-methoxyethyl)tetracyclo[4.4.0.1$^{2,5}$.1$^{7,10}$]dodec-3-ene,
8-(2,2,2-trifluoro-1-trifluoromethyl-1-methoxyethyl)tetracyclo[4.4.0.1$^{2,5}$.1$^{7,10}$]dodec-3-ene,
8-(2,2,2-trifluoro-1-methylcarbonyloxyethyl)tetracyclo[4.4.0.1$^{2,5}$.1$^{7,10}$]dodec-3-ene,
8-(2,2,2-trifluoro-1-methyl-1-methylcarbonyloxyethyl)tetracyclo[4.4.0.1$^{2,5}$.1$^{7,10}$]dodec-3-ene,
8-(2,2,2-trifluoro-1-trifluoromethyl-1-methylcarbonyloxyethyl)tetracyclo[4.4.0.1$^{2,5}$.1$^{7,10}$]dodec-3-ene,
8-(2,2,2-trifluoro-1-t-butoxycarbonyloxyethyl)tetracyclo[4.4.0.1$^{2,5}$.1$^{7,10}$]dodec-3-ene,
8-(2,2,2-trifluoro-1-methyl-1-t-butoxycarbonyloxyethyl)tetracyclo[4.4.0.1$^{2,5}$.1$^{7,10}$]dodec-3-ene,
8-(2,2,2-trifluoro-1-trifluoromethyl-1-t-butoxycarbonyloxyethyl)tetracyclo[4.4.0 1$^{2,5}$.1$^{7,10}$]dodec-3-ene.
8-(2-trifluoromethyl-2-hydroxyethyl)tetracyclo[4.4.0.1$^{2,5}$.1$^{7,10}$]dodec-3-ene,
8-(2-trifluoromethyl-2-methyl-2-hydroxyethyl)tetracyclo[4.4.0.1$^{2,5}$.1$^{7,10}$]dodec-3-ene,
8-[2,2-bis(trifluoromethyl)-2-hydroxyethyl]tetracyclo[4.4.0.1$^{2,5}$.1$^{7,10}$]dodec-3-ene,
8-(2-trifluoromethyl-2-methoxyethyl)tetracyclo[4.4.0.1$^{2,5}$.1$^{7,10}$]dodec-3-ene,
8-(2-trifluoromethyl-2-methyl-2-methoxyethyl)tetracyclo[4.4.0.1$^{2,5}$.1$^{7,10}$]dodec-3-ene,
8-[2,2-bis(trifluoromethyl)-2-methoxyethyl]tetracyclo[4.4.0.1$^{2,5}$.1$^{7,10}$]dodec-3-ene,
8-[2-trifluoromethyl-2-methylcarbonyloxyethyl]tetracyclo[4.4.0.1$^{2,5}$.1$^{7,10}$]dodec-3-ene,
8-(2-trifluoromethyl-2-methyl-2-methylcarbonyloxyethyl)tetracyclo[4.4.0.1$^{2,5}$.1$^{7,10}$]dodec-3-ene,
8-[2,2-bis(trifluoromethyl)-2-methylcarbonyloxyethyl]tetracyclo[4.4.0.1$^{2,5}$.1$^{7,10}$]dodec-3-ene,
8-[2-trifluoromethyl-2-t-butoxycarbonyloxyethyl]tetracyclo[4.4.0.1$^{2,5}$.1$^{7,10}$]dodec-3-ene,
8-(2-trifluoromethyl-2-methyl-2-t-butoxycarbonyloxyethyl)tetracyclo[4.4.0.1$^{2,5}$.1$^{7,10}$]dodec-3-ene,
8-[2,2-bis(trifluoromethyl)-2-t-butoxycarbonyloxyethyl]tetracyclo[4.4.0.1$^{2,5}$.1$^{7,10}$]dodec-3-ene;
dicyclopentadiene, tricyclo[5.2.1.0$^{2,6}$]dec-8-ene, tricyclo[5.2.1.0$^{2,6}$]dec-3-ene,
Tricyclo[4.4.0.1$^{2,5}$]undec-3-ene,
tricyclo[6.2.1.0$^{1,8}$]undec-9-ene,
Tricyclo[6.2.1.0$^{1,8}$]undec-4-ene,
tetracyclo[4.4.0.1$^{2,5}$.1$^{7,10}$.0$^{1,6}$]dodec-3-ene,
8-methyltetracyclo[4.4.0.1$^{2,5}$.1$^{7,10}$.0$^{1,6}$]dodec-3-ene,
8-ethylidenetetracyclo[4.4.0.1$^{2,5}$.1$^{7,12}$]dodec-3-ene,
8-ethylidenetetracyclo[4.4.0.1$^{2,5}$.1$^{7,10}$.0$^{1,6}$]dodec-3-ene,
pentacyclo[6.5.1.1$^{3,6}$.0$^{2,7}$.0$^{9,13}$]pentadec-4-ene,
pentacyclo[7.4.0.1$^{2,5}$.0$^{9,12}$.0$^{8,13}$]pentadec-3-ene, (meth)acrylates such as (meth)acrylic acid esters such as methyl (meth)acrylate, ethyl (meth)acrylate, n-propyl (meth)acrylate, n-butyl (meth)acrylate, 2-methylpropyl (meth)acrylate, 2-hydroxyethyl (meth)acrylate, 2-hydroxypropyl (meth)acrylate, 3-hydroxypropyl (meth)acrylate, and compounds shown by the following formula (9),

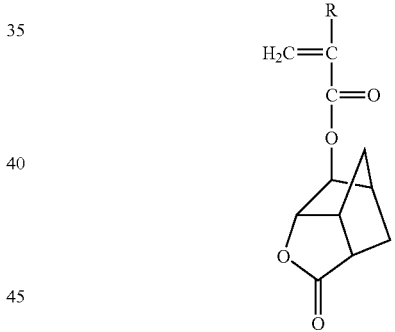

wherein R represents a hydrogen atom or methyl group; α-hydroxymethylacrylic acid esters such as methyl α-hydroxymethyl acrylate, ethyl α-hydroxymethyl acrylate, n-propyl α-hydroxymethyl acrylate, and n-butyl α-hydroxymethyl acrylate; vinyl esters such as vinyl acetate, vinyl propionate, and vinyl butyrate; unsaturated nitrile compounds such as (meth)acrylonitrile, α-chloroacrylonitrile, crotonitrile, maleinitrile, fumaronitrile, mesaconitrile, citraconitrile, and itaconitrile; other unsaturated amide compounds such as crotonamide, maleinamide, fumaramide, mesaconamide, citraconamide, and itaconamide; other nitrogen-containing vinyl compounds such as N-vinyl-ε-caprolactam, N-vinylpyrrolidone, 2-vinylpyridine, 3-vinylpyridine, 4-vinylpyridine, and N-vinylimidazole; unsaturated carboxylic acids (anhydrides) such as (meth)acrylic acid, crotonic acid, maleic acid, maleic anhydride, fumaric acid, itaconic acid, itaconic anhydride, citraconic acid, citraconic anhydride, and mesaconic acid; carboxyl group-containing esters of unsaturated carboxylic acids such as 2-carboxyethyl (meth)acrylate, 2-carboxypropyl (meth)acrylate, 3-carboxypropyl (meth)acrylate, 4-carboxybutyl (meth)acrylate; (meth)acryloyloxylactone compounds such as:

α-(meth)acryloyloxy-β-methoxycarbonyl-γ-butyrolactone,
α-(meth)acryloyloxy-β-ethoxycarbonyl-γ-butyrolactone,
α-(meth)acryloyloxy-β-n-propoxycarbonyl-γ-butyrolactone,
α-(meth)acryloyloxy-β-i-propoxycarbonyl-γ-butyrolactone,
α-(meth)acryloyloxy-β-n-butoxycarbonyl-γ-butyrolactone,
α-(meth)acryloyloxy-β-(2-methylpropoxy)carbonyl-γ-butyrolactone,
α-(meth)acryloyloxy-β-(1-methylpropoxy)carbonyl-γ-butyrolactone,
α-(meth)acryloyloxy-β-t-butoxycarbonyl-γ-butyrolactone,
α-(meth)acryloyloxy-β-cyclohexyloxycarbonyl-γ-butyrolactone,
α-(meth)acryloyloxy-β-(4-t-butylcyclohexyloxy)carbonyl-γ-butyrolactone,
α-(meth)acryloyloxy-β-phenoxycarbonyl-γ-butyrolactone,
α-(meth)acryloyloxy-β-(1-ethoxyethoxy)carbonyl-γ-butyrolactone,
α-(meth)acryloyloxy-β-(1-cyclohexyloxyethoxy)carbonyl-γ-butyrolactone,
α-(meth)acryloyloxy-β-t-butoxycarbonylmethoxycarbonyl-γ-butyrolactone,
α-(meth)acryloyloxy-β-tetrahydrofuranyloxycarbonyl-γ-butyrolactone,
α-(meth)acryloyloxy-β-tetrahydropyranyloxycarbonyl-γ-butyrolactone.
α-methoxycarbonyl-β-(meth)acryloyloxy-γ-butyrolactone,
α-ethoxycarbonyl-β-(meth)acryloyloxy-γ-butyrolactone,
α-n-propoxycarbonyl-β-(meth)acryloyloxy-γ-butyrolactone,
α-i-propoxycarbonyl-β-(meth)acryloyloxy-γ-butyrolactone,
α-n-butoxycarbonyl-β-(meth)acryloyloxy-γ-butyrolactone,
α-(2-methylpropoxy)carbonyl-β-(meth)acryloyloxy-γ-butyrolactone,
α-(1-methylpropoxy)carbonyl-β-(meth)acryloyloxy-γ-butyrolactone,
α-t-butoxycarbonyl-β-(meth)acryloyloxy-γ-butyrolactone,
α-cyclohexyloxycarbonyl-β-(meth)acryloyloxy-γ-butyrolactone,
α-(4-t-butylcyclohexyloxy)carbonyl-β-(meth)acryloyloxy-γ-butyrolactone,
α-phenoxycarbonyl-β-(meth)acryloyloxy-γ-butyrolactone,
α-(1-ethoxyethoxy)carbonyl-β-(meth)acryloyloxy-γ-butyrolactone,
α-(1-cyclohexyloxyethoxy)carbonyl-β-(meth)acryloyloxy-γ-butyrolactone,
α-t-butoxycarbonylmethoxycarbonyl-β-(meth)acryloyloxy-γ-butyrolactone,
α-tetrahydrofuranyloxycarbonyl-β-(meth)acryloyloxy-γ-butyrolactone,
α-tetrahydropyranyloxycarbonyl-β-(meth)acryloyloxy-γ-butyrolactone.
α-(meth)acryloyloxy-γ-butyrolactone,
α-(meth)acryloyloxy-β-fluoro-γ-butyrolactone,
α-(meth)acryloyloxy-β-hydroxy-γ-butyrolactone,
α-(meth)acryloyloxy-β-methyl-γ-butyrolactone,
α-(meth)acryloyloxy-β-ethyl-γ-butyrolactone,
α-(meth)acryloyloxy-β,β-dimethyl-γ-butyrolactone,
α-(meth)acryloyloxy-β-methoxy-γ-butyrolactone.
β-(meth)acryloyloxy-γ-butyrolactone,
α-fluoro-β-(meth)acryloyloxy-γ-butyrolactone,
α-hydroxy-β-(meth)acryloyloxy-γ-butyrolactone,
α-methyl-β-(meth)acryloyloxy-γ-butyrolactone,
α-ethyl-β-(meth)acryloyloxy-γ-butyrolactone,
α,α-dimethyl-β-(meth)acryloyloxy-γ-butyrolactone,
α-methoxy-β-(meth)acryloyloxy-γ-butyrolactone,
α-(meth)acryloyloxy-δ-mevalonolactone, compounds in which a carboxyl group in the above unsaturated carboxylic acids or carboxyl group-containing esters of unsaturated carboxylic acids is converted into the following acid-dissociable organic group (ii); and polyfunctional monomers such as methylene glycol di(meth)acrylate, ethylene glycol di(meth)acrylate, propylene glycol di(meth)acrylate, 1,6-hexanediol di(meth)acrylate, 2,5-dimethyl-2,5-hexanediol di(meth)acrylate, 1,8-octanediol di(meth)acrylate, 1,9-nonanediol di(meth)acrylate, 1,4-bis(2-hydroxypropyl)benzene di(meth)acrylate, 1,3-bis(2-hydroxypropyl)benzene di(meth)acrylate, 1,2-adamantanediol di(meth)acrylate, 1,3-adamantanediol di(meth)acrylate, 1,4-adamantanediol di(meth)acrylate, tricyclodecanyldimethylol di(meth)acrylate, and the like.

As examples of the acid-dissociable organic group (ii), groups in which a hydrogen atom of a carboxyl group is replaced by a substituted methyl group, 1-substituted ethyl group, 1-branched alkyl group, silyl group, germyl group, alkoxycarbonyl group, acyl group, cyclic organic group (excluding the compounds in which a hydrogen atom in the carboxyl group in a (meth)acrylic acid is converted to the acid-dissociable group (ii) corresponds to the (meth)acrylic acid derivative (ii)), and the like can be given.

As examples of a substituted methyl group, a methoxymethyl group, methylthiomethyl group, ethoxymethyl group, ethylthiomethyl group, 2-methoxyethoxymethyl group, benzyloxymethyl group, benzylthiomethyl group, phenacyl group, 4-bromophenacyl group, 4-methoxyphenacyl group, 4-methylthiophenacyl group, α-methylphenacyl group, cyclopropylmethyl group, benzyl group, diphenylmethyl group, triphenylmethyl group, 4-bromobenzyl group, 4-nitrobenzyl group, 4-methoxybenzyl group, 4-methylthiobenzyl group, 4-ethoxybenzyl group, 4-ethylthiobenzyl group, piperonyl group, methoxycarbonylmethyl group, ethoxycarbonylmethyl group, n-propoxycarbonylmethyl group, i-propoxycarbonylmethyl group, n-butoxycarbonylmethyl group, t-butoxycarbonylmethyl group, adamantyl methyl group, and the like can be given.

As examples of a 1-substituted ethyl group, a 1-methoxyethyl group, 1-methylthioethyl group, 1,1-dimethoxyethyl group, 1-ethoxyethyl group, 1-ethylthioethyl group, 1,1-diethoxyethyl group, 1-phenoxyethyl group, 1-phenylthioethyl group, 1,1-diphenoxyethyl group, 1-benzyloxyethyl group, 1-benzylthioethyl group, 1-cyclopropylethyl group, 1-phenylethyl group, 1,1-diphenylethyl group, 1-methoxycarbonylethyl group, 1-ethoxycarbonylethyl group,
1-n-propoxycarbonylethyl group, 1-i-propoxycarbonylethyl group, 1-n-butoxycarbonylethyl group,
1-t-butoxycarbonylethyl group, and the like can be given.

As examples of a 1-branched alkyl group, an i-propyl group, 1-methylpropyl group, t-butyl group, 1,1-dimethylpropyl group, 1-methylbutyl group, 1,1-dimethylbutyl group, and the like can be given.

As examples of the silyl group, a trimethylsilyl group, ethyldimethylsilyl group, methyldiethylsilyl group, triethylsilyl group, i-propyldimethylsilyl group, methyldi-i-propylsilyl group, tri-i-propylsilyl group, t-butyldimethylsilyl group, methyldi-t-butylsilyl group, tri-t-butylsilyl group, phenyldimethylsilyl group, methyldiphenylsilyl group, triphenylsilyl group, and the like can be given.

As examples of the germyl group, a trimethylgermyl group, ethyldimethylgermyl group, methyldiethylgermyl group, triethylgermyl group, i-propyldimethylgermyl group, methyldi-i-propylgermyl group, tri-i-propylgermyl group, t-butyldimethylgermyl group, methyldi-t-butylgermyl group, tri-t-butylgermyl group, phenyldimethylgermyl group, methyldiphenylgermyl group, triphenylgermyl group, and the like can be given.

As examples of the alkoxycarbonyl group, a methoxycarbonyl group, ethoxycarbonyl group, i-propoxycarbonyl group, t-butoxycarbonyl group, and the like can be given.

As examples of the acyl group, an acetyl group, propionyl group, butyryl group, heptanoyl group, hexanoyl group, valeryl group, pivaloyl group, isovaleryl group, lauryloyl group, myristoyl group, palmitoyl group, stearoyl group, oxalyl group, malonyl group, scucinyl group, glutaryl group, adipoyl group, piperoyl group, suberoyl group, azelaoyl group, sebacoyl group, acryloyl group, propioloyl group, methacryloyl group, crotonoyl group, oleoyl group, maleoyl group, fumaroyl group, mesaconoyl group, campholoyl group, benzoyl group, phthaloyl group, isophthaloyl group, terephthaloyl group, naphthoyl group, toluoyl group, hydroatropoyl group, atropoyl group, cinnamoyl group, furoyl group, thenoyl group, nicotinoyl group, isonicotinoyl group, p-toluenesulfonyl group, mesyl group, and the like can be given.

As examples of the cyclic organic group, norbornyl group, isobornyl group, tricyclodecanyl group, carboxytricyclodecanyl group, tetracyclodecanyl group, carboxytetracyclodecanyl group, dicyclopentenyl group, adamantyl group, cyclopropyl group, cyclopentyl group, cyclohexyl group, cyclohexenyl group, 4-methoxycyclohexyl group, 4-carboxycyclohexyl group, 3-oxocyclohexyl group, tetrahydropyranyl group, tetrahydrofuranyl group, tetrahydrothiopyranyl group, tetrahydrothiofuranyl group, 3-bromotetrahydropyranyl group, 4-methoxytetrahydropyranyl group, 2-oxo-4-methyltetrahydropyranyl group, 4-methoxytetrahydrothiopyranyl group, 3-tetrahydrothiophene-1,1-dioxide group, and the like can be given.

Of these acid-dissociable organic groups (ii), groups having a formula —COOR' (wherein R' represents a (cyclo)alkyl group having 1–19 carbon atoms) or —COOCH$_2$COOR" (wherein R" represents a (cyclo)alkyl group having 1–17 carbon atoms) are preferable, with a 1-methylpropoxycarbonyl group, t-butoxycarbonyl group, and t-butoxycarbonylmethoxycarbonyl group being particularly preferable.

As a monomer preferably used for providing the other recurring unit ③, 5-n-hexylbicyclo[2.2.1]hept-2-ene, (meth)acrylic acid, maleic anhydride, and a compound having the above formula (9) can be given. Maleic anhydride exhibits good copolymerizability with norbornene and its derivatives. Therefore, the molecular weight of the resulting resin can be increased to a desired value by adding maleic anhydride when norbornene derivatives (I) are copolymerized with norbornene or other norbornene derivatives.

These monomers providing the other recurring unit ③ may be used either individually or in combination of two or more.

In the resin (A3-1), the content of the recurring unit (3-2) is usually 0.5–20 mol %, preferably 0.5–15 mol %, and still more preferably 1–10 mol %, and the content of the recurring unit having an acid-dissociating group is usually 20–70 mol %, preferably 20–60 mol %, and still more preferably 30–60 mol %, of the total amount of the recurring units.

In the resin (A3-2), the content of the recurring unit (3-1') is usually 0.5–20mol %, preferably 0.5–15 mol %, and still more preferably 1–10 mol %, and the content of the recurring unit having an acid-dissociating group is usually 20–70 mol %, preferably 20–60 mol %, and still more preferably 30–60 mol %, of the total amount of the recurring units.

In the resin (α), the content of the recurring unit (3-2) and the recurring unit (3-1') is usually 1–15 mol %, and preferably 1–10 mol %, the content of the recurring unit (i) and recurring unit (ii) is usually 10–90 mol %, preferably 20–90 mol %, and still more preferably 30–70 mol %, and the content of the other recurring units ③ is usually 65 mol % or less, and preferably 60 mol % or less, of the total amount of the recurring units.

In the resin (α1), the content of the recurring unit (3-2) and the recurring unit (3-1') is usually 1–15 mol %, and preferably 1–10 mol %, the content of the recurring unit (i) is usually 10–80 mol %, preferably 20–80 mol %, and still more preferably 30–60 mol %, and the content of the other recurring units ③ is usually 65 mol % or less, and preferably 60 mol % or less, of the total amount of the recurring units.

In the resin (α2), the content of the recurring unit (3-2) and the recurring unit (3-1') is usually 1–15 mol %, and preferably 1–10 mol %, the content of the recurring unit (ii) is usually 10–80 mol %, preferably 20–70 mol %, and still more preferably 30–60 mol %, and the content of the other recurring units ③ is usually 50 mol % or less, and preferably 40 mol % or less, of the total amount of the recurring units.

As discussed later, the total content of the recurring unit (3-2) and the recurring unit (3-1') in the resins used for the radiation-sensitive resin composition of the present invention should be sufficiently small taking into consideration the action of the resin as a resist. In many cases, industrial manufacture of a resin with such a small content of the recurring unit (3-2) and the recurring unit (3-1') in a stable manner is difficult. Therefore, the resins (A3-1), (A3-2), (α), (α1), and (α2) are preferably used in combination with other resins which do not contain the recurring units (3-2) and (3-1'), preferably a resin containing an acid-dissociating group which dissociates in the presence of an acid and forms a carboxyl group in the resin. The above-described contents of the recurring units in the resins used in the present invention are thus specified taking stable industrial manufacture of such resins into consideration.

The resins of the present invention can be prepared by copolymerizing the norbornene derivatives (I) and/or (meth)acrylic acid derivatives (II), preferably together with the norbornene derivatives (i) and/or (meth)acrylic acid derivatives (ii), and optionally monomers providing the recurring unit ③, in an appropriate solvent using a radical polymerization initiator such as a hydroperoxide, dialkyl peroxide, diacyl peroxide, or azo compound and, as required, in the presence of a chain-transfer agent.

As examples of the solvent used for copolymerization of the components, alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylene dibromide, and chlorobenzene; saturated carboxylic acid esters such as ethyl acetate, n-butyl acetate, i-butyl acetate, and methyl propionate; ethers such as tetrahydrofuran, dimethoxyethanes, and diethoxyethanes; and the like can be given.

These solvents may be used either individually or in combination of two or more.

The copolymerization is carried out at a temperature of usually 40–120° C., and preferably 50–90° C. for usually 1–48 hours, and preferably 1–24 hours.

The polystyrene-reduced weight average molecular weight (hereinafter referred to as "Mn") of the resins (A3-1), (A3-2), (α), (α1), and (α2) determined by gel permeation chromatography (GPC) is usually 3,000–300,000, preferably 4,000–200,000, and still more preferably 4,000–100,000. If Mw of these resins is less than 3,000, heat resistance as a resist tends to decrease; if more than 300,000, developability as a resist tends to decrease.

It is preferable that the above resins contain almost no impurities such as halogens or metals. The smaller the amount of such impurities, the better are the sensitivity, resolution, process stability, pattern shape, or the like as a resist. The resin can be purified using, for example, a chemical purification method such as washing with water or liquid-liquid extraction or a combination of the chemical purification method and a physical purification method such as ultrafiltration or centrifugation.

In the present invention, the resin (A3-1), (A3-2), (α), (α1), or (α2) may be used either individually or in combination of two or more.

The resin (A3) of the present invention is preferable used together with other resins having a group dissociating in the presence of an acid and forming an acidic functional group, preferably a carboxyl group, in the resin (hereinafter referred to as "other acid-dissociating group-containing resins").

As examples of such other acid-dissociating group-containing resins, resins containing at least one recurring unit selected from the above-mentioned recurring unit (i), the recurring unit (ii), and other recurring units having an acid-dissociating group, and optionally further containing one or more other recurring units having no acid-dissociating group can be given.

As the other acid-dissociating group-containing resins preferably used in the present invention, copolymers of at least one compound selected from the group consisting of norbornene derivatives (i) having an acid-dissociating group (i) selected from the group consisting of t-butoxycarbonyl group and the groups shown by the formulas (i-1), (i-2), (i-10), (i-11), (i-13), (i-14), (i-16), (i-17), (i-34), (i-35), (i-40), (i-41), (i-46), or (i-47), and having m–0; norbornene derivatives (i) having an acid-dissociating group (i) selected from the group consisting of t-butoxycarbonyl group and the groups shown by the formulas (i-1), (i-2), (i-10), (i-11), (i-13), (i-14), (i-16), (i-17), (i-34), (i-35), (i-40), (i-41), (i-46), or (i-47), and having m–1; norbornene derivatives (IV) having an acid-dissociating group (i) selected from the group consisting of t-butoxycarbonyl group and the groups shown by the formulas (i-1), (i-2), (i-10), (i-11), (i-13), (i-14), (i-16), (i-17), (i-34), (i-35), (i-40), (i-41), (i-46), or (i-47); and at least one compound selected from the group consisting of 5-n-hexylbicyclo[2.2.1]hept-2-ene, (meth) acrylic acid, maleic anhydride, and a compound having the above formula (9), can be given.

Maleic anhydride exhibits good copolymerizability with norbornene and its derivatives. Therefore, the molecular weight of the resulting resin can be increased to a desired value by adding maleic anhydride when norbornene derivatives (i) is copolymerized with norbornene or other norbornene derivatives.

In the radiation-sensitive resin composition of the present invention, the content of the recurring unit (3-2) and the recurring unit (3-1') is preferably 0.01–5 mol %, more preferably 0.1–3 mol %, and particularly preferably 0.1–1 mol %, the content of the recurring unit having an acid-dissociating group is preferably 10–80 mol %, more preferably 20–60 mol %, and still more preferably 30–60 mol %, and the content of the other recurring units is preferably 70 mol % or less, and more preferably 60 mol % or less, of the total amount of the recurring units.

If the total amount of the recurring units (3-2) and (3-1') is less than 0.01 mol %, it is difficult for the resist to exhibit a sufficient effect of suppressing line width fluctuations due to an increase or decrease of space widths. If the amount exceeds 5 mol %, on the other hand, sensitivity as a resist tends to decrease. If the content of the recurring unit having an acid-dissociating group is less than 10 mol %, resolution as a resist tends to decrease. If the content exceeds 80 mol %, developability tends to decrease and scum tends to be easily produced.

The amount of the other acid-dissociating group-containing resins for the total amount of resin components may be appropriately determined so that the total content of the recurring units (3-2) and (3-1') and the content of recurring units having an acid-dissociable group may be in the above range. This amount is usually 70–99.9 wt %, preferably 80–99 wt %, and still more preferably 85–95 wt %.

Component (B)

The component (B) of the present invention is a photoacid generator which generates an acid upon exposure (hereinafter referred to as "acid generator").

As examples of the acid generator used in the present invention, (1) onium salt compounds, (2) sulfone compounds, (3) sulfonate compounds, (4) sulfonimide compounds, (5) diazomethane compounds, (6) disulfonylmethane compounds, and (7) halogen-containing compounds can be given.

Examples of these acid generators will be given below.

(1) Onium Salt Compounds

As examples of onium salts, iodonium salt, sulfonium salt, phosphonium salt, diazonium salt, ammonium salt, pyridinium salt, and the like can be given.

Specific examples of onium salts include:
bis(4-t-butylphenyl)iodonium perfluoro-n-octanesulfonate,
bis(4-t-butylphenyl)iodonium nonafluoro-n-butanesulfonate,
bis(4-t-butylphenyl)iodonium trifluoromethanesulfonate,
bis(4-t-butylphenyl)iodonium pyrenesulfonate,
bis(4-t-butylphenyl)iodonium n-dodecylbenzenesulfonate,
bis(4-t-butylphenyl)iodonium hexafluoroantimonate,
bis(4-t-butylphenyl)iodonium p-toluenesulfonate,
bis(4-t-butylphenyl)iodonium benzenesulfonate,
bis(4-t-butylphenyl)iodonium naphthalenesulfonate,
bis(4-t-butylphenyl)iodonium 10-camphorsulfonate,
bis(4-t-butylphenyl)iodonium octanesulfonate,
bis(4-t-butylphenyl)iodonium 2-trifluoromethylbenzenesulfonate,
bis(4-t-butylphenyl)iodonium 4-trifluoromethylbenzenesulfonate,
bis(4-t-butylphenyl)iodonium 2,4-difluorobenzenesulfonate,
diphenyliodonium perfluoro-n-octanesulfonate,
diphenyliodonium nonafluoro-n-butanesulfonate,
diphenyliodoniumtrifluoromethanesulfonate, diphenyliodonium pyrenesulfonate, diphenyliodonium n-dodecylbenzenesulfonate,
diphenyliodonium hexafluoroantimonate, diphenyliodonium p-toluenesulfonate, diphenyliodonium benzenesulfonate, diphenyliodonium naphthalenesulfonate, diphenyliodonium 10-camphorsulfonate, diphenyliodonium octanesulfonate,
diphenyliodonium 2-trifluoromethylbenzenesulfonate,
diphenyliodonium 4-trifluoromethylbenzenesulfonate,
diphenyliodonium 2,4-difluorobenzenesulfonate,
triphenylsulfonium perfluoro-n-octanesulfonate,
triphenylsulfonium nonafluoro-n-butanesulfonate,
triphenylsulfonium trifluoromethanesulfonate,
triphenylsulfonium pyrenesulfonate, triphenylsulfonium n-dodecylbenzenesulfonate, triphenylsulfonium hexafluoroantimonate, triphenylsulfonium p-toluenesulfonate,
triphenylsulfonium benzenesulfonate, triphenylsulfonium naphthalenesulfonate, triphenylsulfonium 10-camphorsulfonate,
triphenylsulfonium octanesulfonate, triphenylsulfonium 2-trifluoromethylbenzenesulfonate, triphenylsulfonium 4-trifluoromethylbenzenesulfonate, triphenylsulfonium 2,4-difluorobenzene sulfonate,
4-t-butylphenyl·diphenylsulfonium nonafluorobutanesulfonate,
4-t-butylphenyl·diphenylsulfonium trifluoromethanesulfonate,
4-t-butylphenyl·diphenylsulfonium pyrenesulfonate,
4-t-butylphenyl·diphenylsulfonium dodecylbenzenesulfonate,
4-t-butylphenyl·diphenylsulfonium p-toluenesulfonate,
4-t-butylphenyl·diphenylsulfonium benzenesulfonate,
4-t-butylphenyl·diphenylsulfonium 10-camphorsulfonate,
4-t-butylphenyl·diphenylsulfonium octanesulfonate,
4-t-butylphenyl·diphenylsulfonium 2-trifluoromethylbenzenesulfonate,
4-t-butylphenyl·diphenylsulfonium 4-trifluoromethylbenzenesulfonate,
4-t-butylphenyl·diphenylsulfonium 2,4-difluorobenzenesulfonate,
4-t-butoxyphenyl·diphenylsulfonium nonafluorobutanesulfonate,
4-hydroxyphenyl·benzyl·methylsulfonium p-toluenesulfonate,
2,4,6-tristrimethylphenyl·diphenylsulfonium nonafluorobutanesulfonate,
2,4,6-tristrimethylphenyl·diphenylsulfonium trifluoromethanesulfonate,
2,4,6-tristrimethylphenyl·diphenylsulfonium pyrenesulfonate,
2,4,6-tristrimethylphenyl·diphenylsulfonium dodecylbenzenesulfonate,
2,4,6-tristrimethylphenyl·diphenylsulfonium p-toluenesulfonate,
2,4,6-tristrimethylphenyl·diphenylsulfonium benzenesulfonate.
2,4,6-tristrimethylphenyl·diphenylsulfonium 10-camphorsulfonate,
2,4,6-tristrimethylphenyl·diphenylsulfonium octanesulfonate,
2,4,6-tristrimethylphenyl·diphenylsulfonium 2-trifluoromethylbenzenesulfonate,
2,4,6-tristrimethylphenyl·diphenylsulfonium 4-trifluoromethylbenzenesulfonate,
2,4,6-tristrimethylphenyl·diphenylsulfonium 2,4-difluorobenzenesulfonate,
cyclohexyl·2-oxocyclohexyl·methylsulfonium trifluoromethanesulfonate,
cyclohexyl·2-oxocyclohexyl·methylsulfonium nonafluoro-n-butanesulfonate,
cyclohexyl·2-oxocyclohexyl·methylsulfonium perfluoro-n-octanesulfonate,
dicyclohexyl·2-oxocyclohexylsulfonium trifluoromethanesulfonate,
dicyclohexyl·2-oxocyclohexylsulfonium nonafluoro-n-butanesulfonate,
dicyclohexyl·2-oxocyclohexylsulfonium perfluoro-n-octanesulfonate,
2-oxocyclohexyldimethylsulfonium trifluoromethanesulfonate,
2-oxocyclohexyldimethylsulfonium nonafluoro-n-butanesulfonate,
2-oxocyclohexyldimethylsulfonium perfluoro-n-octanesulfonate,
4-hydroxyphenyl·phenyl·methylsulfonium p-toluenesulfonate,
4-hydroxyphenyl·benzyl·methylsulfonium p-toluenesulfonate,
1-naphthyldimethylsulfonium trifluoromethanesulfonate,
1-naphthyldimethylsulfonium nonafluoro-n-butanesulfonate,
1-naphthyldimethylsulfonium perfluoro-n-octanesulfonate,
1-naphthyldiethylsulfonium trifluoromethanesulfonate,
1-naphthyldiethylsulfonium nonafluoro-n-butanesulfonate,
1-naphthyldiethylsulfonium perfluoro-n-octanesulfonate,
4-cyano-1-naphthyldimethylsulfonium trifluoromethanesulfonate,
4-cyano-1-naphthyldimethylsulfonium nonafluoro-n-butanesulfonate,
4-cyano-1-naphthyldimethylsulfonium perfluoro-n-octanesulfonate,
4-cyano-1-naphthyldiethylsulfonium trifluoromethanesulfonate,
4-cyano-1-naphthyldiethylsulfonium nonafluoro-n-butanesulfonate,
4-cyano-1-naphthyldiethylsulfonium perfluoro-n-octanesulfonate,
4-nitro-1-naphthyldimethylsulfonium trifluoromethanesulfonate,
4-nitro-1-naphthyldimethylsulfonium nonafluoro-n-butanesulfonate,
4-nitro-1-naphthyldimethylsulfonium perfluoro-n-octanesulfonate,
4-nitro-1-naphthyldiethylsulfonium trifluoromethanesulfonate,
4-nitro-1-naphthyldiethylsulfonium nonafluoro-n-butanesulfonate,
4-nitro-1-naphthyldiethylsulfonium perfluoro-n-octanesulfonate,
4-methyl-1-naphthyldimethylsulfonium trifluoromethanesulfonate,
4-methyl-1-naphthyldimethylsulfonium nonafluoro-n-butanesulfonate,
4-methyl-1-naphthyldimethylsulfonium perfluoro-n-octanesulfonate,
4-methyl-1-naphthyldiethylsulfonium trifluoromethanesulfonate,
4-methyl-1-naphthyldiethylsulfonium nonafluoro-n-butanesulfonate,
4-methyl-1-naphthyldiethylsulfonium perfluoro-n-octanesulfonate,
4-hydroxy-1-naphthyldimethylsulfonium trifluoromethanesulfonate,
4-hydroxy-1-naphthyldimethylsulfonium nonafluoro-n-butanesulfonate,
4-hydroxy-1-naphthyldimethylsulfonium perfluoro-n-octanesulfonate, 4-hydroxy-1-naphthyldiethylsulfonium trifluoromethanesulfonate,
4-hydroxy-1-naphthyldiethylsulfonium nonafluoro-n-butanesulfonate,
4-hydroxy-1-naphthyldiethylsulfonium perfluoro-n-octanesulfonate,
1-(3,5-dimethyl-4-hydroxyphenyl)tetrahydrothiophenium trifluoromethanesulfonate,
1-(3,5-dimethyl-4-hydroxyphenyl)tetrahydrothiophenium nonafluoro-n-butanesulfonate,
1-(3,5-dimethyl-4-hydroxyphenyl)tetrahydrothiophenium perfluoro-n-octanesulfonate,
1-(4-methoxyphenyl)tetrahydrothiophenium trifluoromethanesulfonate,
1-(4-methoxyphenyl)tetrahydrothiophenium nonafluoro-n-butanesulfonate,
1-(4-methoxyphenyl)tetrahydrothiophenium perfluoro-n-octanesulfonate,
1-(2,4-dimethoxyphenyl)tetrahydrothiophenium trifluoromethanesulfonate,
1-(2,4-dimethoxyphenyl)tetrahydrothiophenium nonafluoro-n-butanesulfonate,
1-(2,4-dimethoxyphenyl)tetrahydrothiophenium perfluoro-n-octanesulfonate,
4-hydroxy-1-naphthyltetrahydrothiophenium trifluoromethanesulfonate,
4-methoxy-1-naphthyltetrahydrothiophenium trifluoromethanesulfonate,
4-ethoxy-1-naphthyltetrahydrothiophenium trifluoromethanesulfonate,
4-n-propoxy-1-naphthyltetrahydrothiophenium trifluoromethanesulfonate,
4-i-propoxy-1-naphthyltetrahydrothiophenium trifluoromethanesulfonate,
4-n-butoxy-1-naphthyltetrahydrothiophenium trifluoromethanesulfonate,
4-t-butoxy-1-naphthyltetrahydrothiophenium trifluoromethanesulfonate,
4-hydroxy-1-naphthyltetrahydrothiophenium nonafluoro-n-butanesulfonate,
4-methoxy-1-naphthyltetrahydrothiophenium nonafluoro-n-butanesulfonate,
4-ethoxy-1-naphthyltetrahydrothiophenium nonafluoro-n-butanesulfonate,
4-n-propoxy-1-naphthyltetrahydrothiophenium nonafluoro-n-butanesulfonate,
4-i-propoxy-1-naphthyltetrahydrothiophenium nonafluoro-n-butanesulfonate,
4-n-butoxy-1-naphthyltetrahydrothiophenium nonafluoro-n-butanesulfonate,
4-t-butoxy-1-naphthyltetrahydrothiophenium nonafluoro-n-butanesulfonate,
4-hydroxy-1-naphthyltetrahydrothiophenium perfluoro-n-octanesulfonate,
4-methoxy-1-naphthyltetrahydrothiophenium perfluoro-n-octanesulfonate,
4-ethoxy-1-naphthyltetrahydrothiophenium perfluoro-n-octanesulfonate,
4-n-propoxy-1-naphthyltetrahydrothiophenium perfluoro-n-octanesulfonate,
4-i-propoxy-1-naphthyltetrahydrothiophenium perfluoro-n-octanesulfonate,
4-n-butoxy-1-naphthyltetrahydrothiophenium perfluoro-n-octanesulfonate,
4-t-butoxy-1-naphthyltetrahydrothiophenium perfluoro-n-octanesulfonate,
4-methoxymethoxy-1-naphthyltetrahydrothiophenium trifluoromethanesulfonate,
4-methoxymethoxy-1-naphthyltetrahydrothiophenium nonafluoro-n-butanesulfonate,
4-methoxymethoxy-1-naphthyltetrahydrothiophenium perfluoro-n-octanesulfonate,
4-ethoxymethoxy-1-naphthyltetrahydrothiophenium trifluoromethanesulfonate,
4-ethoxymethoxy-1-naphthyltetrahydrothiophenium nonafluoro-n-butanesulfonate,
4-ethoxymethoxy-1-naphthyltetrahydrothiophenium perfluoro-n-octanesulfonate,
4-(1-methoxyethoxy)-1-naphthyltetrahydrothiophenium trifluoromethanesulfonate,
4-(1-methoxyethoxy)-1-naphthyltetrahydrothiophenium nonafluoro-n-butanesulfonate,
4-(1-methoxyethoxy)-1-naphthyltetrahydrothiophenium perfluoro-n-octanesulfonate,
4-(2-methoxyethoxy)-1-naphthyltetrahydrothiophenium trifluoromethanesulfonate,
4-(2-methoxyethoxy)-1-naphthyltetrahydrothiophenium nonafluoro-n-butanesulfonate,
4-(2-methoxyethoxy)-1-naphthyltetrahydrothiophenium perfluoro-n-octanesulfonate,
4-methoxycarbonyloxy-1-naphthyltetrahydrothiophenium trifluoromethanesulfonate,
4-methoxycarbonyloxy-1-naphthyltetrahydrothiophenium nonafluoro-n-butanesulfonate,
4-methoxycarbonyloxy-1-naphthyltetrahydrothiophenium perfluoro-n-octanesulfonate,
4-ethoxycarbonyloxy-1-naphthyltetrahydrothiophenium trifluoromethanesulfonate,
4-ethoxycarbonyloxy-1-naphthyltetrahydrothiophenium nonafluoro-n-butanesulfonate,
4-ethoxycarbonyloxy-1-naphthyltetrahydrothiophenium perfluoro-n-octanesulfonate,
4-n-propoxycarbonyloxy-1-naphthyltetrahydrothiophenium trifluoromethanesulfonate,
4-n-propoxycarbonyloxy-1-naphthyltetrahydrothiophenium nonafluoro-n-butanesulfonate,
4-n-propoxycarbonyloxy-1-naphthyltetrahydrothiophenium perfluoro-n-octanesulfonate,
4-i-propoxycarbonyloxy-1-naphthyltetrahydrothiophenium trifluoromethanesulfonate,
4-i-propoxycarbonyloxy-1-naphthyltetrahydrothiophenium nonafluoro-n-butanesulfonate,
4-i-propoxycarbonyloxy-1-naphthyltetrahydrothiophenium perfluoro-n-octanesulfonate,
4-n-butoxycarbonyloxy-1-naphthyltetrahydrothiophenium trifluoromethanesulfonate,
4-n-butoxycarbonyloxy-1-naphthyltetrahydrothiophenium nonafluoro-n-butanesulfonate,
4-n-butoxycarbonyloxy-1-naphthyltetrahydrothiophenium perfluoro-n-octanesulfonate,
4-t-butoxycarbonyloxy-1-naphthyltetrahydrothiophenium trifluoromethanesulfonate,
4-t-butoxycarbonyloxy-1-naphthyltetrahydrothiophenium nonafluoro-n-butanesulfonate,
4-t-butoxycarbonyloxy-1-naphthyltetrahydrothiophenium perfluoro-n-octanesulfonate,
4-(2-tetrahydrofuranyloxy)-1-naphthyltetrahydrothiophenium trifluoromethanesulfonate,
4-(2-tetrahydrofuranyloxy)-1-naphthyltetrahydrothiophenium nonafluoro-n-butanesulfonate,
4-(2-tetrahydrofuranyloxy)-1-naphthyltetrahydrothiophenium perfluoro-n-octanesulfonate, 4-(2-tetrahydropyranyloxy)-1-naphthyltetrahydrothiophenium trifluoromethanesulfonate,
4-(2-tetrahydropyranyloxy)-1-naphthyltetrahydrothiophenium nonafluoro-n-butanesulfonate,
4-(2-tetrahydropyranyloxy)-1-naphthyltetrahydrothiophenium perfluoro-n-octanesulfonate,
4-benzyloxy-1-naphthyltetrahydrothiophenium trifluoromethanesulfonate,
4-benzyloxy-1-naphthyltetrahydrothiophenium nonafluoro-n-butanesulfonate,
4-benzyloxy-1-naphthyltetrahydrothiophenium perfluoro-n-octanesulfonate,
1-(1-naphthylacetomethyl)tetrahydrothiophenium trifluoromethanesulfonate,
1-(1-naphthylacetomethyl)tetrahydrothiophenium nonafluoro-n-butanesulfonate,
1-(1-naphthylacetomethyl)tetrahydrothiophenium perfluoro-n-octanesulfonate, (2) Sulfone Compounds As examples of sulfone compounds, β-ketosulfone, β-sulfonylsulfone, and α-diazo compounds of these compounds, and the like can be given.

As specific examples of sulfone compounds, phenacylphenylsulfone, mesitylphenacylsulfone, bis(phenylsulfonyl)methane, 4-trisphenacylsulfone, and the like can be given.

(3) Sulfonate Compounds

As examples of sulfonate compounds, alkyl sulfonate, haloalkyl sulfonate, aryl sulfonate, imino sulfonate, and the like can be given.

As specific examples of sulfonate compounds, benzointosylate, pyrogallol tristrifluoromethanesulfonate, pyrogallol trisnonafluorobutanesufonate, pyrogallol methanetrisulfonate, nitrobenzyl-9,10-diethoxyanthracene-2-sulfonate, α-methylolbenzointosylate, α-methylolbenzoin octanesulfonate, α-methylolbenzoin trifluoromethanesulfonate, α-methylolbenzoin dodecylsulfonate, and the like can be given.

(4) Sulfonimide Compounds

As examples of sulfonimide compounds, compounds shown by the following formula (4) can be given:

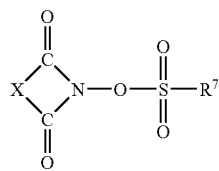

(4)

wherein X represents a divalent group such as an alkylene group, arylene group, and alkoxylene group, and $R^7$ represents a monovalent group such as an alkyl group, aryl group, halogenated alkyl group, and halogenated aryl group.

Specific examples of sulfonimide compounds include:
N-(trifluoromethylsulfonyloxy)succinimide,
N-(trifluoromethylsulfonyloxy)phthalimide,
N-(trifluoromethylsulfonyloxy)diphenylmaleimide,
N-(trifluoromethylsulfonyloxy)bicyclo[2.2.1]hept-5-ene-2,3-dicarboxyimide,
N-(trifluoromethylsulfonyloxy)-7-oxabicyclo[2.2.1]hept-5-ene-2,3-dicarboxyimide,
N-(trifluoromethylsulfonyloxy)bicyclo[2.2.1]heptan-5,6-oxy-2,3-dicarboxyimide,
N-(trifluoromethylsulfonyloxy)naphthylimide,
N-(nonafluorobutylsulfonyloxy)succinimide,
N-(nonafluorobutylsulfonyloxy)phthalimide,
N-(nonafluorobutylsulfonyloxy)diphenylmaleimide,
N-(nonafluorobutylsulfonyloxy)bicyclo[2.2.1]hept-5-ene-2,3-dicarboxyimide,
N-(nonafluorobutylsulfonyloxy)-7-oxabicyclo[2.2.1]hept-5-ene-2,3-dicarboxyimide,
N-(nonafluorobutylsulfonyloxy)bicyclo[2.2.1]heptan-5,6-oxy-2,3-dicarboxyimide,
N-(nonafluorobutylsulfonyloxy)naphthylimide,
N-(2-trifluoromethylbenzenesulfonyloxy)succinimide,
N-(2-trifluoromethylbenzenesulfonyloxy)phthalimide,
N-(2-trifluoromethylbenzenesulfonyloxy)diphenylmaleimide,
N-(2-trifluoromethylbenzenesulfonyloxy)bicyclo[2.2.1]hept-5-ene-2,3-dicarboxyimide,
N-(2-trifluoromethylbenzenesulfonyloxy)-7-oxabicyclo[2.2.1]hept-5-ene-2,3-dicarboxyimide,
N-(2-trifluoromethylbenzenesulfonyloxy)bicyclo[2.2.1]-heptan-5,6-oxy-2,3-dicarboxyimide,
N-(2-trifluoromethylbenzenesulfonyloxy)naphthylimide,
N-(10-camphorsulfonyloxy)succinimide,
N-(10-camphorsulfonyloxy)phthalimide,
N-(10-camphorsulfonyloxy)diphenylmaleimide,
N-(10-camphorsulfonyloxy)bicyclo[2.2.1]hept-5-ene-2,3-dicarboxyimide,
N-(10-camphorsulfonyloxy)-7-oxabicyclo[2.2.1]hept-5-ene-2,3-dicarboxyimide,
N-(10-camphorsulfonyloxy)bicyclo[2.2.1]heptan-5,6-oxy-2,3-dicarboxyimide, N-(10-camphorsulfonyloxy)naphthylimide,
N-(p-toluenesulfonyloxy)succinimide,
N-(p-toluenesulfonyloxy)phthalimide,
N-(p-toluenesulfonyloxy)diphenylmaleimide,
N-(p-toluenesulfonyloxy)bicyclo[2.2.1]hept-5-ene-2,3-dicarboxyimide,
N-(p-toluenesulfonyloxy)-7-oxabicyclo[2.2.1]hept-5-ene-2,3-dicarboxyimide,
N-(p-toluenesulfonyloxy)bicyclo[2.2.1]heptane-5,6-oxy-2,3-dicarboxyimide, N-(p-toluenesulfonyloxy)naphthylimide, and compounds shown by the following formulas (4-1) to (4-6),

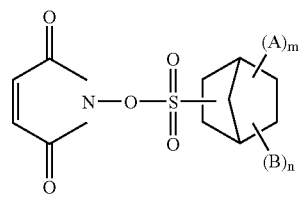

(4-1)

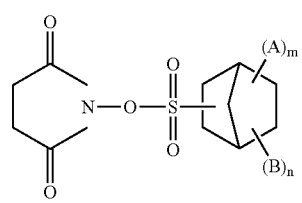

(4-2)

-continued

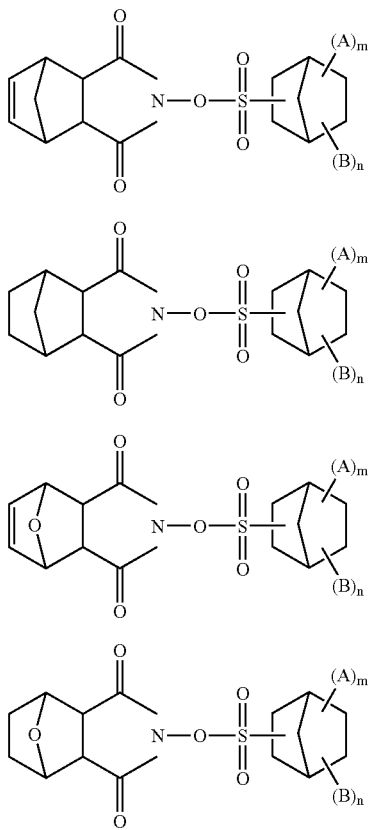

wherein A individually indicates an organic group having 2–10 carbon atoms and an ester bond, B individually represents an alkyl group having 1–10 carbon atoms or an alkoxyl group having 1–10 carbon atoms, m is an integer of 1–11, and n is an integer of 0–10, provided that m+n≦11.

(5) Diazomethane Compounds

As examples of diazomethane compounds, compounds shown by the following formula (5) can be given:

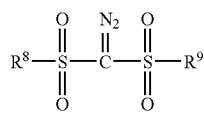

wherein $R^8$ and $R^9$ individually represent a monovalent group such as an alkyl group, aryl group, halogenated alkyl group, and halogenated allyl group.

As specific examples of diazomethane compound, bis(trifluoromethylsulfonyl)diazomethane, bis(t-butylsulfonyl)diazomethane, bis(cyclohexylsulfonyl)diazomethane, bis(phenylsulfonyl)diazomethane, bis(p-toluenesulfonyl)diazomethane, methylsulfonyl-p-toluenesulfonyldiazomethane, 1-cyclohexylsulfonyl-1-(1,1-dimethylethylsulfonyl)-diazomethane, bis(1,1-dimethylethylsulfonyl)diazomethane, and a compound shown by the following formulas (5-1) can be given.

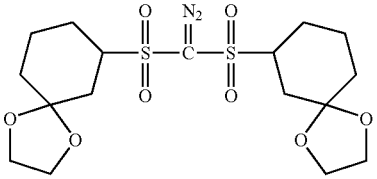

(6) Disulfonylmethane Compounds

As examples of disulfonylmethane compounds, a compound shown by the following formula (6) can be given:

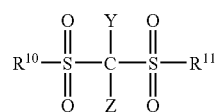

wherein $R^{10}$ and $R^{11}$ individually represent a linear or branched alkyl group, cycloalkyl group, aryl group, aralkyl group, or a monovalent organic group having a hetero atom, Y and Z individually represent an aryl group, a hydrogen atom, a linear or branched alkyl group, a monovalent organic group having a hetero atom, provided that at least one of Y and Z represents an aryl group, or Y and Z bond to form a monocyclic or polycyclic ring having at least one unsaturated bond, or Y and Z bond to form a group shown by the following formula:

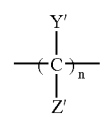

wherein Y' and Z' individually represent a hydrogen atom, halogen atom, alkyl group, cycloalkyl group, aryl group, or aralkyl group, or Y' and Z' bond to form a monocyclic carbon structure, and n is an integer of 2–10.

As preferable examples of disulfonylmethane compounds, compounds shown by the following formulas (7) to (14) can be given.

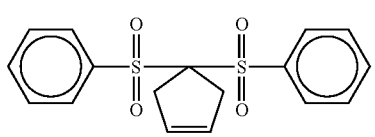

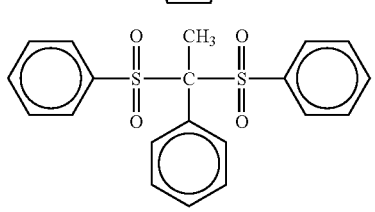

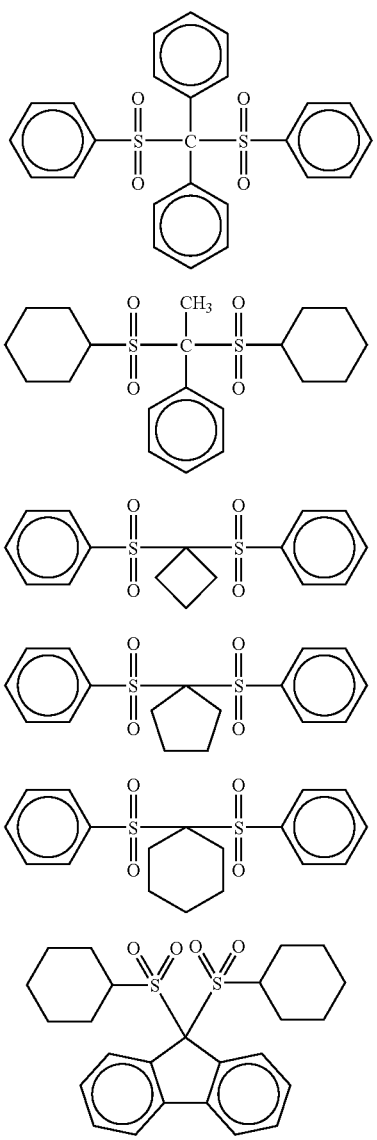

(7) Halogen-containing Compounds

As examples of halogen-containing compounds, haloalkyl group-containing hydrocarbon compounds, haloalkyl group-containing heterocyclic compounds, and the like can be given.

As specific examples of preferable halogen-containing compounds, (trichloromethyl)-s-triazine derivatives such as phenylbis(trichloromethyl)-s-triazine, 4-methoxyphenylbis(trichloromethyl)-s-triazine, and 1-naphthylbis(trichloromethyl)-s-triazine, 1,1-bis(4-chlorophenyl)-2,2,2-trichloroethane, and the like can be given.

Of these acid generators, compounds having a boiling point higher than 165° C. at normal pressure are preferable.

Particularly preferable compounds are:
bis(4-t-butylphenyl)iodonium nonafluorobutanesulfonate,
bis(4-t-butylphenyl)iodonium dodecylbenzenesulfonate,
bis(4-t-butylphenyl)iodonium p-toluenesulfonate,
bis(4-t-butylphenyl)iodonium 10-camphorsulfonate,
bis(4-t-butylphenyl)iodonium octanesulfonate, diphenyliodonium p-toluenesulfonate, diphenyliodonium benzenesulfonate, diphenyliodonium 10-camphorsulfonate, diphenyliodonium octanesulfonate, diphenyliodonium nonafluorobutanesulfonate, diphenyliodonium dodecylbenzenesulfonate, triphenylsulfonium nonafluorobutanesulfonate, triphenylsulfonium 10-camphorsulfonate, triphenylsulfonium naphthalenesulfonate,
4-t-butoxyphenyldiphenylsulfonium nonafluorobutanesulfonate,
4-hydroxyphenylbenzylmethylsulfonium p-toluenesulfonate,
N-(nonafluorobutylsulfonyloxy)succinimide,
N-(nonafluorobutylsulfonyloxy)phthalimide,
N-(nonafluorobutylsulfonyloxy)diphenylmaleimide,
N-(nonafluorobutylsulfonyloxy)bicyclo[2.2.1]hept-5-ene-2,3-dicarboximide,
N-(nonafluorobutylsulfonyloxy)-7-oxabicyclo[2.2.1]hept-5-ene-2,3-dicarboxyimide,
N-(nonafluorobutylsulfonyloxy)bicyclo[2.2.1]heptan-5,6-oxy-2,3-dicarboxyimide,
N-(nonafluorobutylsulfonyloxy)naphthylimide,
N-(10-camphorsulfonyloxy)succinimide,
N-(10-camphorsulfonyloxy)phthalimide,
N-(10-camphorsulfonyloxy)diphenylmaleimide,
N-(10-camphorsulfonyloxy)bicyclo[2.2.1]hept-5-ene-2,3-dicarboxyimide,
N-(10-camphorsulfonyloxy)-7-oxabicyclo[2.2.1]hept-5-ene-2,3-dicarboxyimide,
N-(10-camphorsulfonyloxy)bicyclo[2.2.1]heptan-5,6-oxy-2,3-dicarboxyimide, and
N-(10-camphorsulfonyloxy)naphthylimide.

In the present invention, the acid generators can be used either individually or in combination of two or more. The amount of the acid generators to be added is 0.5–20 parts by weight, and preferably 1–10 parts by weight for 100 parts by weight of the copolymer components when the copolymer (A1) or copolymer (A2) is used. When the copolymer (A3) is used, the amount of the acid generators is 0.1–10 parts by weight, and preferably 0.5–7 parts by weight for 100 parts by weight of the copolymer components.

Component (C)

The component (C) of the negative tone radiation sensitive composition of the present invention is a compound crosslinkable with the copolymer (A2) in the presence of an acid (an acid generated by exposure, for example), for example, a compound having one or more functional groups exhibiting crosslinking reactivity with the copolymer (A2) (such a compound and functional group are hereinafter referred to respectively as "a crosslinking agent" and "a crosslinkable functional group").

The groups shown by the following formulas (15) to (19) can be given as examples of the crosslinkable functional group,

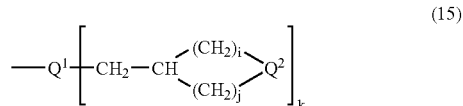

(15)

wherein k is an integer of 1 or 2, $Q^1$ indicates a single bond, —O—, —S—, —COO—, or —NH— when k=1 and a trivalent nitrogen atom when k=2, $Q^2$ is —O— or —S—, i is an integer of 0–3, and j is an integer of 1–3, provided that i+j is 1 to 4,

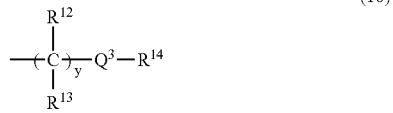
(16)

wherein $Q^3$ is —O—, —CO—, or —COO—, $R^{12}$ and $R^{13}$ individually represent a hydrogen atom or alkyl group having 1–4 carbon atoms, $R^{14}$ represents an alkyl group having 1–5 carbon atoms, aryl group having 6–12 carbon atoms, or aralkyl group having 7–14 carbon atoms, and y is an integer of 1 or more,

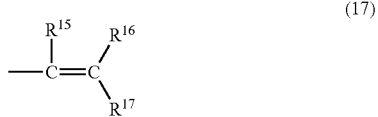
(17)

wherein $R^{15}$, $R^{16}$, and $R^{17}$ individually represent a hydrogen atom or an alkyl group having 1–4 carbon atoms,

(18)

wherein $R^{12}$, $R^{13}$, and y are the same as defined in the formula (16) and $R^{18}$ and $R^{19}$ individually represent an alkyl group having 1–5 carbon atoms or an alkylol group having 1–5 carbon atoms, and

(19)

wherein $R^{12}$, $R^{13}$, and y are the same as defined in the formula (16), and $R^{20}$ represents a divalent organic group having a 3–8 member cyclic structure containing a hetero atom selected from an oxygen atom, sulfur atom, and nitrogen atom.

As specific examples of such a crosslinkable functional group, a glycidyl ether group, glycidyl ester group, glycidyl amino group, methoxymethyl group, ethoxymethyl group, benzyloxymethyl group, acetoxymethyl group, benzoiloxy methyl group, formyl group, acetyl group, vinyl group, iso-propenyl group, dimethylaminomethyl group, diethylolaminomethyl group, morpholinomethyl group, and the like can be given.

As examples of the compound having such a crosslinkable functional group, a bisphenol A epoxy compound, bisphenol F epoxy compound, bisphenol S epoxy compound, novolac resin epoxy compound, resol resin epoxy compound, poly(hydroxystyrene) epoxy compound, methylol group-containing melamine compound, methylol group-containing benzoquanamine compound, methylol group-containing urea compound, methylol group-containing phenol compound, alkoxyalkyl group-containing melamine compound, alkoxyalkyl group-containing benzoquanamine compound, alkoxyalkyl group-containing urea compound, alkoxyalkyl group-containing phenol compound, carboxymethyl group-containing melamine resin, carboxymethyl group-containing benzoquanamine resin, carboxymethyl group-containing urea resin, carboxymethyl group-containing phenol resin, carboxymethyl group-containing melamine compound, carboxymethyl group-containing benzoquanamine compound, carboxymethyl group-containing urea compound, carboxymethyl group-containing phenol compound, and the like can be given.

Of these compounds having crosslinkable functional groups, a methylol group-containing phenol compound, methoxymethyl group-containing melamine compound, methoxymethyl group-containing phenol compound, methoxymethyl group-containing glycoluril compound, methoxymethyl group-containing urea compound, and acetoxymethyl group-containing phenol compound are preferable, with particularly preferable compounds being a methoxymethyl group-containing melamine compound (for example, hexamethoxymethylmelamine), methoxymethyl group-containing glycoluril compound, methoxymethyl group-containing urea compound, and the like. Methoxymethyl group-containing melamine compounds are commercially available under the trademarks CYMEL300, CYMEL301, CYMEL303, and CYMEL305 (manufactured by Mitsui Cyanamid Co., Ltd.), methoxymethyl group-containing glycoluril compounds are commercially available under the trademark CYMEL 1174 (manufactured by Mitsui Cyanamid Co., Ltd.) and the like; and methoxymethyl group-containing urea compounds are commercially available under the trademark MX290 (manufactured by Sanwa Chemical Co., Ltd.) and the like.

A compound exhibiting a crosslinking function obtained by replacing a hydrogen atom of an acid functional group in the copolymer (A2) with the above-mentioned crosslinkable functional group can also be suitably used as a crosslinking agent. The amount of the crosslinkable functional group introduced is usually 5–60 mol %, preferably 10–50 mol %, and still more preferably 15–40 mol % of the total acid functional groups in the copolymer (A2), although the specific percentage varies depending on types of crosslinkable functional group and the alkali-soluble resin into which the crosslinkable functional group is introduced. The amount of crosslinkable functional group less than 5 mol % may decrease the rate of residual coatings and tends to induce meandering and swelling of the patterns. If the amount exceeds 60 mol %, developability of exposed areas tends to decrease.

Methoxymethyl group-containing compounds such as dimethoxymethyl urea and tetramethoxymethyl glycoluril are particularly preferable as the crosslinking agent. These crosslinking agents may be used either individually or in combination of two or more.

Other Additives

It is preferable to add an acid diffusion controller to the positive tone radiation-sensitive resin composition of the present invention. The acid diffusion controller controls diffusion of an acid generated from the acid generator upon exposure in the resist film to hinder undesired chemical reactions in the unexposed area.

Use of such an acid diffusion controller improves the storage stability of the composition and resolution as a resist. Moreover, line width change of the resist pattern due to fluctuation of PED can be controlled, whereby remarkably superior process stability can be achieved.

As the acid diffusion controller, organic compounds containing nitrogen of which the basicity does not change during exposure or heating for forming a resist pattern are preferable.

As examples of such nitrogen-containing organic compounds, a compound shown by the following formula (20) (hereinafter called "nitrogen-containing compound (I)"),

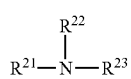

(20)

wherein $R^{21}$, $R^{22}$, and $R^{23}$ individually represent a hydrogen atom, alkyl group having 1–15 carbon atoms, aryl group having 6–15 carbon atoms, or aralkyl group having 7–15 carbon atoms, a diamino compound having two nitrogen atoms in the molecule (hereinafter referred to as "nitrogen-containing compound (II)"), a diamino polymer having three or more nitrogen atoms in the molecule (hereinafter referred to as "nitrogen-containing compound (III)"), an amide group-containing compound, urea compound, nitrogen-containing heterocyclic compound, and the like can be given.

Examples of the nitrogen-containing compound (I) include monoalkylamines such as n-hexylamine, n-heptylamine, n-octylamine, n-nonylamine, and n-decylamine; dialkylamines such as di-n-butylamine, di-n-pentylamine, di-n-hexylamine, di-n-heptylamine, di-n-octylamine, di-n-nonylamine, and di-n-decylamine; trialkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, and tri-n-dodecylamine; aromatic amines such as aniline, N-methylaniline, N,N-dimethylaniline, 2-methylaniline, 3-methylaniline, 4-methylaniline, 4-nitroaniline, diphenylamine, triphenylamine, and 1-naphthylamine; and trialcoholamines such as triethanolamine.

Examples of the nitrogen-containing compounds (II) include ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2'-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, and the like.

As examples of the nitrogen-containing compound (III), polyethyleneimine, polyallylamine, and the like can be given.

Examples of compounds containing an amide group include formamide, N-methylformamide, N,N-dimethylformamide, acetamide, N-methylacetamide, N,N-dimethylacetamide, propionamide, benzamide, pyrrolidone, N-methylpyrrolidone, and the like.

Examples of urea compounds include urea, methylurea, 1,1-dimethylurea, 1,3-dimethylurea, 1,1,3,3-tetramethylurea, 1,3-diphenylurea, tributylthiourea, and the like.

Examples of the nitrogen-containing heterocyclic compounds include imidazoles such as imidazole, benzimidazole, 4-methylimidazole, 4-methyl-2-phenylimidazole, 2-phenylbenzimidazole, 1-t-butoxycarbonyloxy-2-phenylbenzimidazole; pyridines such as pyridine, 2-methylpyridine, 4-methylpyridine, 2-ethylpyridine, 4-ethylpyridine, 2-phenylpyridine, 4-phenylpyridine, N-methyl-4-phenylpyridine, nicotine, nicotinic acid, nicotinamide, nicotinbenzyl, quinoline, 8-oxyquinoline, and acridine; pyrazine, pyrazole, pyridazine, quinoxaline, purine, pyrrolidine, piperidine, piperidine ethanol, morpholine, 4-methylmorpholine, piperazine, 1,4-dimethylpiperazine, 1,4-diazabicyclo[2.2.2]octane; and the like.

Of these nitrogen-containing organic compounds, the nitrogen-containing compound (I) and the nitrogen-containing heterocyclic compound are preferable. Trialkylamines are particularly preferable among the nitrogen-containing compound (I), and pyridines are particularly preferable among the nitrogen-containing heterocyclic compounds.

In the present invention, the acid diffusion controllers can be used either individually or in combination of two or more.

The amount of the acid diffusion controller to be used is usually 0.001–15 parts by weight, preferably 0.001–10 parts by weight, and still more preferably 0.005–5 parts by weight for 100 parts by weight of the copolymer components. If the amount of the acid diffusion controller is to small, resolution as a resist and PED stability tends to be impaired; if too large, sensitivity as a resist and developability of exposed areas tend to decrease.

If necessary, a surfactant may be added to the positive tone radiation-sensitive resin composition of the present invention to improve coatability of the composition, striation, developability as a resist, and the like.

Examples of such a surfactant include polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate; and commercially available products such as FTOP EF301, EF303, EF352 (manufactured by TOHKEM PRODUCTS CORPORATION), MEGAFAC F171, F173 (manufactured by Dainippon Ink and Chemicals, Inc.), Fluorad FC430, FC431 (manufactured by Sumitomo 3M Ltd.), Asahi Guard AG710, Surflon S-382, SC-101, SC-102, SC-103, SC-104, SC-105, SC-106 (manufactured by Asahi Glass Co., Ltd.), KP341 (manufactured by Shin-Etsu Chemical Co., Ltd.), and Polyflow No. 75, No. 95 (manufactured by Kyoeisha Chemical Co., Ltd.).

The amount of the surfactants to be added is usually 2 parts by weight or less for 100 parts by weight of the copolymer components.

In addition, a sensitizer may be added to the positive tone or negative tone radiation sensitive composition of the present invention. The sensitizer absorbs energy of radiation and transmits the energy to the acid generator, thereby increasing the amount of an acid to be generated upon exposure. The sensitizer also improves apparent sensitivity of a resist.

As preferable examples of the sensitizers, benzophenones, rose bengals, anthracenes, carbazoles, and the like can be given.

The amount of sensitizers to be added is usually 50 parts by weight or less for 100 parts by weight of the component (A).

In addition, a dye and/or a pigment may be added to visualize latent images of exposed areas and to reduce the effect of halation during exposure. An adhesion adjuvant may be added to improve adhesiveness to the substrate.

As other additives, halation inhibitors such as 4-hydroxy-4'-methylchalcone, form improvers, preservation stabilizers, antifoaming agents, and the like can also be added.

Preparation and Use of Composition

The radiation-sensitive resin composition of the present invention is prepared into a composition solution when used by homogeneously dissolving the composition in a solvent so that the total solid concentration is 5–50 wt %, and preferably 10–40 wt %, and filtering the solution using a filter with a pore diameter of about 0.2 µm.

Examples of solvents used for the preparation of the composition solution include: ethylene glycol monoalkyl ether acetates such as ethylene glycol monomethyl ether acetate, ethylene glycol monoethyl ether acetate, ethylene glycol mono-n-propyl ether acetate, and ethylene glycol mono-n-butyl ether acetate; propylene glycol monoalkyl ethers such as propylene glycol monomethyl ether, propylene glycol monoethyl ether, propylene glycol mono-n-propyl ether, and propylene glycol mono-n-butyl ether; propylene glycol dialkyl ethers such as propylene glycol dimethyl ether, propylene glycol diethyl ether, propylene glycol di-n-propyl ether, and propylene glycol di-n-butyl ether; propylene glycol monoalkyl ether acetates such as propylene glycol monomethyl ether acetate, propylene glycol monoethyl ether acetate, propylene glycol mono-n-propyl ether acetate, and propylene glycol mono-n-butyl ether acetate; lactic acid esters such as methyl lactate, ethyl lactate, n-propyl lactate, and i-propyl lactate; aliphatic carboxylic acid esters such as n-amyl formate, i-amyl formate, ethyl acetate, n-propyl acetate, i-propyl acetate, n-butyl acetate, i-butyl acetate, n-amyl acetate, i-amyl acetate, i-propyl propionate, n-butyl propionate, and i-butyl propionate; other esters such as ethyl hydroxyacetate, ethyl. 2-hydroxy-2-methylpropionate, methyl 2-hydroxy-3-methylbutyrate, ethyl methoxyacetate, ethyl ethoxyacetate, methyl 3-methoxypropionate, ethyl 3-methoxypropionate, methyl 3-ethoxypropionate, ethyl 3-ethoxypropionate, butyl 3-methoxyacetate, butyl 3-methyl-3-methoxyacetate, butyl 3-methyl-3-methoxypropionate, butyl 3-methyl-3-methoxybutyrate, methyl acetoacetate, ethyl acetoacetate, methyl pyruvate, and ethyl pyruvate; aromatic hydrocarbons such as toluene and xylene; ketones such as methyl ethyl ketone, methyl propyl ketone, methyl butyl ketone, 2-heptanone, 3-heptanone, 4-heptanone, and cyclohexanone; amides such as N-methylformamide, N,N-dimethylformamide, N-methylacetamide, N,N-dimethyl acetamide, and N-methylpyrrolidone; and lactones such as γ-butyrolactone.

These solvents may be used either individually or in combinations of two or more.

Formation of Resist Patterns

A resist pattern is formed from the radiation-sensitive resin composition of the present invention by applying the composition solution prepared as mentioned above to substrates such as a silicon wafer or a wafer covered with aluminum using an appropriate application method such as rotational coating, cast coating, and roll coating to form a resist film. The resist film is then optionally heated at a temperature of about 70–160° C. (hereinafter referred to as "pre-bake") and exposed to light through a predetermined mask pattern. Radiation used here can be appropriately selected according to the types of acid generator from among ultraviolet rays such as i-line (wavelength: 365 mm), ultraviolet rays such as ArF excimer laser (wavelength: 193 nm) or KrF excimer laser (wavelength: 248 nm), X-rays such as synchrotron radiation, and charged particle rays such as electron beams. The exposure conditions such as the amount of exposure are appropriately determined depending on the composition of the radiation-sensitive resin composition, types of additives, and the like.

In the present invention, it is preferable to heat the resist at 90–160° C. for 30 second or more after exposure (hereinafter referred to as "post-exposure bake") in order to stably form high precision resist patterns exhibiting excellent resolution, developability, and pattern form, free from a pattern skirting problem, and exhibiting superior PED. If the temperature for post-exposure bake is less than 90° C., not only the effect of PED stability tends to be impaired, but also resist patterns tend to produce a skirt according to the resist pattern forming conditions such as a resist thickness when the patterns are formed on an SiN substrate or a BPSG substrate having an $SiO_2$ film in which ions such as boron ions phosphorous ions are injected. Such a resin composition may not be used in actual devices.

The exposed resist film is then developed using an alkaline developer at 10–50° C. for 30–200 seconds to form a predetermined resist pattern.

As the alkaline developer, an alkaline aqueous solution prepared by dissolving an alkali such as an alkali metal hydroxide, aqueous ammonia, mono-, di-, or tri-alkylamine, mono-, di-, or tri-alkanolamine, heterocyclic amine, tetraalkylammonium hydroxide, choline, 1,8-diazabicyclo [5.4.0]-7-undecene, or 1,5-diazabicyclo[4.3.0]-5-nonene to a concentration of 1–10 wt %, and preferably 1–5 wt % can be used.

Moreover, an appropriate amount of a water-soluble organic solvent such as methanol and ethanol or a surfactant can be added to the developer comprising the above alkaline aqueous solution.

When using the developer comprising the alkaline aqueous solution, the resist film is washed with water after development.

When forming a resist pattern, a protective film may be provided on the resist film in order to prevent an adverse effect of basic impurities and the like which are present in the environmental atmosphere.

EXAMPLES

The embodiments of the present invention will be described in more detail by examples. However, these examples should not be construed as limiting the present invention.

Synthesis Examples of Component (A1)

Synthesis Example 1

86 g of p-acetoxystyrene, 5 g of styrene, 40 g of p-t-butoxystyrene, 11 g of N,N-dimethylacrylamide, 6 g of azobisisobutyronitrile (hereinafter referred to as "AIBN"), and 1 g of t-dodecylmercaptan were dissolved in 160 g of propylene glycol monomethyl ether. The mixture was polymerized for 16 hours at 70° C. in a nitrogen atmosphere. After polymerization, the reaction solution was added dropwise to a large quantity of hexane to coagulate and purify the resulting resin. After the addition of 150 g of propylene glycol monomethyl ether to the resin, 300 g of methanol, 80 g of triethylamine, and 15 g of water were added. The mixture was hydrolyzed for 8 hours while refluxing at the boiling point. After the reaction, the solvent and triethylamine were evaporated under reduced pressure. The resulting resin was dissolved in acetone and was added dropwise to a large quantity of water to coagulate the resin. The resulting white powder was filtered and dried overnight at 50° C. under reduced pressure.

The resin was found to have Mw and Mw/Mn of 16,000 and 1.7 respectively. The result of $^{13}$C-NMR analysis confirmed that the copolymerization molar ratio of p-hydroxystyrene, styrene, p-t-butoxystyrene, and N,N-dimethylacrylamide of the copolymer was 62:5:23:10. This resin is referred to as a "resin (A-1)".

Synthesis Example 2

80 g of p-acetoxystyrene, 19 g of t-butylacrylate, 35 g of p-t-butoxystyrene, 11 g of N,N-dimethylacrylamide, 6 g of AIBN, and 1 g of t-dodecylmercaptan were dissolved in 230 g of propylene glycol monomethyl ether. The mixture was polymerized for 16 hours at 70° C. in a nitrogen atmosphere. After polymerization, the reaction solution was added dropwise to a large quantity of hexane to coagulate and purify the resulting resin. After the addition of 150 g of propylene glycol monomethyl ether to the purified resin, 300 g of methanol, 80 g of triethylamine, and 15 g of water were added. The mixture was hydrolyzed for eight hours while refluxing at a boiling point. After the reaction, the solvent and triethylamine were evaporated under reduced pressure. The resulting resin was dissolved in acetone and added dropwise to a large quantity of water to coagulate the resin. The resulting white powder was filtered and dried overnight at 50° C. under reduced pressure.

The resin was found to have Mw and Mw/Mn of 11,500 and 1.6 respectively. The result of $^{13}$C-NMR analysis confirmed that the copolymerization molar ratio of p-hydroxystyrene, t-butyl acrylate, p-t-butoxystyrene, and N,N-dimethylacrylamide of the copolymer was 55:15:20:10. This resin is referred to as a "resin (A-2)".

Synthesis Example 3

91 g of p-acetoxystyrene, 50 g of p-t-butoxystyrene, 11 g of N,N-dimethylacrylamide, 6 g of AIBN, and 1 g of t-dodecylmercaptan were dissolved in 160 g of propylene glycol monomethyl ether. The mixture was polymerized for 16 hours at 70° C. in a nitrogen atmosphere. After polymerization, the reaction solution was added dropwise to a large quantity of hexane to coagulate and purify the resulting resin. After the addition of 150 g of propylene glycol monomethyl ether to the resin, 300 g of methanol, 80 g of triethylamine, and 15 g of water were added. The mixture was hydrolyzed for 8 hours while refluxing at the boiling point. After the reaction, the solvent and triethylamine were evaporated under reduced pressure. The resulting resin was dissolved in acetone and added dropwise to a large quantity of water to coagulate the resin. The resulting white powder was filtered and dried overnight at 50° C. under reduced pressure.

The resin was found to have Mw and Mw/Mn of 16,000 and 1.7 respectively. The result of $^{13}$C-NMR analysis confirmed that the copolymerization ratio of p-hydroxystyrene, p-t-butoxystyrene, and N,N-dimethylacrylamide of the copolymer was 62:28:10. This resin is referred to as a "resin (A-3)".

Synthesis Example 4

146 g of p-acetoxystyrene, 11 g of N,N-dimethylacrylamide, 6 g of AIBN, and 1 g of t-dodecylmercaptan were dissolved in 160 g of propylene glycol monomethyl ether. The mixture was polymerized for 16 hours at 70° C. in a nitrogen atmosphere. After polymerization, the reaction solution was added dropwise to a large quantity of hexane to coagulate and purify the resulting resin. After the addition of 150 g of propylene glycol monomethyl ether to the resin, 300 g of methanol, 80 g of triethylamine, and 15 g of water were added. The mixture was hydrolyzed for 8 hours while refluxing at the boiling point. After the reaction, the solvent and triethylamine were evaporated under reduced pressure. The resulting resin was dissolved in acetone and added dropwise to a large quantity of water to coagulate the resin. The resulting white powder was filtered and dried overnight at 50° C. under reduced pressure.

The resin was found to have Mw and Mw/Mn of 16,000 and 1.7 respectively. The result of $^{13}$C-NMR analysis confirmed that the copolymerization ratio of p-hydroxystyrene and N,N-dimethylacrylamide was 90:10. This resin is referred to as a "resin (A-4)".

Synthesis Example 5

86 g of p-acetoxystyrene, 5 g of styrene, 40 g of p-t-butoxystyrene, 28 g of 1-acryloyl-2-phenylbenzimidazole, 6 g of AIBN, and 1 g of t-dodecylmercaptan were dissolved in 160 g of propylene glycol monomethyl ether. The mixture was polymerized for 16 hours at 70° C. in a nitrogen atmosphere. After polymerization, the reaction solution was added dropwise to a large quantity of hexane to coagulate and purify the resulting resin. After the addition of 150 g of propylene glycol monomethyl ether to the resin, 300 g of methanol, 80 g of triethylamine, and 15 g of water were added. The mixture was hydrolyzed for 8 hours while refluxing at the boiling point. After the reaction, the solvent and triethylamine were evaporated under reduced pressure. The resulting resin was dissolved in acetone and added dropwise to a large quantity of water to coagulate the resin. The resulting white powder was filtered and dried overnight at 50° C. under reduced pressure.

The resin was found to have Mw and Mw/Mn of 16,000 and 1.7 respectively. The result of $^{13}$C-NMR analysis confirmed that the copolymerization molar ratio of p-hydroxystyrene, styrene, p-t-butoxystyrene, and 1-acryloyl-2-phenylbenzimidazole of the copolymer was 62:5:23:10. This resin is referred to as a "resin (A-5)".

Synthesis Example 6

80 g of p-acetoxystyrene, 19 g of t-butylacrylate, 35 g of p-t-butoxystyrene, 28 g of 1-acryloyl-2-phenylbenzimidazole, 6 g of AIBN, and 1 g of t-dodecylmercaptan were dissolved in 230 g of propylene glycol monomethyl ether. The mixture was polymerized for 16 hours at 70° C. in a nitrogen atmosphere. After polymerization, the reaction solution was added dropwise to a large quantity of hexane to coagulate and purify the resulting resin. After the addition of 150 g of propylene glycol monomethyl ether to the purified resin, 300 g of methanol, 80 g of triethylamine, and 15 g of water were added. The mixture was hydrolyzed for eight hours while refluxing at a boiling point. After the reaction, the solvent and triethylamine were evaporated under reduced pressure. The resulting resin was dissolved in acetone and added dropwise to a large quantity of water to coagulate the resin. The resulting white powder was filtered and dried overnight at 50° C. under reduced pressure.

The resin was found to have Mw and Mw/Mn of 11,500 and 1.6 respectively. The result of $^{13}$C-NMR analysis confirmed that the copolymerization molar ratio of p-hydroxystyrene, t-butyl acrylate, p-t-butoxystyrene, and 1-acryloyl-2-phenylbenzimidazole of the copolymer was 55:15:20:10. This resin is referred to as a "resin (A-6)".

Synthesis Example 7

91 g of p-acetoxystyrene, 50 g of p-t-butoxystyrene, 14 g of 1-acryloyl imidazole, 6 g of AIBN, and 1 g of t-dodecylmercaptan were dissolved in 160 g of propylene glycol monomethyl ether. The mixture was polymerized for 16 hours at 70° C. in a nitrogen atmosphere. After polymerization, the reaction solution was added dropwise to a large quantity of hexane to coagulate and purify the resulting resin. After the addition of 150 g of propylene glycol monomethyl ether to the resin, 300 g of methanol, 80 g of triethylamine, and 15 g of water were added. The mixture was hydrolyzed for 8 hours while refluxing at the boiling point. After the reaction, the solvent and triethylamine were evaporated under reduced pressure. The resulting resin was dissolved in acetone and added dropwise to a large quantity of water to coagulate the resin. The resulting white powder was filtered and dried overnight at 50° C. under reduced pressure.

The resin was found to have Mw and Mw/Mn of 16,000 and 1.7 respectively. The result of $^{13}$C-NMR analysis confirmed that the copolymerization ratio of p-hydroxystyrene, p-t-butoxystyrene, and 1-acryloyl imidazole of the copolymer was 62:28:10. This resin is referred to as a "resin (A-7)".

Synthesis Example 8

146 g of p-acetoxystyrene, 28 g of 1-acryloyl-2-phenylbenzimidazole, 6 g of AIBN, and 1 g of t-dodecylmercaptan were dissolved in 160 g of propylene glycol monomethyl ether. The mixture was polymerized for 16 hours at 70° C. in a nitrogen atmosphere. After polymerization, the reaction solution was added dropwise to a large quantity of hexane to coagulate and purify the resulting resin. After the addition of 150 g of propylene glycol monomethyl ether to the resin, 300 g of methanol, 80 g of triethylamine, and 15 g of water were added. The mixture was hydrolyzed for 8 hours while refluxing at the boiling point. After the reaction, the solvent and triethylamine were evaporated under reduced pressure. The resulting resin was dissolved in acetone and added dropwise to a large quantity of water to coagulate the resin. The resulting white powder was filtered and dried overnight at 50° C. under reduced pressure.

The resin was found to have Mw and Mw/Mn of 16,000 and 1.7 respectively. The result of $^{13}$C-NMR analysis confirmed that the copolymerization ratio of p-hydroxystyrene and 1-acryloyl-2-phenylbenzimidazole was 90:10. This resin is referred to as a "resin (A-8)".

Synthesis Example 9

101 g of p-acetoxystyrene, 5 g of styrene, 42 g of p-t-butoxystyrene, 6 g of AIBN, and 1 g of t-dodecylmercaptan were dissolved in 160 g of propylene glycol monomethyl ether. The mixture was polymerized for 16 hours at 70° C. in a nitrogen atmosphere. After polymerization, the reaction solution was added dropwise to a large quantity of hexane to coagulate and purify the resulting resin. After the addition of 150 g of propylene glycol monomethyl ether to the resin, 300 g of methanol, 80 g of triethylamine, and 15 g of water were added. The mixture was hydrolyzed for 8 hours while refluxing at the boiling point. After the reaction, the solvent and triethylamine were evaporated under reduced pressure. The resulting resin was dissolved in acetone and added dropwise to a large quantity of water to coagulate the resin. The resulting white powder was filtered and dried overnight at 50° C. under reduced pressure.

The resin was found to have Mw and Mw/Mn of 16,000 and 1.7 respectively. The result of $^{13}$C-NMR analysis confirmed that the copolymerization molar ratio of p-hydroxystyrene, styrene, and p-t-butoxystyrene of the copolymer was 72:5:23. This resin is referred to as a "resin (a-1)".

Synthesis Example 10

100 g of p-acetoxystyrene, 25 g of t-butyl acrylate, 18 g of styrene, 6 g of AIBN, and 1 g of t-dodecylmercaptan were dissolved in 230 g of propylene glycol monomethyl ether. The mixture was polymerized for 16 hours at 70° C. in a nitrogen atmosphere. After polymerization, the reaction solution was added dropwise to a large quantity of hexane to coagulate and purify the resulting resin. After the addition of 150 g of propylene glycol monomethyl ether to the resin, 300 g of methanol, 80 g of triethylamine, and 15 g of water were added. The mixture was hydrolyzed for 8 hours while refluxing at the boiling point. After the reaction, the solvent and triethylamine were evaporated under reduced pressure. The resulting resin was dissolved in acetone and added dropwise to a large quantity of water to coagulate the resin. The resulting white powder was filtered and dried overnight at 50° C. under reduced pressure.

The resin was found to have Mw and Mw/Mn of 11,500 and 1.6 respectively. The result of $^{13}$C-NMR analysis confirmed that the copolymerization molar ratio of p-hydroxystyrene, t-butyl acrylate, and styrene of the copolymer was 61:19:20. This resin is referred to as a "resin (a-2)".

Synthesis Example 11

125 g of p-acetoxystyrene, 20 g of t-butyl acrylate, 10 g of styrene, 8 g of 2,5-dimethylhexane-2,5-diacrylate, 8 g of AIBN, and 6 g of t-dodecylmercaptan were dissolved in 170 g of propylene glycol monomethyl ether. The mixture was polymerized for 16 hours while maintaining the reaction temperature at 70° C. in a nitrogen atmosphere. After polymerization, the reaction solution was added dropwise to a large quantity of hexane to coagulate and purify the resulting resin. After the addition of 150 g of propylene glycol monomethyl ether to the resin, 300 g of methanol, 80 g of triethylamine, and 15 g of water were added. The mixture was hydrolyzed for 8 hours while refluxing at the boiling point. After the reaction, the solvent and triethylamine were evaporated under reduced pressure. The resulting resin was dissolved in acetone and added dropwise to a large quantity of water to coagulate the resin. The resulting white powder was filtered and dried overnight at 50° C. under reduced pressure.

The resin was found to have Mw and Mw/Mn of 40,000 and 2.6, respectively. The result of $^{13}$C-NMR analysis confirmed that the copolymerization molar ratio of p-hydroxystyrene, t-butyl acrylate, styrene, and 2,5-dimethylhexane-2,5-diacrylate of the copolymer was 72:10:15:3. This resin is referred to as a "resin (a-3)".

Synthesis Example 12

140 g of p-acetoxystyrene, 50 g of p-t-butoxystyrene, 9 g of 2,5-dimethylhexane-2,5-diacrylate, 8 g of AIBN, and 6 g of t-dodecylmercaptan were dissolved in 240 g of propylene glycol monomethyl ether. The mixture was polymerized for 16 hours at 70° C. in a nitrogen atmosphere. After polymerization, the reaction solution was added dropwise to a large quantity of hexane to coagulate and purify the resulting resin. After the addition of 150 g of propylene glycol monomethyl ether to the purified resin, 300 g of methanol, 100 g of triethylamine, and 15 g of water were added. The mixture was hydrolyzed for one hour while refluxing at a boiling point. After the reaction, the solvent and triethylamine were evaporated under reduced pressure. The resulting resin was dissolved in acetone and added dropwise to a large quantity of water to coagulate the resin. The resulting white powder was filtered and dried overnight at 50° C. under reduced pressure.

The resin was found to have Mw and Mw/Mn of 40,000 and 2.6 respectively. The result of $^{13}$C-NMR analysis confirmed that the copolymerization molar ratio of p-hydroxystyrene, p-t-butoxystyrene, and 2,5-hexanedimethanoldiacrylate of the copolymer was 67:30:3. This resin is referred to as a "resin (a-4)".

Synthesis Example 13

176 g of p-t-butoxystyrene was anionically polymerized at −78° C. in 500 ml of tetrahydrofuran using s-butyllithium as a catalyst. After polymerization, the resulting resin solution was coagulated in methanol to obtain 150 g of white poly(p-t-butoxystyrene). The poly(p-t-butoxystyrene) was dissolved in 600 g of dioxane. After the addition of diluted hydrochloric acid, the mixture was hydrolyzed at 70° C. for 2 hours. The reaction product was caused to coagulate in a large quantity of water to obtain a white resin. A step of dissolving the resulting resin in acetone and adding dropwise to a large quantity of water to coagulate the resin was repeated. The resulting white powder was filtered and dried overnight at 50° C. under reduced pressure.

The Mw and Mw/Mn of this resin were 10,400 and 1.01, respectively. $^{13}$C-NMR analysis confirmed that only part of t-butyl group in the poly(p-t-butoxystyrene) had a hydrolyzed structure and the molar ratio of p-t-butoxystyrene and p-hydroxystyrene was 68:32. This resin is referred to as a "resin (a-5)".

Synthesis Example 14

7 g of di-t-butyl carbonate was added to a solution in which 12 g of poly(p-hydroxystyrene) and 5 g of triethylamine were dissolved in 50 g of dioxane while stirring. The mixture was stirred for 6 hours at room temperature. Oxalic acid was then added to neutralize triethylamine. The reaction solution was dropped into a large quantity of water to coagulate the resin. The coagulated resin was washed with purified water several times. The resin was then filtered and dried at 50° C. overnight under reduced pressure.

Mw and Mw/Mn of this resin were respectively 9,200 and 1.8. As a result of $^{13}$C-NMR analysis, the resin was found to have a structure in which 30 mol % of hydrogen atoms of a phenolic hydroxyl group in poly(p-hydroxystyrene) was replaced by t-butoxycarbonyl groups. This resin is referred to as a "resin (a-6)".

Synthesis Example 15

176 g of p-t-butoxystyrene was anionically polymerized at −78° C. in 500 ml of tetrahydrofuran using s-butyllithium as a catalyst. After polymerization, the resulting resin solution was coagulated in methanol to obtain 150 g of white poly(p-t-butoxystyrene). The poly(4-t-butoxystyrene) was dissolved in 600 g of dioxane. After the addition of diluted hydrochloric acid, the mixture was hydrolyzed at 70° C. for 12 hours. The reaction product was caused to coagulate in a large quantity of water to obtain a white resin. A step of dissolving the resulting resin in acetone and adding dropwise to a large quantity of water to coagulate the resin was repeated. The resulting white powder was filtered and dried overnight at 50° C. under reduced pressure.

The resin was confirmed to be poly(p-hydroxystyrene) having Mw of 11,400 and Mw/Mn of 1.01.

Then, 24 g of this poly(p-hydroxystyrene) was dissolved in 100 g of n-butyl acetate. Nitrogen gas was bubbled through the mixture for 30 minutes. After the addition of 8 g of cyclohexyl vinyl ether and 1 g of pyridinium p-toluenesulfonate as a catalyst, the mixture was allowed to react at room temperature for 12 hours. The reaction solution was dropped into a large quantity of 1 wt % ammonium aqueous solution to coagulate the resin. The resin was filtered and dried overnight in a vacuum drier at 50° C.

Mw and Mw/Mn of this resin were respectively 13,000 and 1.01. As a result of $^{13}$C-NMR analysis, the resin was found to have a structure in which 23 mol % of hydrogen atoms of a phenolic hydroxyl group in poly(p-hydroxystyrene) was replaced by 1-cyclohexyloxyethyl groups. This resin is referred to as a "resin (a-7)".

Synthesis Example 16

24 g of poly(p-hydroxystyrene) with Mw of 12,000 was dissolved in 100 g of dioxane. Nitrogen gas was bubbled through the mixture for 30 minutes. After the addition of 3 g of ethyl vinyl ether and 3 g of ethyl-1-propenyl ether, and 1 g of pyridinium p-toluenesulfonate as a catalyst, the mixture was reacted for 12 hours at room temperature. The reaction solution was dropped into a large quantity of 1 wt % ammonium aqueous solution to coagulate the resin. The resin was filtered and dried overnight in a vacuum drier at 50° C.

Mw and Mw/Mn of this resin were respectively 15,000 and 1.6. As a result of $^{13}$C-NMR analysis, the resin was found to have a structure in which 20 mol % of hydrogen atoms of a phenolic hydroxyl group in poly(p-hydroxystyrene) was replaced by 1-ethoxyethyl groups, and 15 mol % by 1-ethoxy propyl groups. This resin is referred to as a "resin (a-8)".

Synthesis Example 17

25 g of a copolymer of p-hydroxystyrene and p-t-butoxystyrene was dissolved in 100 g of n-butyl acetate. Nitrogen gas was bubbled through the mixture for 30 minutes. After the addition of 3.3 g of ethyl vinyl ether and 1 g of pyridinium p-toluenesulfonate as a catalyst, the mixture was reacted at room temperature for 12 hours. The reaction solution was dropped into a large quantity of 1 wt % ammonium aqueous solution to coagulate the resin. The resin was filtered and dried overnight in a vacuum drier at 50° C.

Mw and Mw/Mn of this resin were respectively 13,000 and 1.01. As a result of $^{13}$C-NMR analysis, the resin was found to have a structure in which 23 mol % of hydrogen atoms of a phenolic hydroxyl group in poly(p-hydroxystyrene) was replaced by ethoxyethyl groups and 10 mol % by t-butyl groups. This resin is referred to as a "resin (a-10)".

Synthesis Example 18

114 g of p-acetoxystyrene, 19 g of t-butylacrylate, 32 g of p-t-butoxystyrene, 6 g of AIBN, and 1 g of t-dodecylmercaptan were dissolved in 230 g of propylene glycol monomethyl ether. The mixture was polymerized for 16 hours at 70° C. in a nitrogen atmosphere. After polymerization, the reaction solution was added dropwise to a large quantity of hexane to coagulate and purify the resulting resin. After the addition of 150 g of propylene glycol monomethyl ether to the purified resin, 300 g of methanol, 80 g of triethylamine, and 15 g of water were added. The mixture was hydrolyzed for eight hours while refluxing at a boiling point. After the reaction, the solvent and triethylamine were evaporated under reduced pressure. The resulting resin was dissolved in acetone and added dropwise to a large quantity of water to coagulate the resin. The resulting white powder was filtered and dried overnight at 50° C. under reduced pressure.

The resin was found to have Mw and Mw/Mn of 11,500 and 1.6 respectively. The result of $^{13}$C-NMR analysis confirmed that the copolymerization molar ratio of p-hydroxystyrene, t-butyl acrylate, and p-t-butoxystyrene of the copolymer was 65:15:20. This resin is referred to as a "resin (a-11)".

Acid Generator (B)
B-1: Bis(4-t-butylphenyl)iodonium nonafluoro-n-butanesulfonate
B-2: Bis(4-t-butylphenyl)iodonium 10-camphorsulfonate
B-3: Bis(4-t-butylphenyl)iodoniumtrifluoromethane sulfonate
B-4: n-Trifluoromethanesulfonyloxy-5-norbornene-2,3-dicarboxyimide
B-5: Bis(cyclohexylsulfonyl)diazomethane
B-6: Triphenylsulfoniumtrifluoromethanesulfonate
B-7: N-(10-Camphorsulfonyloxy)succinimide Crosslinking Agent (C)
C-1: Dimethoxymethylurea ("MX290" manufactured by Sanwa Chemical Co., Ltd.)
C-2: Tetramethoxymethyl glycoluril ("CYMEL 1174" manufactured by Mitsui° Cyanamid Co., Ltd.)

Acid Diffusion Control Agent
D-1: Tri-n-octylamine
D-2: Triethanolamine
D-3: 2-Phenylpyridine
D-4: N,N,N,N-Tetrakis(2-hydroxypropyl)ethylenediamine
D-5: 1-t-Butylcarbonyloxy-2-phenylbenzimidazole Alkali-soluble Resin (E)
E-1: Poly(p-hydroxystyrene) (Mw=7,500, Mw/Mn=1.1)
E-2: p-Hydroxystyrene/styrene copolymer (copolymerization ratio: 8:2, Mw=4,500, Mw/Mn=11)

Other Additives
F-1: Poly(p-hydroxystyrene) (Mw=3,000)
F-2: 2,2-Bis(4-t-butoxyphenyl)propane
F-3: 1-Adamantane carboxylic acid Solvent
G-1: Ethyl lactate
G-2: Ethyl 3-ethoxypropionate
G-3: Propylene glycol monoethyl ether <Chemically Amplified Positive Tone Radiation Sensitive Resin Composition>

Examples 1–40 and Comparative Examples 1–4

Components shown in Table 1 and Table 2 (part(s) indicates part(s) by weight) were mixed to prepare homogeneous solutions. The solutions were filtered through a membrane filter with a pore diameter of 0.2 μm to prepare solution compositions. The solution compositions were spin-coated on a silicon wafer and pre-baked under the conditions shown in Tables 3 and 4 to form a resist films with a thickness of 0.5 μm.

The resist films were exposed under the conditions shown in Tables 3 and 4 using a stepper "NSR2205 EX12B" (manufactured by Nikon Corp., numerical aperture: 0.55) in Examples 1–17, Examples 21–38, and Comparative Examples 1–3. In Examples 18–20, Examples 39–40, and Comparative Example 4, the resist films were exposed using an electron beam lithography system "HL700" (manufactured by Hitachi, Ltd., acceleration voltage: 30 KeV) in which the acceleration voltage was remodeled to 50 KeV. PEB was performed under the conditions shown in Tables 3 and 4. The resist films were developed at 23° C. for 1 minute by a paddle method using a 2.38 wt % tetramethyl ammonium hydroxide aqueous solution. The resist films were then washed with deionized water and dried to form a resist pattern. The evaluation results of each resist are shown in Tables 5 and 6.

TABLE 1

|  | Acid generator (parts) | Resin (parts) | Additives (parts) | Acid diffusion control agent (parts) | Solvent (parts) |
|---|---|---|---|---|---|
| Example 1 | B-1(2) B-3(2) | a-1(95) A-1(5) | F-3(0.1) | D-4(0.2) | G-1(200) |
| Example 2 | B-4(8) | a-1(90), A-1(10) | — | D-5(0.15) | G-1(200) |
| Example 3 | B-1(2) B-3(0.5) | a-11(95), A-3(5) | — | D-5(0.2) | G-1(160) G-3(40) |
| Example 4 | B-1(2) B-3(2) | a-4(80), A-2(20) | F-3(0.1) | D-4(0.2) | G-1(200) |
| Example 5 | B-4(6) | a-1(60), A-1(40) | — | D-5(0.2) | G-1(200) |
| Example 6 | B-1(2) B-2(2) | a-2(90) A-3(10) | — | D-5(0.2) | G-1(140) G-3(60) |

TABLE 1-continued

| | Acid generator (parts) | Resin (parts) | Additives (parts) | Acid diffusion control agent (parts) | Solvent (parts) |
|---|---|---|---|---|---|
| Example 7 | B-4(4) | a-3(80), A-3(20) | — | D-5(0.2) | G-1(140) G-3(60) |
| Example 8 | B-4(6) B-2(2) | a-4(80) A-3(20) | F-3(0.1) | D-2(0.2) | G-1(140) G-3(60) |
| Example 9 | B-3(4) | a-5(80), A-3(10) | — | D-5(0.1) | G-1(200) |
| Example 10 | B-4(6) | a-6(90), A-3(10) | — | D-5(0.1) | G-1(200) |
| Example 11 | B-5(1) | a-7(85) E-1(10), A-3(5) | — | D-2(0.2) | G-2(200) |
| Example 12 | B-5(1) | a-8(60) E-1(10), A-3(20) | F-3(0.2) | D-1(0.2) | G-1(140) G-2(60) |
| Example 13 | B-4(8) | a-1(90), A-4(10) | — | D-5(0.15) | G-1(200) |
| Example 14 | B-6(3) | a-10(70) E-2(20), A-3(10) | F-3(0.2) | D-1(0.1) D-2(0.1) | G-1(140) G-2(60) |
| Example 15 | B-1(2) B-3(0.5) | a-11(92) E-1(5), A-2(3) | — | D-5(0.2) | G-1(200) |
| Example 16 | B-5(4) | a-1(90), A-2(10) | — | D-5(0.2) | G-1(200) |
| Example 17 | B-5(4) | a-1(100), A-1(10) | — | D-5(0.15) | G-1(200) |
| Example 18 | B-6(5) | a-11(80), A-2(20) | F-2(5) | D-5(0.1) | G-1(140) G-3(60) |
| Example 19 | B-6(5) | a-4(90), A-3(10) | — | D-5(0.1) | G-1(200) |
| Example 20 | B-6(5) | a-1(100), A-1(10) | — | D-5(0.1) | G-1(200) |

TABLE 2

| | Acid generator (parts) | Resin (parts) | Additives (parts) | Acid diffusion control agent (parts) | Solvent (parts) |
|---|---|---|---|---|---|
| Example 21 | B-1(2) B-3(2) | a-1(95) A-5(5) | F-3(0.1) | D-4(0.2) | G-1(200) |
| Example 22 | B-4(8) | a-1(90), A-5(10) | — | D-5(0.15) | G-1(200) |
| Example 23 | B-1(2) B-3(0.5) | a-11(95), A-7(5) | — | D-5(0.2) | G-1(160) G-3(40) |
| Example 24 | B-1(2) B-3(2) | a-4(80), A-6(20) | F-3(0.1) | D-4(0.2) | G-1(200) |
| Example 25 | B-4(6) | a-1(60), A-5(40) | — | D-5(0.2) | G-1(200) |
| Example 26 | B-1(2) B-2(2) | a-2(90) A-7(10) | — | D-5(0.2) | G-1(140) G-3(60) |
| Example 27 | B-4(4) | a-3(80), A-7(20) | — | D-5(0.2) | G-1(140) G-3(60) |
| Example 28 | B-4(6) B-2(2) | a-4(80) A-7(20) | F-3(0.1) | D-2(0.2) | G-1(140) G-3(60) |
| Example 29 | B-3(4) | a-5(80), A-7(10) | — | D-5(0.1) | G-1(200) |
| Example 30 | B-4(6) | a-6(90), A-7(10) | — | D-5(0.1) | G-1(200) |
| Example 31 | B-5(1) | a-7(85) E-1(10), A-7(5) | — | D-2(0.2) | G-2(200) |
| Example 32 | B-5(1) | a-8(60) E-1(10), A-7(20) | F-3(0.2) | D-1(0.2) | G-1(140) G-2(60) |
| Example 33 | B-4(8) | a-1(90), A-8(10) | — | D-5(0.15) | G-1(200) |
| Example 34 | B-6(3) | a-10(70) E-2(20), A-7(10) | F-3(0.2) | D-1(0.1) D-2(0.1) | G-1(140) G-2(60) |
| Example 35 | B-1(2) B-3(0.5) | a-11(92) E-1(5), A-6(3) | — | D-5(0.2) | G-1(200) |
| Example 36 | B-5(4) | a-1(90), A-6(10) | — | D-5(0.2) | G-1(200) |
| Example 37 | B-5(4) | a-1(100), A-5(10) | — | D-5(0.15) | G-1(200) |
| Example 38 | B-4(5) B-7(5) B-2(1) | a-1(90), A-1 (10) | — | D-5(0.15) | G-1(140) G-3(60) |
| Example 39 | B-6(5) | a-4(90), A-7(10) | — | D-5(0.1) | G-1(200) |
| Example 40 | B-6(5) | a-1(100), A-5(10) | — | D-5(0.1) | G-1(200) |
| Comparative Example 1 | B-1(2) B-3(2) | a-4(100) | F-3(0.1) | D-4(0.2) | G-1(200) |
| Comparative Example 2 | B-3(8) | a-1(100) | — | D-5(0.2) | G-1(200) |
| Comparative Example 3 | B-4(6) B-2(2) | a-11(100) | — | D-5(0.2) | G-1(200) |
| Comparative Example 4 | B-6(3) B-4(4) | a-1(100) | — | D-5(0.15) | G-1(200) |

TABLE 3

|  | Pre-bake | | | Post-exposure bake | |
| --- | --- | --- | --- | --- | --- |
|  | Temperature (° C.) | Time (S) | Exposure source | Temperature (° C.) | Time (S) |
| Example 1 | 130 | 60 | KrF excimer laser | 130 | 60 |
| Example 2 | 130 | 60 | KrF excimer laser | 130 | 60 |
| Example 3 | 130 | 60 | KrF excimer laser | 130 | 60 |
| Example 4 | 130 | 60 | KrF excimer laser | 130 | 60 |
| Example 5 | 130 | 60 | KrF excimer laser | 130 | 60 |
| Example 6 | 110 | 60 | KrF excimer laser | 130 | 60 |
| Example 7 | 110 | 60 | KrF excimer laser | 130 | 60 |
| Example 8 | 130 | 60 | KrF excimer laser | 130 | 60 |
| Example 9 | 110 | 60 | KrF excimer laser | 100 | 60 |
| Example 10 | 90 | 60 | KrF excimer laser | 100 | 60 |
| Example 11 | 90 | 60 | KrF excimer laser | 100 | 60 |
| Example 12 | 90 | 60 | KrF excimer laser | 100 | 60 |
| Example 13 | 130 | 60 | KrF excimer laser | 130 | 60 |
| Example 14 | 90 | 60 | KrF excimer laser | 100 | 60 |
| Example 15 | 130 | 60 | KrF excimer laser | 130 | 60 |
| Example 16 | 130 | 60 | KrF excimer laser | 130 | 60 |
| Example 17 | 130 | 60 | KrF excimer laser | 130 | 60 |
| Example 18 | 110 | 60 | Electron beam | 130 | 60 |
| Example 19 | 110 | 60 | Electron beam | 130 | 60 |
| Example 20 | 110 | 60 | Electron beam | 130 | 60 |

TABLE 4

|  | Pre-bake | | | Post-exposure bake | |
| --- | --- | --- | --- | --- | --- |
|  | Temperature (° C.) | Time (S) | Exposure source | Temperature (° C.) | Time (S) |
| Example 21 | 130 | 60 | KrF excimer laser | 130 | 60 |
| Example 22 | 130 | 60 | KrF excimer laser | 130 | 60 |
| Example 23 | 130 | 60 | KrF excimer laser | 130 | 60 |
| Example 24 | 130 | 60 | KrF excimer laser | 130 | 60 |
| Example 25 | 130 | 60 | KrF excimer laser | 130 | 60 |
| Example 26 | 110 | 60 | KrF excimer laser | 130 | 60 |
| Example 27 | 110 | 60 | KrF excimer laser | 130 | 60 |
| Example 28 | 130 | 60 | KrF excimer laser | 130 | 60 |
| Example 29 | 110 | 60 | KrF excimer laser | 100 | 60 |
| Example 30 | 90 | 60 | KrF excimer laser | 100 | 60 |
| Example 31 | 90 | 60 | KrF excimer laser | 100 | 60 |
| Example 32 | 90 | 60 | KrF excimer laser | 100 | 60 |
| Example 33 | 130 | 60 | KrF excimer laser | 130 | 60 |
| Example 34 | 90 | 60 | KrF excimer laser | 100 | 60 |
| Example 35 | 130 | 60 | KrF excimer laser | 130 | 60 |
| Example 36 | 130 | 60 | KrF excimer laser | 130 | 60 |
| Example 37 | 130 | 60 | KrF excimer laser | 130 | 60 |
| Example 38 | 130 | 60 | KrF excimer laser | 130 | 60 |
| Example 39 | 110 | 60 | Electron beam | 130 | 60 |
| Example 40 | 110 | 60 | Electron beam | 130 | 60 |
| Comparative Example 1 | 130 | 60 | KrF excimer laser | 130 | 60 |
| Comparative Example 2 | 130 | 60 | KrF excimer laser | 130 | 60 |
| Comparative Example 3 | 130 | 60 | KrF excimer laser | 130 | 60 |
| Comparative Example 4 | 130 | 60 | Electron beam | 130 | 60 |

TABLE 5

|  | Sensitivity (mJ/cm$^2$) | Resolution (μm) | PED | Iso-dense bias | Storage stability |
| --- | --- | --- | --- | --- | --- |
| Example 1 | 25 | 0.20 | Good | Good | Good |
| Example 2 | 22 | 0.18 | Good | Good | Good |
| Example 3 | 24 | 0.19 | Good | Good | Good |
| Example 4 | 23 | 0.18 | Good | Good | Good |
| Example 5 | 23 | 0.17 | Good | Good | Good |
| Example 6 | 25 | 0.19 | Good | Good | Good |
| Example 7 | 24 | 0.20 | Good | Good | Good |
| Example 8 | 24 | 0.20 | Good | Good | Good |
| Example 9 | 23 | 0.20 | Good | Good | Good |
| Example 10 | 26 | 0.20 | Good | Good | Good |
| Example 11 | 23 | 0.20 | Good | Good | Good |
| Example 12 | 22 | 0.20 | Good | Good | Good |
| Example 13 | 22 | 0.21 | Good | Good | Good |
| Example 14 | 23 | 0.20 | Good | Good | Good |
| Example 15 | 25 | 0.18 | Good | Good | Good |
| Example 16 | 25 | 0.19 | Good | Good | Good |
| Example 17 | 24 | 0.17 | Good | Good | Good |
| Example 18 | 4 uC | 0.17 | Good | Good | Good |
| Example 19 | 5 uC | 0.17 | Good | Good | Good |
| Example 20 | 3 uC | 0.18 | Good | Good | Good |

TABLE 6

|  | Sensitivity (mJ/cm$^2$) | Resolution (μm) | PED | Iso-dense bias | Storage stability |
| --- | --- | --- | --- | --- | --- |
| Example 21 | 25 | 0.19 | Good | Good | Good |
| Example 22 | 22 | 0.18 | Good | Good | Good |
| Example 23 | 24 | 0.18 | Good | Good | Good |
| Example 24 | 23 | 0.18 | Good | Good | Good |
| Example 25 | 23 | 0.17 | Good | Good | Good |
| Example 26 | 25 | 0.19 | Good | Good | Good |
| Example 27 | 24 | 0.20 | Good | Good | Good |
| Example 28 | 24 | 0.20 | Good | Good | Good |
| Example 29 | 23 | 0.20 | Good | Good | Good |
| Example 30 | 26 | 0.19 | Good | Good | Good |
| Example 31 | 23 | 0.20 | Good | Good | Good |
| Example 32 | 22 | 0.20 | Good | Good | Good |
| Example 33 | 22 | 0.19 | Good | Good | Good |
| Example 34 | 23 | 0.19 | Good | Good | Good |
| Example 35 | 25 | 0.17 | Good | Good | Good |
| Example 36 | 25 | 0.18 | Good | Good | Good |
| Example 37 | 24 | 0.18 | Good | Good | Good |
| Example 38 | 30 | 0.17 | Good | Good | Good |
| Example 39 | 5 uC | 0.14 | Good | Good | Good |
| Example 40 | 3 uC | 0.14 | Good | Good | Good |
| Comparative Example 1 | 34 | 0.22 | Good | Bad | Good |
| Comparative Example 2 | 27 | 0.20 | Bad | Bad | Good |
| Comparative Example 3 | 26 | 0.22 | Bad | Bad | Bad |
| Comparative Example 4 | 5 uC | 0.22 | Bad | Good | Bad |

Measurement of Mw and Mn in the above Examples 1–40, Comparative Examples 1–4 and the following Examples 21–23 and Comparative Example 5, and evaluation of each composition were carried out as follows.

Mw and Mn

Mw was measured by gel permeation chromatography (GPC) using GPC columns (manufactured by Tosoh Corp., G2000HXL×2, G3000HXL×1, G4000HXL×1) under the following conditions. Flow rate: 1.0 ml/minute, eluate: tetrahydrofuran, column temperature: 40° C., standard reference material: monodispersed polystyrene Sensitivity Sensitivity was evaluated based on an optimum exposure dose which is a dose capable of forming a 1:1 line and space pattern (1L1S) with a line width of 0.22 μm, when a resist film formed on a silicon wafer is exposed to light, immediately followed by baking, alkali development, washing with water, and drying.

Resolution (1L1S)

A minimum dimension of line-and-space patterns (1L1S) resolved at an optimum dose at which a 1:1 1L1S with a line width of 0.25 µm is formed is taken as a standard for resolution.

Iso-dense Bias

An iso-dense bias was determined by subtracting 0.18 µm from a 1L5S pattern size when a resist is exposed to an optimum dose, which is a dose capable of forming a 1:1 line width from a line-and-space (1L1S) pattern with a designed line width of 0.18 µm. A resist not forming a 1L5S pattern with the optimum dose is judged "incapable of forming patterns".

PED Stability

A resist, exposed to radiation at a dose equivalent to an optimum dose when a resist is baked and developed immediately after exposure, was placed for two hours in a chamber in which an ammonia concentration is controlled at 5 ppb, followed by post exposure baking to form a line-and-space (1L1S) pattern with a designed line width of 0.18 µm. PED stability was judged to be "Excellent" when the line width at the top of the pattern ($L_{top}$) satisfies an inequality $0.85 \times 0.18 < L_{top} < 1.1 \times 0.18$, otherwise judged to be "Bad". A judgment of "No pattern separation" was given when no line-and-space (1L1S) pattern with a designed line width of 0.18 µm was formed.

Storage Stability

Storage stability was judged to be "Excellent" when sensitivity within 72 hours after preparation (a) and the sample sensitivity after storing for 3 months or longer at 23° C. (b) satisfy an inequality $-0.1 < (b-a)/a < 0.1$, otherwise judged to be "Bad".

<Chemically Amplified Negative Tone Radiation Sensitive Resin Composition>

Examples 41–42 and Comparative Example 5

Components shown in Table 7 (part(s) indicates part(s) by weight) were mixed to prepare homogeneous solutions. The solutions were filtered through a membrane filter with a pore diameter of 0.2 µm to prepare solution compositions. The solution composition was spin-coated on a silicon wafer. PB was then performed under the conditions shown in Table 8 to form a resist coating with a thickness of 0.5 µm.

The resist films were exposed under the conditions shown in Table 8 using a stepper "NSR2205 EX12B" (manufactured by Nikon Corp., numerical aperture: 0.55) and baked (PEB) under the conditions shown in Table 8. The resist films were developed at 23° C. for 1 minute by a paddle method using a 2.38 wt % tetramethyl ammonium hydroxide aqueous solution. The resist films were then washed with deionized water and dried to form a resist pattern. The results of the evaluation of each resist are shown in Table 9.

TABLE 7

| | Acid generator (parts) | Resin (parts) | Added Crosslinking agent (parts) | Acid diffusion control agent (parts) | Solvent (parts) |
|---|---|---|---|---|---|
| Example 41 | B-6(2) | c-2(90) A-1(10) | C-1(7) | D-1(0.5) | G-1(600) |
| Example 42 | B-6(2) | c-1(90) A-3(10) | C-2(7) | D-1(0.5) | G-1(600) |
| Comparative Example 5 | B-6(2) | c-2(100) | C-1(7) | D-1(0.5) | G-1(600) |

TABLE 8

| | Pre-bake | | | Post-exposure bake | |
|---|---|---|---|---|---|
| | Temperature (° C.) | Time (S) | Exposure source | Temperature (° C.) | Time (S) |
| Example 41 | 90 | 60 | KrF excimer laser | 110 | 60 |
| Example 42 | 90 | 60 | KrF excimer laser | 110 | 60 |
| Comparative Example 5 | 90 | 60 | KrF excimer laser | 110 | 60 |

TABLE 9

| | Sensitivity (mJ/cm²) | Resolution (fm) | PED | Iso-dense bias | Storage stability |
|---|---|---|---|---|---|
| Example 41 | 30 | 0.20 | Good | Good | Good |
| Example 42 | 29 | 0.20 | Good | Good | Good |
| Comparative Example 5 | 30 | 0.21 | Bad | Bad | Good |

Synthesis of Component (A3)

Synthesis Example 19

A 1 l three necked egg plant flask was charged with 396.2 g (4 mol) of N,N-dimethylacrylamide, followed by nitrogen gas purge. A 500 ml dripping funnel was charged with 318 ml (4 mol) of cyclopentadiene under nitrogen gas atmosphere. The flask was heated at 50° C. and cyclopentadiene was slowly added dropwise from the dripping funnel at a rate of 2 ml/min. After the addition, the mixture was allowed to stand for 5 hours while heating at 50° C. The conversion rate was determined by gas chromatography to confirm that the yield of the target compound was 85 mol %. The reaction solution was purified by vacuum distillation at 87° C. and 0.8 mmHg to obtain N,N-dimethylbicyclo[2.2.1]hepto-2-ene-5-carboxylic acid amide at a yield of 70 mol %. This compound is referred to as a "Norbornene derivative (I-1)".

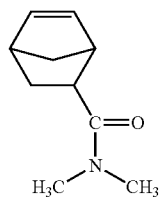

(11)

Synthesis Example 20

4.9 g of the norbornene derivative (I-1), 13.0 g of a (meth)acrylic acid derivative shown by the following formula (12) (hereinafter referred to as "(meth)acrylic acid derivative ①"), 20.6 g of a norbornene derivative shown by the following formula (13) (hereinafter referred to as "norbornene derivative ②"), and 11.5 g of maleic anhydride were dissolved in 50 g of tetrahydrofuran to obtain a homogeneous solution. After injection of nitrogen for 30 minutes, 2.9 g of azobisisobutyronitrile was added as an initiator. The mixture was heated to 65° C. and stirred for 6 hours at this temperature. After the reaction, the reaction solution was cooled to room temperature and diluted with 50 g of tetrahydrofuran. The diluted solution was poured into 1,000 ml of n-hexane to cause the resin to precipitate, thereby obtaining 35 g (yield: 70 wt %) of white resin powder.

This resin was confirmed to be a copolymer having an Mw of 4,300, consisting of norbornene derivative (I-1), (meth)acrylic acid derivative ①, norbornene derivative ②, and maleic anhydride at a proportion of 10 mol %, 20 mol %, 30 mol %, and 40 mol % respectively. This resin is referred to as a "resin (A-9)".

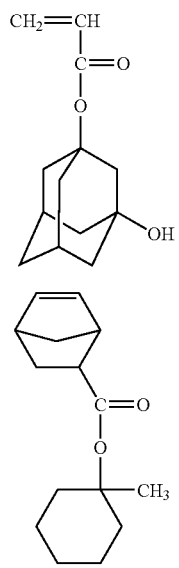

(12)

(13)

Synthesis Example 21

2.9 g of N,N-dimethylacrylamide, 13.0 g of (meth)acrylic acid derivative ①, 24.0 g norbornene derivative ②, and 10.1 g of maleic anhydride were dissolved in 50 g of tetrahydrofuran to obtain a homogeneous solution. After injection of nitrogen for 30 minutes, 2.9 g of azobisisobutyronitrile was added as an initiator. The mixture was heated to 65° C. and stirred for 6 hours at this temperature. After the reaction, the reaction solution was cooled to room temperature and diluted with 50 g of tetrahydrofuran. The diluted solution was poured into 1,000 ml of n-hexane to cause the resin to precipitate, thereby obtaining 37 g (yield: 74 wt %) of white resin powder.

This resin was confirmed to be a copolymer having an Mw of 4,900, consisting of recurring units derived from N,N-dimethylacrylamide, (meth)acrylic acid derivative ①, norbornene derivative ②, and maleic anhydride at a proportion of 10 mol %, 20 mol %, 35 mol %, and 35 mol % respectively. This resin is referred to as a "resin (A-10)".

Synthesis Example 22

4.5 g of the norbornene derivative (I-1), 12.2 g of (meth)acrylic acid derivative ①, 22.6 g of a norbornene derivative shown by the following formula (14) (hereinafter referred to as "norbornene derivative ③"), and 10.7 g of maleic anhydride were dissolved in 50 g of tetrahydrofuran to obtain a homogeneous solution. After injection of nitrogen for 30 minutes, 2.7 g of azobisisobutyronitrile was added as an initiator. The mixture was heated to 65° C. and stirred for 6 hours at this temperature. After the reaction, the reaction solution was cooled to room temperature and diluted with 50 g of tetrahydrofuran. The diluted solution was poured into 1,000 ml of n-hexane to cause the resin to precipitate, thereby obtaining 36 g (yield: 72 wt %) of white resin powder.

This resin was confirmed to be a copolymer having an Mw of 4,500, consisting of the recurring units derived from the norbornene derivative (I-1), (meth)acrylic acid derivative ①, norbornene derivative ③, and maleic anhydride at a proportion of 10 mol %, 20 mol %, 30 mol %, and 40 mol % respectively. This resin is referred to as a "resin (A-11)".

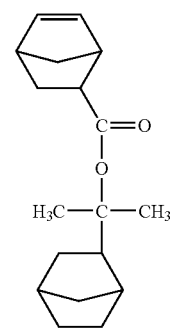

(14)

Synthesis Example 23

2.7 g of N,N-dimethylacrylamide, 12.0 g of (meth)acrylic acid derivative ①, 26.0 g norbornene derivative ③, and 9.3 g of maleic anhydride were dissolved in 50 g of tetrahydrofuran to obtain a homogeneous solution. After injection of nitrogen for 30 minutes, 2.7 g of azobisisobutyronitrile was added as an initiator. The mixture was heated to 65° C. and stirred for 6 hours at this temperature. After the reaction, the reaction solution was cooled to room temperature and diluted with 50 g of tetrahydrofuran. The diluted solution was poured into 1,000 ml of n-hexane to cause the resin to precipitate, thereby obtaining 37 g (yield: 74 wt %) of white resin powder.

This resin was confirmed to be a copolymer having an Mw of 4,500, consisting of the recurring units derived from N,N-dimethylacrylamide, (meth)acrylic acid derivative ①, norbornene derivative ③, and maleic anhydride at a proportion of 10 mol %, 20 mol %, 35 mol %, and 35 mol % respectively. This resin is referred to as a "resin (A-12)".

Synthesis Example 24

2.4 g of N,N-dimethylacrylamide, 18.6 g of 2-methyl-2-adamantyl methacrylate, 28.0 g of a compound shown by the following formula (15), and 1.0 g of methacrylic acid were dissolved in 50 g of tetrahydrofuran to obtain a homogeneous solution. After injection of nitrogen for 30 minutes, 2.4 g of azobisisobutyronitrile was added as an initiator. The mixture was heated to 65° C. and stirred for 6 hours at this temperature. After the reaction, the reaction solution was cooled to room temperature and diluted with 50 g of tetrahydrofuran. The diluted solution was poured into 1,000 ml of n-hexane to cause the resin to precipitate, thereby obtaining 38 g (yield: 76 wt %) of white resin powder.

This resin was confirmed to be a copolymer having an Mw of 11,900, consisting of the recurring units derived from N,N-dimethylacrylamide, 2-methyl-2-adamantyl methacrylate, the compound shown by the formula (15), and methacrylic acid at a proportion of 10 mol %, 35 mol %, 50 mol %, and 5 mol % respectively. This resin is referred to as a "resin (A-13)".

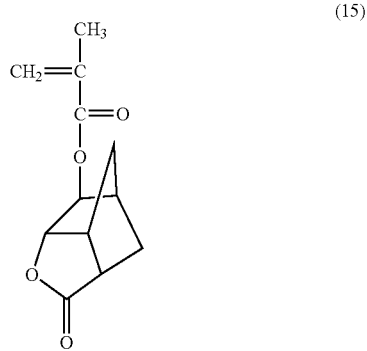

(15)

Synthesis Example 25

2.5 g of N,N-dimethylacrylamide, 17.1 g of 1-ethylcyclohexyl methacrylate, 29.3 g of a compound shown by the above formula (15), and 1.1 g of methacrylic acid were dissolved in 50 g of tetrahydrofuran to obtain a homogeneous solution. After injection of nitrogen for 30 minutes, 2.4 g of azobisisobutyronitrile was added as an initiator. The mixture was heated to 65° C. and stirred for 6 hours at this temperature. After the reaction, the reaction solution was cooled to room temperature and diluted with 50 g of tetrahydrofuran. The diluted solution was poured into 1,000 ml of n-hexane to cause the resin to precipitate, thereby obtaining 39 g (yield: 78 wt %) of white resin powder.

This resin was confirmed to be a copolymer having an Mw of 10,900, consisting of the recurring units derived from N,N-dimethylacrylamide, 1-ethylcyclohexyl methacrylate, the compound shown by the formula (15), and methacrylic acid at a proportion of 10 mol %, 35 mol %, 50 mol %, and 5 mol % respectively. This resin is referred to as a "resin (A-14)".

Synthesis Example 26

12.5 g of (meth)acrylic acid derivative ①, 26.4 g norbornene derivative ②, and 11.1 g of maleic anhydride were dissolved in 50 g of tetrahydrofuran to obtain a homogeneous solution. After injection of nitrogen for 30 minutes, 2.8 g of azobisisobutyronitrile was added as an initiator. The mixture was heated to 65° C. and stirred for 6 hours at this temperature. After the reaction, the reaction solution was cooled to room temperature and diluted with 50 g of tetrahydrofuran. The diluted solution was poured into 1,000 ml of n-hexane to cause the resin to precipitate, thereby obtaining 33 g (yield: 67 wt %) of white resin powder.

This resin was confirmed to be a copolymer having an Mw of 4,800, consisting of the recurring units derived from the (meth)acrylic acid derivative ①, norbornene derivative ②, and maleic anhydride at a proportion of 20 mol %, 40 mol %, and 40 mol % respectively. This resin is referred to as a "resin (a-12)".

Synthesis Example 27

11.5 g of (meth)acrylic acid derivative ①, 28.4 g norbornene derivative ②, and 11.1 g of maleic anhydride were dissolved in 50 g of tetrahydrofuran to obtain a homogeneous solution. After injection of nitrogen for 30 minutes, 2.5 g of azobisisobutyronitrile was added as an initiator. The mixture was heated to 65° C. and stirred for 6 hours at this temperature. After the reaction, the reaction solution was cooled to room temperature and diluted with 50 g of tetrahydrofuran. The diluted solution was poured into 1,000 ml of n-hexane to cause the resin to precipitate, thereby obtaining 33 g (yield: 66 wt %) of white resin powder.

This resin was confirmed to be a copolymer having an Mw of 4,200, consisting of the recurring units derived from (meth)acrylic acid derivative ①, norbornene derivative ②, and maleic anhydride at a proportion of 20 mol %, 40 mol %, and 40 mol % respectively. This resin is referred to as a "resin (a-13)".

Synthesis Example 28

20.0 g of 2-methyl-2-adamantyl methacrylate, 29.0 g of a compound shown by the above formula (15), and 1.0 g of methacrylic acid were dissolved in 50 g of tetrahydrofuran to obtain a homogeneous solution. After injection of nitrogen for 30 minutes, 2.2 g of azobisisobutyronitrile was added as an initiator. The mixture was heated to 65° C. and stirred for 6 hours at this temperature. After the reaction, the reaction solution was cooled to room temperature and diluted with 50 g of tetrahydrofuran. The diluted solution was poured into 1,000 ml of n-hexane to cause the resin to precipitate, thereby obtaining 39 g (yield: 78 wt %) of white resin powder.

This resin was confirmed to be a copolymer having an Mw of 11,500, consisting of the recurring units derived from 2-methyl-2-adamantyl methacrylate, the compound shown by the formula (15), and methacrylic acid at a proportion of 40 mol %, 55 mol %, and 5 mol % respectively. This resin is referred to as a "resin (a-14)".

Synthesis Example 29

30.4 g of a compound shown by the above formula (15), 1.0 g of methacrylic acid, and 18.6 g of 1-ethylcyclohexyl methacrylate were dissolved in 50 g of tetrahydrofuran to obtain a homogeneous solution. After injection of nitrogen for 30 minutes, 2.2 g of azobisisobutyronitrile was added as an initiator. The mixture was heated at 65° C. and stirred for 6 hours at this temperature. After the reaction, the reaction solution was cooled to room temperature and diluted with 50 g of tetrahydrofuran. The diluted solution was poured into 1,000 ml of n-hexane to cause the resin to precipitate, thereby obtaining 40 g (yield: 80 wt %) of white resin powder.

This resin was confirmed to be a copolymer having an Mw of 11,000, consisting of recurring units derived from the compound shown by the formula (15), methacrylic acid, 1-ethylcyclohexyl methacrylate at a proportion of 55 mol %, 5 mol %, and 40 mol % respectively. This resin is referred to as a "resin (a-15)".

Measurement and evaluation in the following examples and comparative examples were carried out as follows.

Mw

Mw was measured by gel permeation chromatography (GPC) using GPC columns (manufactured by Tosoh Corp., G2000HXL×2, G3000HXL×1, G4000HXL×1) under the following conditions. Flow rate: 1.0 ml/minute, eluate: tetrahydrofuran, column temperature: 40° C., standard reference material: monodispersed polystyrene Radiation Transmittance A solution composition was applied to a quartz plate and the coating was post-baked on a hot plate at 90° C. for 60 seconds to obtain a resist film with a thickness of 1 μm. Radiation transmittance of the resist film was calculated from absorbance at a wavelength of 193 nm and was adopted as a standard for transparency in the deep UV ray region.

Sensitivity

A solution composition was applied to a silicon wafer with a 520 Å thickness Deep UV30 film (manufactured by Brewer Science Corp.) coated on the surface by spin coating and post-baked on a hot plate under the conditions shown in Table 2 to obtain a resist coating with a thickness of 0.34 μm. The coating was exposed to radiation through a mask pattern using an ArF excimer laser exposure apparatus (manufactured by Nikon Corp., lens numerical aperture: 0.55, wavelength: 193 nm). After performing PEB under the conditions shown in Table 2, the resist films were developed in a 38 wt % tetramethylammonium hydroxide aqueous solution, developed at 25° C. for 1 minute, washed with water, and dried to form a positive-tone resist pattern. An optimum dose at which a line-and-space (1L1S) pattern with a line width of 0.16 μm was formed was taken as sensitivity.

Resolution

The minimum dimension of a resist pattern resolved at the optimum dose was taken as the resolution of the resist coating.

Line Width Fluctuation Value

In the same manner as in the measurement of sensitivity described above, line-and-space patterns (1L1S) and (1L10S) were formed by exposing a resist sample with a light at the optimum optimum dose at which a one to one line-and-space pattern (1L1S) with a line width of 0.16 μm can be formed. The line width fluctuation value due to fluctuation of the space width was determined by measuring the difference between the line width for the line-and-space pattern (1L1S) and the line width for the line-and-space pattern (1L10S) by a scanning electron microscope.

Pattern Configuration

The dimensions of the lower side $L_1$ and the upper side $L_2$ of the rectangular cross-section of a line and space pattern (1L1S) with a line width of 0.16 μm were measured using a scanning electron microscope. A pattern shape which satisfied a formula "$0.85=L_2/L_1=1$" and was straight with no extended skirt was evaluated as "Good", and otherwise evaluated as "Bad".

Examples 43–48

Each composition solution having components shown in Table 10 was evaluated. The evaluation conditions are shown in Table 11, and the results are shown in Table 12. Components other than the polymers (A-9) to (A-14), and polymers (a-12) to (a-15) shown in Table 10 are as follows.

Acid Generator (B)

B-8: 1-(3,5-dimethyl-4-hydroxyphenyl)tetrahydrothiophenium-perfluoro-n-octanesulfonate B-9: Bis(4-t-butylphenyl)iodonium perfluoro-n-octanesulfonate B-10: Nonafluoro-n-butanesulfonylbicyclo[2.2.1]hepto-5-ene-2,3-dicarboxyimide B-11: Perfluoro-n-octanesulfonylbicyclo[2.2.1]hepto-5-ene-2,3-dicarboxyimide Acid Diffusion Control Agent D-5: N-t-butoxycarbonyl-2-phenylbenzimidazole D-6: N-t-butoxycarbonyldicyclohexylamine Other Additives F-4: Di-t-butyl 1,3-adamantanedicarboxylate F-5: 2,5-Dimethyl-2,5-di(adamantylcarbonyloxy)hexane F-6: 2-Methyl-2-adamantylcarbonyloxyadamantane Solvent G-4: 2-Heptanone G-5: Cyclohexanone G-6: Propylene glycol monoethyl ether acetate

TABLE 10

|  | Copolymer | Acid Generator | Acid diffusion control agent | Other additives | Solvent |
|---|---|---|---|---|---|
| Example 43 | A-9(9.0) a-12(81.0) | B-8(2.0) B-10(1.5) | D-5(0.10) | F-5(10) | G-6(530) |
| Example 44 | A-10(9.0) a-12(81.0) | B-9(2.0) B-11(2.0) | D-5(0.01) D-6(0.09) | F-6(10) | G-4(430) G-5(100) |
| Example 45 | A-11(9.0) a-12(81.0) | B-8(2.0) B-10(1.5) | D-5(0.02) D-6(0.08) | F-5(10) | G-4(430) G-5(100) |

TABLE 10-continued

|  | Copolymer | Acid Generator | Acid diffusion control agent | Other additives | Solvent |
|---|---|---|---|---|---|
| Example 46 | A-12(9.0) a-13(81.0) | B-9(2.0) B-11(2.0) | D-5(0.10) | F-4(10) | G-6(530) |
| Example 47 | A-13(9.0) a-14(81.0) | B-8(2.0) B-10(1.5) | D-5(0.06) | F-4(3) | G-4(430) G-5(100) |
| Example 48 | A-14(9.0) a-15(81.0) | B-9(2.0) B-11(2.0) | D-5(0.06) | F-4(3) | G-4(430) G-5(100) |

TABLE 11

|  | Resist film thickness | Substrate form | PB Temperature (° C.) | PB Time (S) | PEB Temperature (° C.) | PEB Time (S) |
|---|---|---|---|---|---|---|
| Example 43 | 0.34 | ARC | 130 | 90 | 120 | 90 |
| Example 44 | 0.34 | ARC | 130 | 90 | 110 | 90 |
| Example 45 | 0.34 | ARC | 130 | 90 | 120 | 90 |
| Example 46 | 0.34 | ARC | 130 | 90 | 120 | 90 |
| Example 47 | 0.34 | ARC | 130 | 90 | 130 | 90 |
| Example 48 | 0.34 | ARC | 130 | 90 | 120 | 90 |

TABLE 12

|  | Radiation transmittance (193 nm, %) | Sensitivity (J/m²) | Resolution (μm) | Line width fluctuation value (nm) | Pattern configuration |
|---|---|---|---|---|---|
| Example 43 | 70 | 300 | 0.14 | 10 | Good |
| Example 44 | 74 | 260 | 0.14 | 5 | Good |
| Example 45 | 69 | 320 | 0.14 | 9 | Good |
| Example 46 | 68 | 290 | 0.14 | 11 | Good |
| Example 47 | 70 | 300 | 0.14 | 9 | Good |
| Example 48 | 72 | 270 | 0.14 | 13 | Good |

The radiation-sensitive resin composition of the present invention exhibits excellent resolution and pattern configuration, particularly excellent narrow space processing performance, is affected by PED only to a minimal extent, exhibits a minimal iso-dense bias, and capable of forming fine patterns at a high precision and in a stable manner. In addition, the radiation-sensitive resin composition effectively responds to various radiations such as ultraviolet rays, deep ultraviolet rays, X-rays, electron beams, and the like. Therefore, the radiation-sensitive resin composition of the present invention is suitable as a chemically-amplified positive resist used for fabricating semiconductor devices, which will become more and more minute.

The invention claimed is:

1. A positive-tone radiation-sensitive resin composition comprising (A1) a copolymer which comprises a recurring unit shown by the following formula (1) and/or a recurring unit shown by the following formula (2), and a recurring unit shown by the following formula (3-1), and (B) a photoacid generator,

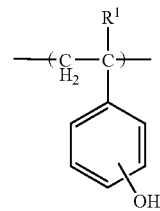

(1)

wherein $R^1$ represents a hydrogen atom or a methyl group;

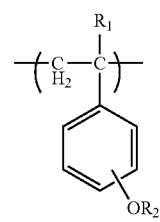

(2)

wherein $R_1$ represents a hydrogen atom or a methyl group, and $R_2$ represents a tertiary alkyl group having 4–10 carbon atoms;

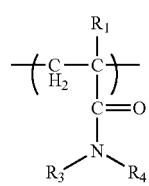

(3-1)

wherein $R_1$ represents a hydrogen atom or a methyl group, $R_3$ and $R_4$ individually represent a substituted or unsubstituted alkyl group having 1–12 carbon atoms, a substituted or unsubstituted aromatic group having 6–15 carbon atoms, or a substituted or unsubstituted alkoxyl group having 1–12 carbon atoms, or $R_3$ and $R_4$ may form, in combination and together with the nitrogen atom with which the $R_3$ and $R_4$ groups bond, a cyclic structure having 3–15 carbon atoms, provided that $R_3$ and $R_4$ are not a hydrogen atom at the same time.

2. The composition according to claim 1, wherein the recurring unit shown by the formula (3-1) is a unit derived from N,N-dimethyl(meth)acrylamide.

3. The composition according to claim 1, wherein the recurring unit shown by the formula (3-1) is a unit derived from 1-(meth)acryloyl-2-phenylbenzimidazole.

4. The composition according to claim 1, wherein the recurring unit shown by the formula (3-1) is a unit derived from 1-(meth)acryloyl imidazole.

5. The composition according to claim 1, wherein the component (B) is at least one compound selected from the group consisting of onium salt compounds and sulfonimide compounds.

6. The composition according to claim 1, wherein the copolymer (A1) comprises a recurring unit derived from a styrene compound in addition to the recurring units (1), (2), and (3-1).

7. A radiation-sensitive resin composition comprising:
(A) a resin which is insoluble or scarcely soluble in alkali and becomes alkali soluble by the action of an acid, the resin comprising a recurring unit of the following formula (3-2), and (B) a photoacid generator,

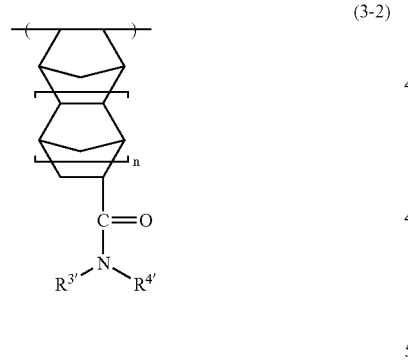

(3-2)

$R^{3'}$ and $R^{4'}$ individually represent a hydrogen atom, a substituted or unsubstituted alkyl group having 1–12 carbon atoms, a substituted or unsubstituted alkoxyl group having 1–12 carbon atoms, or a substituted or unsubstituted alkoxycarbonyl group having 2–13 carbon atoms, or $R^{3'}$ and $R^{4'}$ may form, in combination and together with the nitrogen atom with which the $R^{3'}$ and $R^{4'}$ groups bond, a cyclic structure having 3–15 carbon atoms, and n is an integer of 0–3.

8. A radiation-sensitive resin composition comprising:
(A) a resin which is insoluble or scarcely soluble in alkali and becomes alkali soluble by the action of an acid, the resin comprising a recurring unit of the following formula (3-1') and having an alicyclic structure, and (B) a photoacid generator,

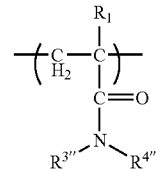

(3-1')

wherein $R_1$ represents a hydrogen atom or a methyl group, $R^{3''}$ and $R^{4''}$ individually represent a substituted or unsubstituted alkyl group having 1–12 carbon atoms, a substituted or unsubstituted alkoxyl group having 1–12 carbon atoms, or a substituted or unsubstituted alkoxycarbonyl group having 2–13 carbon atoms, or $R^{3''}$ and $R^{4''}$ may form, in combination and together with the nitrogen atom with which the $R^{3''}$ and $R^{4''}$ groups bond, a cyclic structure having 3–10 carbon atoms.

9. A radiation-sensitive resin composition comprising:
(A) a resin which is insoluble or scarcely soluble in alkali and becomes alkali soluble by the action of an acid, the resin comprising the recurring unit (3-2) and/or the recurring unit (3-1') of the following formula, and the recurring unit (i) and/or the recurring unit (ii) of the following formula, and (B) a photoacid generator,

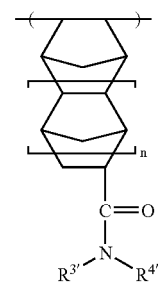

(3-2)

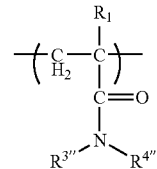

(3-1')

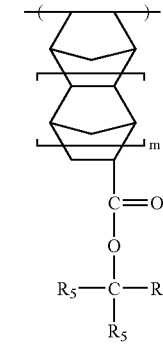

(i)

-continued

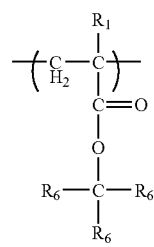

(ii)

wherein $R_1$, $R^{3'}$, $R^{4'}$, $R^{3''}$, and $R^{4''}$ are the same as defined in claims 3 or 4; $R_5$ individually represents a linear or branched alkyl group having 1–4 carbon atoms or a monovalent alicyclic hydrocarbon group having 4–20 carbon atoms or derivatives thereof, provided that at least one $R_5$ is a linear or branched alkyl group having 1–4 carbon atoms, or any two $R_5$ groups form, in combination and together with the carbon atoms to which the two $R_5$ groups bond, a divalent alicyclic hydrocarbon group having 4–20 carbon atoms or derivatives thereof, with the remaining $R_5$ groups being a linear or branched alkyl group having 1–4 carbon atoms; $R_6$ individually represents a linear or branched alkyl group having 1–4 carbon atoms or a monovalent alicyclic hydrocarbon group having 4–20 carbon atoms or derivatives thereof, provided that at least one $R_6$ is a linear or branched alkyl group having 1–4 carbon atoms, or any two $R_6$ groups form, in combination and together with the carbon atoms to which the two $R_6$ groups bond, a divalent alicyclic hydrocarbon group having 4–20 carbon atoms or derivatives thereof, with the remaining $R_6$ groups being a linear or branched alkyl group having 1–4 carbon atoms; and m and n are an integer of 0–3.

10. The composition according to claim 9, wherein the resin (A) comprises the recurring unit (3-1') and the recurring unit (ii).

11. The composition according to claim 10, wherein the resin (A) further comprises a recurring unit derived from a compound shown by the following formula,

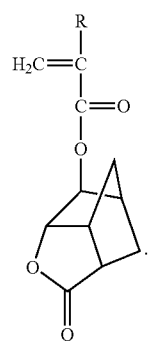

12. The composition according to claim 9, further comprising a nitrogen-containing organic compound as an acid diffusion controller.

13. A positive-tone radiation-sensitive resin composition comprising:

(A1) a copolymer which comprises a recurring unit shown by the following formula (2), and a recurring unit shown by the following formula (3-1),

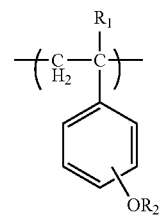

(2)

wherein $R_1$ represents a hydrogen atom or a methyl group, and $R_2$ represents a tertiary alkyl group having 4–10 carbon atoms;

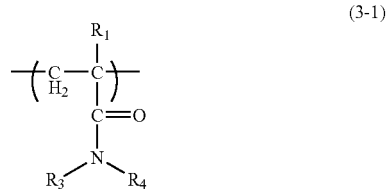

(3-1)

wherein $R_1$ represents a hydrogen atom or a methyl group, $R_3$ and $R_4$ individually represent a hydrogen atom, a substituted or unsubstituted alkyl group having 1–12 carbon atoms, a substituted or unsubstituted aromatic group having 6–15 carbon atoms, or a substituted or unsubstituted alkoxyl group having 1–12 carbon atoms, or $R_3$ and $R_4$ may form, in combination and together with the nitrogen atom with which the $R_3$ and $R_4$ groups bond, a cyclic structure having 3–15 carbon atoms, provided that $R_3$ and $R_4$ are not a hydrogen atom at the same time; and (B) a photoacid generator.

14. The positive-tone radiation-sensitive resin composition of claim 13, wherein the copolymer (A1) further comprises a recurring unit shown by the following formula (1):

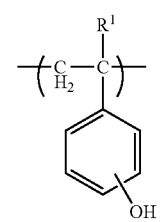

(1)

wherein $R^1$ represents a hydrogen atom or a methyl group.

15. A positive-tone radiation-sensitive resin composition comprising:

(A1) a copolymer which comprises a recurring unit shown by the following formula (1) and/or a recurring unit shown by the following formula (2), and a recurring unit shown by the following formula (3-1);

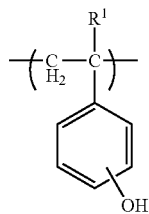

(1)

wherein R¹ represents a hydrogen atom or a methyl group;

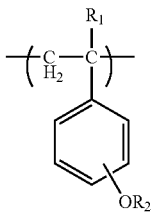

(2)

wherein $R_1$ represents a hydrogen atom or a methyl group, and $R_2$ represents a tertiary alkyl group having 4–10 carbon atoms;

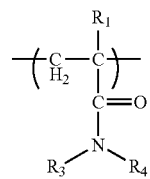

(3-1)

wherein $R_1$ represents a hydrogen atom or a methyl group, $R_3$ and $R_4$ individually represent a hydrogen atom, a substituted or unsubstituted alkyl group having 1–12 carbon atoms, a substituted or unsubstituted aromatic group having 6–15 carbon atoms, or a substituted or unsubstituted alkoxyl group having 1–12 carbon atoms, or $R_3$ and $R_4$ may form, in combination and together with the nitrogen atom with which the $R_3$ and $R_4$ groups bond, a cyclic structure having 3–15 carbon atoms, provided that $R_3$ and $R_4$ are not a hydrogen atom at the same time;

(B) a photoacid generator; and (C) one or more other copolymers.

16. The positive-tone radiation-sensitive resin composition according to claim 15, wherein the one or more other copolymers comprise the recurring unit (1).

17. The positive-tone radiation-sensitive resin composition according to claim 16, wherein the one or more other copolymers comprise the recurring unit (2).

* * * * *